US008953690B2

(12) United States Patent
Lou et al.

(10) Patent No.: US 8,953,690 B2
(45) Date of Patent: Feb. 10, 2015

(54) METHOD AND SYSTEM FOR PROCESSING VIDEO DATA

(75) Inventors: Jian Lou, San Diego, CA (US); Krit Panusopone, San Diego, CA (US); Limin Wang, San Diego, CA (US)

(73) Assignee: Google Technology Holdings LLC, Mountain View, CA (US)

( * ) Notice: Subject to any disclaimer, the term of this patent is extended or adjusted under 35 U.S.C. 154(b) by 328 days.

(21) Appl. No.: 13/363,432

(22) Filed: Feb. 1, 2012

(65) Prior Publication Data

US 2012/0207222 A1 Aug. 16, 2012

Related U.S. Application Data

(60) Provisional application No. 61/433,700, filed on Feb. 16, 2011.

(51) Int. Cl.

| H04N 7/30 | (2006.01) |
| H03M 7/30 | (2006.01) |
| H03M 7/40 | (2006.01) |
| H04N 19/18 | (2014.01) |
| H04N 19/436 | (2014.01) |
| H04N 19/13 | (2014.01) |
| H04N 19/102 | (2014.01) |

(52) U.S. Cl.
CPC .......... *H03M 7/6023* (2013.01); *H03M 7/4018* (2013.01); *H04N 19/00296* (2013.01); *H04N 19/00521* (2013.01); *H04N 19/00121* (2013.01); *H04N 7/26106* (2013.01)
USPC .............................. 375/240.18; 375/E7.211

(58) Field of Classification Search
None
See application file for complete search history.

(56) References Cited

U.S. PATENT DOCUMENTS

2009/0175332 A1* 7/2009 Karczewicz et al. ..... 375/240.03

OTHER PUBLICATIONS

"Overview of the H.264/AVC Video Coding Standard", Thomas Wiegand, Gary J. Sullivan, Gisle Bjontegaard, and Ajay Luthra, IEEE Transactions on Circuits and Systems for Video Technology, p. 1-19, Jul. 2003.*
"Parallel Context Processing for the significance map in high coding efficiency", Joel Sole, JCTVC_D262, ver 1, Jan. 16, 2011.*
"Context-Based Adaptive Binary Arithmetic Coding in the H.264/AVC Video Compression Standard", Detlev Marpe, IEEE Transactions on Circuits and Systems for Video Technology, vol. 13, No. 7, Jul. 2003.*
PCT Search Report & Written Opinion, Re: Application #PCT/US2012/024608; Jun. 5, 2012.

(Continued)

*Primary Examiner* — Sath V Perungavoor
*Assistant Examiner* — Janese Duley
(74) *Attorney, Agent, or Firm* — Young Basile Hanlon & MacFarlane P.C.

(57) ABSTRACT

In various embodiments, a significance map of a matrix of video data coefficients is encoded or decoded using context-based adaptive binary arithmetic coding (CABAC). The significance map scanned line-by-line along a scanning pattern. Each line may be a vertical, horizontal, or diagonal section of the scanning pattern. Context models for each element processed in a particular line are chosen based on values of neighboring elements that are not in the line. The neighboring elements may be limited to those contained within one or two other scanning lines. Avoiding reliance on neighbors that are in the same scanning line facilitates parallel processing.

23 Claims, 54 Drawing Sheets

(56) References Cited

OTHER PUBLICATIONS

Auyeung C, et al, "Parallel processing friendly simplified context selection of significance map", JCT-VC Meeting ; Jan. 16, 2011.

Lou J, et al, "On context selection for significant_coeff_flag coding", MPEG Meeting, Mar. 18, 2011.

Sze V, et al, "CE11: Simplified context selection for significant_coeff_flag(JCTVC-C227)", JCT-VC Meeting, Jan. 15, 2011.

J-R Ohm, et al, "Report of the 4th JCT-VC Meeting", JCT-VC Meeting, Jan. 24, 2011.

* cited by examiner

FIG. 8

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 1 | 1 | 1 | 1 | 1 | 1 | 1 | 1 | 1 | 0 | 0 | 0 | 0 | 0 | 0 | 0 |
| 1 | 1 | 1 | 1 | 1 | 1 | 1 | 1 | 1 | 1 | 0 | 0 | 0 | 0 | 0 | 0 | 0 |
| 2 | 1 | 1 | 1 | 1 | 1 | 1 | 1 | 1 | 1 | 0 | 0 | 0 | 0 | 0 | 0 | 0 |
| 3 | 1 | 1 | 1 | 1 | 1 | 1 | 1 | 1 | 0 | 0 | 0 | 0 | 0 | 0 | 0 | 0 |
| 4 | 1 | 1 | 1 | 1 | 1 | 1 | 1 | 0 | 0 | 0 | 0 | 0 | 1 | 0 | 0 | 0 |
| 5 | 1 | 1 | 1 | 1 | 1 | 1 | 0 | 0 | 0 | 0 | 0 | 0 | 0 | 0 | 0 | 0 |
| 6 | 1 | 1 | 1 | 1 | 1 | 0 | 0 | 0 | 0 | 0 | 0 | 0 | 0 | 0 | 0 | 0 |
| 7 | 1 | 1 | 1 | 1 | 0 | 0 | 0 | 0 | 0 | 0 | 0 | 0 | 0 | 0 | 1 | 0 |
| 8 | 1 | 1 | 1 | 0 | 0 | 0 | 0 | 0 | 0 | 0 | 0 | 0 | 0 | 0 | 0 | 0 |
| 9 | 1 | 1 | 0 | 0 | 0 | 0 | 0 | 0 | 0 | 0 | 0 | 0 | 0 | 0 | 0 | 0 |
| 10 | 1 | 0 | 0 | 0 | 0 | 0 | 0 | 0 | 0 | 0 | 0 | 0 | 0 | 0 | 0 | 0 |
| 11 | 0 | 0 | 0 | 0 | 0 | 0 | 0 | 0 | 0 | 0 | 0 | 1 | 0 | 0 | 0 | 0 |
| 12 | 0 | 0 | 0 | 0 | 0 | 0 | 0 | 1 | 0 | 0 | 0 | 0 | 0 | 0 | 0 | 0 |
| 13 | 0 | 0 | 0 | 0 | 0 | 0 | 0 | 0 | 0 | 0 | 0 | 0 | 0 | 0 | 0 | 0 |
| 14 | 0 | 0 | 0 | 0 | 0 | 0 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 | 0 | 0 | 0 | 0 | 0 |

FIG. 9

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 1 | 1 | 1 | 1 | 1 | 1 | 1 | 1 | 1 | 0 | 0 | 0 | 0 | 0 | 0 | 0 |
| 1 | 1 | 1 | 1 | 1 | 1 | 1 | 1 | 1 | 1 | 0 | 0 | 0 | 0 | 0 | 0 | 0 |
| 2 | 1 | 1 | 1 | 1 | 1 | 1 | 1 | 1 | 1 | 0 | 0 | 0 | 0 | 0 | 0 | 0 |
| 3 | 1 | 1 | 1 | 1 | 1 | 1 | 1 | 1 | 0 | 0 | 0 | 0 | 0 | 0 | 0 | 0 |
| 4 | 1 | 1 | 1 | 1 | 1 | 1 | 1 | 0 | 0 | 0 | 0 | 0 | 1 | 0 | 0 | 0 |
| 5 | 1 | 1 | 1 | 1 | 1 | 1 | 0 | 0 | 0 | 0 | 0 | 0 | 0 | 0 | 0 | 0 |
| 6 | 1 | 1 | 1 | 1 | 1 | 0 | 0 | 0 | 0 | 0 | 0 | 0 | 0 | 0 | 0 | 0 |
| 7 | 1 | 1 | 1 | 1 | 0 | 0 | 0 | 0 | 0 | 0 | 0 | 0 | 0 | 0 | 1 | 0 |
| 8 | 1 | 1 | 1 | 0 | 0 | 0 | 0 | 0 | 0 | 0 | 0 | 0 | 0 | 0 | 0 | 0 |
| 9 | 1 | 1 | 0 | 0 | 0 | 0 | 0 | 0 | 0 | 0 | 0 | 0 | 0 | 0 | 0 | 0 |
| 10 | 1 | 0 | 0 | 0 | 0 | 0 | 0 | 0 | 0 | 0 | 0 | 0 | 0 | 0 | 0 | 0 |
| 11 | 0 | 0 | 0 | 0 | 0 | 0 | 0 | 0 | 0 | 0 | 0 | 1 | 0 | 0 | 0 | 0 |
| 12 | 0 | 0 | 0 | 0 | 0 | 0 | 0 | 1 | 0 | 0 | 0 | 0 | 0 | 0 | 0 | 0 |
| 13 | 0 | 0 | 0 | 0 | 0 | 0 | 0 | 0 | 0 | 0 | 0 | 0 | 0 | 0 | 0 | 0 |
| 14 | 0 | 0 | 0 | 0 | 0 | 0 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 | 0 | 0 | 0 | 0 | 0 |

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 1 | 1 | 1 | 1 | 1 | 1 | 1 | 1 | 0 | 0 | 0 | 0 | 0 | 0 | 0 | 0 |
| 1 | 1 | 1 | 1 | 1 | 1 | 1 | 1 | 1 | 0 | 0 | 0 | 0 | 0 | 0 | 0 | 0 |
| 2 | 1 | 1 | 1 | 1 | 1 | 1 | 1 | 1 | 0 | 0 | 0 | 0 | 0 | 0 | 0 | 0 |
| 3 | 1 | 1 | 1 | 1 | 1 | 1 | 1 | 0 | 0 | 0 | 0 | 0 | 0 | 0 | 0 | 0 |
| 4 | 1 | 1 | 1 | 1 | 1 | 1 | 1 | 0 | 0 | 0 | 0 | 1 | 0 | 0 | 0 | 0 |
| 5 | 1 | 1 | 1 | 1 | 1 | 1 | 0 | 0 | 0 | 0 | 0 | 0 | 0 | 0 | 0 | 0 |
| 6 | 1 | 1 | 1 | 1 | 1 | 0 | 0 | 0 | 0 | 0 | 0 | 0 | 0 | 0 | 0 | 0 |
| 7 | 1 | 1 | 1 | 1 | 0 | 0 | 0 | 0 | 0 | 0 | 0 | 0 | 0 | 0 | 1 | 0 |
| 8 | 1 | 1 | 1 | 0 | 0 | 0 | 0 | 0 | 0 | 0 | 0 | 0 | 0 | 0 | 0 | 0 |
| 9 | 1 | 1 | 0 | 0 | 0 | 0 | 0 | 0 | 0 | 0 | 0 | 0 | 0 | 0 | 0 | 0 |
| 10 | 1 | 0 | 0 | 0 | 0 | 0 | 0 | 0 | 0 | 0 | 0 | 0 | 0 | 0 | 0 | 0 |
| 11 | 0 | 0 | 0 | 0 | 0 | 0 | 0 | 0 | 0 | 0 | 1 | 0 | 0 | 0 | 0 | 0 |
| 12 | 0 | 0 | 0 | 0 | 0 | 0 | 0 | 1 | 0 | 0 | 0 | 0 | 0 | 0 | 0 | 0 |
| 13 | 0 | 0 | 0 | 0 | 0 | 0 | 0 | 0 | 0 | 0 | 0 | 0 | 0 | 0 | 0 | 0 |
| 14 | 0 | 0 | 0 | 0 | 0 | 0 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 | 0 | 0 | 0 | 0 | 0 |

*FIG. 14*

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 1 | 1 | 1 | 1 | 1 | 1 | 1 | 1 | 0 | 0 | 0 | 0 | 0 | 0 | 0 | 0 |
| 1 | 1 | 1 | 1 | 1 | 1 | 1 | 1 | 1 | 0 | 0 | 0 | 0 | 0 | 0 | 0 | 0 |
| 2 | 1 | 1 | 1 | 1 | 1 | 1 | 1 | 1 | 0 | 0 | 0 | 0 | 0 | 0 | 0 | 0 |
| 3 | 1 | 1 | 1 | 1 | 1 | 1 | 1 | 0 | 0 | 0 | 0 | 0 | 0 | 0 | 0 | 0 |
| 4 | 1 | 1 | 1 | 1 | 1 | 1 | 1 | 0 | 0 | 0 | 0 | 1 | 0 | 0 | 0 | 0 |
| 5 | 1 | 1 | 1 | 1 | 1 | 1 | 0 | 0 | 0 | 0 | 0 | 0 | 0 | 0 | 0 | 0 |
| 6 | 1 | 1 | 1 | 1 | 1 | 0 | 0 | 0 | 0 | 0 | 0 | 0 | 0 | 0 | 0 | 0 |
| 7 | 1 | 1 | 1 | 1 | 0 | 0 | 0 | 0 | 0 | 0 | 0 | 0 | 0 | 0 | 1 | 0 |
| 8 | 1 | 1 | 1 | 0 | 0 | 0 | 0 | 0 | 0 | 0 | 0 | 0 | 0 | 0 | 0 | 0 |
| 9 | 1 | 1 | 0 | 0 | 0 | 0 | 0 | 0 | 0 | 0 | 0 | 0 | 0 | 0 | 0 | 0 |
| 10 | 1 | 0 | 0 | 0 | 0 | 0 | 0 | 0 | 0 | 0 | 0 | 0 | 0 | 0 | 0 | 0 |
| 11 | 0 | 0 | 0 | 0 | 0 | 0 | 0 | 0 | 0 | 0 | 1 | 0 | 0 | 0 | 0 | 0 |
| 12 | 0 | 0 | 0 | 0 | 0 | 0 | 0 | 1 | 0 | 0 | 0 | 0 | 0 | 0 | 0 | 0 |
| 13 | 0 | 0 | 0 | 0 | 0 | 0 | 0 | 0 | 0 | 0 | 0 | 0 | 0 | 0 | 0 | 0 |
| 14 | 0 | 0 | 0 | 0 | 0 | 0 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 | 0 | 0 | 0 | 0 | 0 |

*FIG. 15*

METHOD AND SYSTEM FOR PROCESSING VIDEO DATA

CROSS REFERENCE TO RELATED APPLICATIONS

The present application claims the benefit of priority to U.S. Provisional Patent Application Ser. No. 61/443,700, filed on Feb. 16, 2011, entitled "Low Complexity and Parallel Processing Friendly Context Selection for Adaptive Scanning Pattern," by Lou, et al., which is hereby incorporated by reference in its entirety.

The present application is related to U.S. patent application Ser. No. 13/253,385 filed on Oct. 5, 2011, entitled "Coding and Decoding Utilizing Adaptive Context Model Selection with Zigzag Scan," by Lou, et al., U.S. patent application Ser. No. 13/253,933 filed on Oct. 5, 2011, entitled "Coding and Decoding Utilizing Context Model Selection with Adaptive Scan Pattern," by Lou, et al., and U.S. patent application Ser. No. 13/345,784 filed on Jan. 9, 2012, entitled "Method and System for Processing Video Data," by Lou, et al.

TECHNICAL FIELD

The present invention relates generally to video image processing and, more particularly, to encoding and decoding video image data.

BACKGROUND

Video compression uses block processing for many operations. In block processing, a block of neighboring pixels is grouped into a coding unit and compression operations treat this group of pixels as one unit to take advantage of correlations among neighboring pixels within the coding unit. Block-based processing often includes prediction coding and transform coding. Transform coding with quantization is a type of data compression that is commonly "lossy" as the quantization of a transform block taken from a source picture often discards data associated with the transform block in the source picture, thereby lowering its bandwidth requirement but often also resulting in quality loss in reproduction of the original transform block from the source picture.

MPEG-4 AVC, also known as H.264, is an established video compression standard that uses transform coding in block processing. In H.264, a picture is divided into macroblocks (MBs) of 16×16 pixels. Each MB is often further divided into smaller blocks. Blocks equal in size to or smaller than a MB are predicted using intra-/inter-picture prediction, and a spatial transform along with quantization is applied to the prediction residuals. The quantized transform coefficients of the residuals are commonly encoded using entropy coding methods (i.e., variable length coding or arithmetic coding). Context Adaptive Binary Arithmetic Coding (CABAC) was introduced in H.264 to provide a substantially lossless compression efficiency by combining an adaptive binary arithmetic coding technique with a set of context models. Context model selection plays a role in CABAC in providing a degree of adaptation and redundancy reduction. H.264 specifies two kinds of scan patterns over 2D blocks. A zigzag scan is used for pictures coded with progressive video compression techniques and an alternative scan is for pictures coded with interlaced video compression techniques.

HEVC (High Efficiency Video Coding), an international video coding standard developed to succeed H.264, extends transform block sizes to 16×16 and 32×32 pixels to benefit high definition (HD) video coding.

BRIEF DESCRIPTION OF THE DRAWINGS

Various embodiments of the present invention will be described below in more detail, with reference to the accompanying drawings.

It is to be noted, however, that the appended drawings illustrate embodiments of this invention and are therefore not to be considered limiting of its scope, for the invention may admit to other equally effective embodiments.

FIGS. 8-15 illustrate how neighboring elements may be used to determine context models in an embodiment of the invention.

DETAILED DESCRIPTION

Figure 1A:
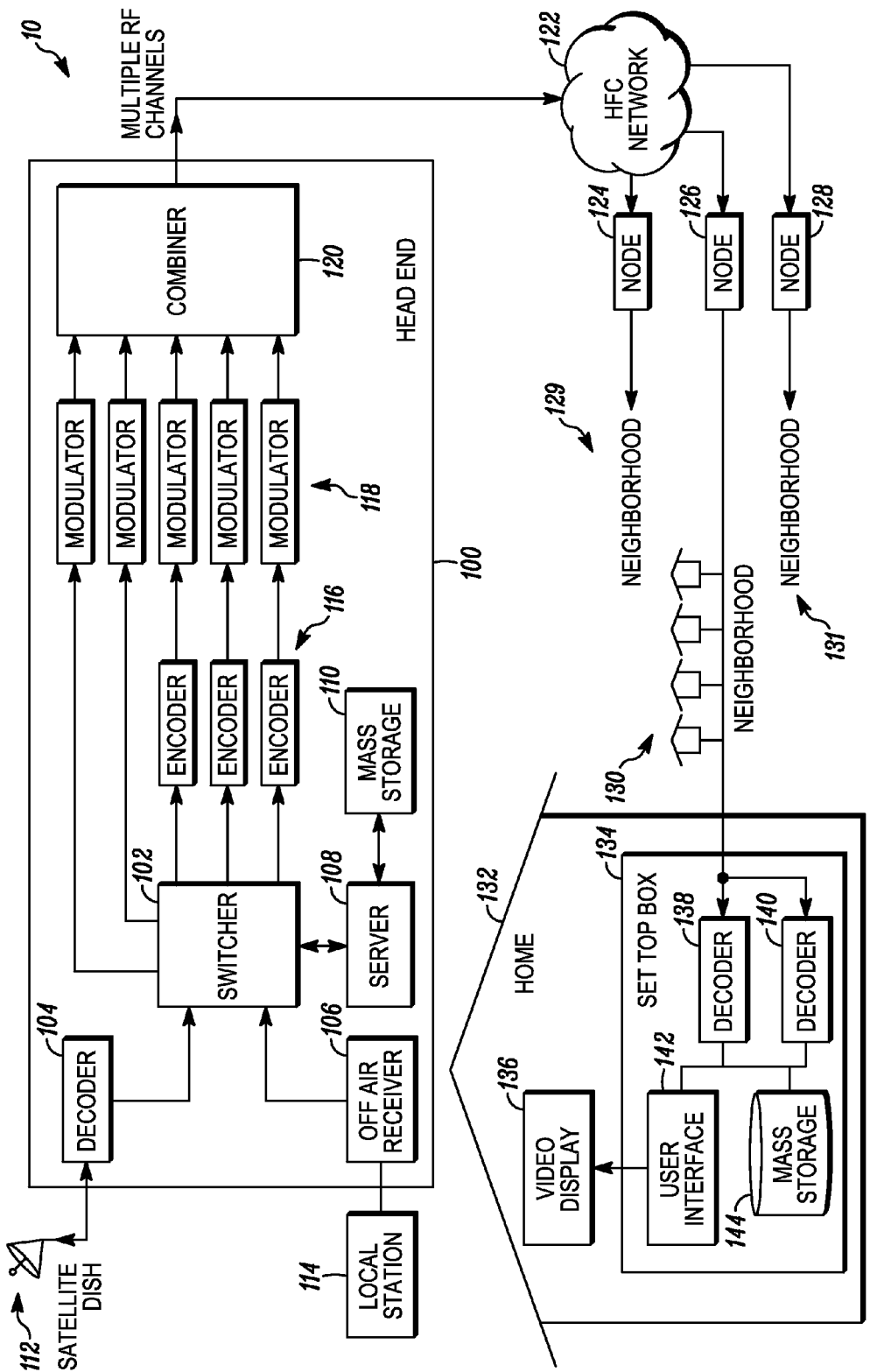
FIG. 1A is a video system in which the various embodiments of the invention may be used.

Various embodiments and features of the invention will now be described. In one embodiment of the invention, a significance map of a matrix of video data coefficients is encoded or decoded using context-based adaptive binary arithmetic coding (CABAC). More specifically, a significance map for a matrix of quantized and transformed coefficients is (either encoded or decoded) scanned line-by-line (referred to as scanning lines) along a scanning pattern. Each scanning line may be a vertical, horizontal, or diagonal section of the scanning pattern. Context models for each element processed in a particular scanning line are chosen based on values of neighboring elements that are not in the scanning line, but rather are in other scanning lines. In some embodiments, the neighboring elements are in no more than two other scanning lines. In other embodiments, the neighboring elements are only in one other scanning line.

Avoiding reliance on neighbors that are in the same scanning line facilitates parallel processing. For example, a first encoder could process a binary number along a scanning line while a second encoder could, in parallel, process another binary number in the same scanning line. This simultaneous processing is facilitated by the fact that the context models for each of the two binary numbers are not interdependent. That is to say, the binary number being processed by the first encoder does not depend, for selection of its context model, on the binary number being processed by the second encoder.

In another embodiment of the invention, given a block in the transform domain, the associated significance map is coded following a scanning pattern. The scanning pattern is pre-determined for a current block, a current slice, a current picture or a current sequence, or it can be one of a few possible scanning patterns available for a current block, a current slice, a current picture or a current sequence.

In yet another embodiment of the invention, the context model for an element in the significance map is selected based upon the element's frequency position in the transform domain. An element in the low frequency position in the transform domain may share the same context model with other elements in other transform blocks, but in the same frequency position, because of possible high correlation among those elements at the same frequency position. An element in high frequency position in the transform domain may be determined based upon the values (0 or 1) of the element's coded neighbors within the same block, excluding the coded neighbors along the same scanning line.

An example of a video system in which an embodiment of the invention may be used will now be described. It is understood that elements depicted as function blocks in the figures may be implemented as hardware, software, or a combination thereof. Furthermore, embodiments of the invention may also be employed on other systems, such as on a personal computer. smartphone or tablet computer.

Referring to FIG. 1A, the video system, generally labeled 10, includes a head end 100 of a cable television network. The head end 100 is configured to deliver video content to neighborhoods 129, 130 and 131. The head end 100 may operate within a hierarchy of head ends, with the head ends higher in the hierarchy generally having greater functionality. The head end 100 is communicatively linked to a satellite dish 112 and receives video signals for non-local programming from it. The head end 100 is also communicatively linked to a local station 114 that delivers local programming to the head end 100. The head end 100 includes a decoder 104 that decodes the video signals received from the satellite dish 112, an off-air receiver 106 that receives the local programming from the local station 114, a switcher 102 that routes data traffic among the various components of the head end 100, encoders 116 that encode video signals for delivery to customers, modulators 118 that modulate signals for delivery to customers, and a combiner 120 that combines the various signals into a single, multi-channel transmission.

The head end 100 is also communicatively linked to a hybrid fiber cable (HFC) network 122. The HFC network 122 is communicatively linked to a plurality of nodes 124, 126, and 128. Each of the nodes 124, 126, and 128 is linked by coaxial cable to one of the neighborhoods 129, 130 and 131 and delivers cable television signals to that neighborhood. One of the neighborhoods 130 of FIG. 1A is shown in more detail. The neighborhood 130 includes a number of residences, including a home 132 shown in FIG. 1A. Within the home 132 is a set-top box 134 communicatively linked to a video display 136. The set-top box 134 includes a first decoder 138 and a second decoder 140. The first and second decoders 138 and 140 are communicatively linked to a user interface 142 and a mass storage device 144. The user interface 142 is communicatively linked to the video display 136.

During operation, head end 100 receives local and nonlocal programming video signals from the satellite dish 112 and the local station 114. The nonlocal programming video signals are received in the form of a digital video stream, while the local programming video signals are received as an analog video stream. In some embodiments, local programming may also be received as a digital video stream. The digital video stream is decoded by the decoder 104 and sent to the switcher 102 in response to customer requests. The head end 100 also includes a server 108 communicatively linked to a mass storage device 110. The mass storage device 110 stores various types of video content, including video on demand (VOD), which the server 108 retrieves and provides to the switcher 102. The switcher 102 routes local programming directly to the modulators 118, which modulate the local programming, and routes the non-local programming (including any VOD) to the encoders 116. The encoders 116 digitally encode the non-local programming. The encoded non-local programming is then transmitted to the modulators 118. The combiner 120 receives the modulated analog video data and the modulated digital video data, combines the video data and transmits it via multiple radio frequency (RF) channels to the HFC network 122.

The HFC network 122 transmits the combined video data to the nodes 124, 126 and 128, which retransmit the data to their respective neighborhoods 129, 130 and 131. The home 132 receives this video data at the set-top box 134, more specifically at the first decoder 138 and the second decoder 140. The first and second decoders 138 and 140 decode the digital portion of the video data and provide the decoded data to the user interface 142, which then provides the decoded data to the video display 136.

The encoders 116 and the decoders 138 and 140 of FIG. 1A (as well as all of the other steps and functions described herein) may be implemented as computer code comprising computer readable instructions stored on a computer readable storage device, such as memory or another type of storage device. The computer code is executed on a computer system by a processor, such as an application-specific integrated circuit (ASIC), or other type of circuit. For example, computer code for implementing the encoders 116 may be executed on a computer system (such as a server) residing in the headend 100. Computer code for the decoders 138 and 140, on the other hand, may be executed on the set-top box 134, which constitutes a type of computer system. The code may exist as software programs comprised of program instructions in source code, object code, executable code or other formats.

Figure 1B:
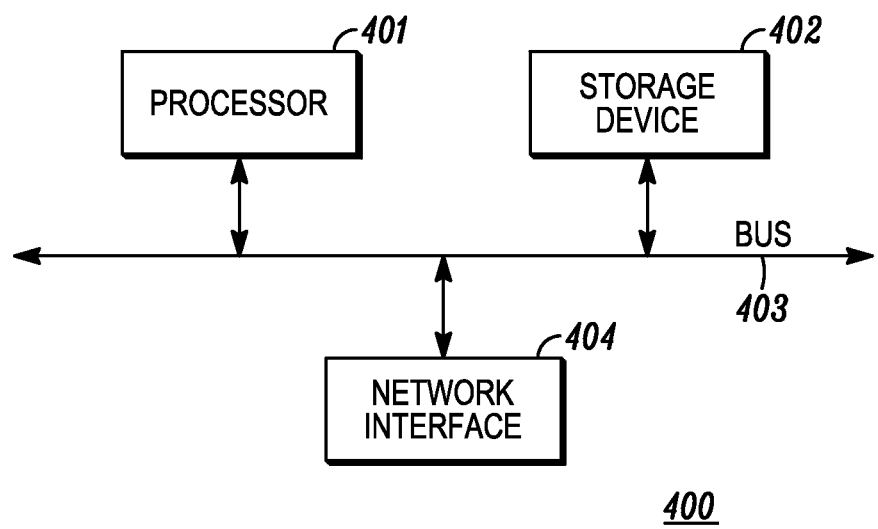
FIG. 1B is a computer system on which embodiments of the invention may be implemented.

FIG. 1B shows an example of a computer system on which computer code for the encoders 116 and the decoders 138 and 140 may be executed. The computer system, generally labeled 400, includes a processor 401, or processing circuitry, that may implement or execute software instructions performing some or all of the methods, functions and other steps described herein. Commands and data from processor 401 are communicated over a communication bus 403. Computer system 400 also includes a computer readable storage device 402, such as random access memory (RAM), where the software and data for processor 401 may reside during runtime. Storage device 402 may also include non-volatile data storage. Computer system 400 may include a network interface 404 for connecting to a network. Other known electronic components may be added or substituted for the components depicted in the computer system 400. The computer system 400 may reside in the head end 100 and execute the encoders 116, and may also be embodied in the set-top box 134 to execute the decoders 138 and 140. Additionally, the computer system 400 may reside in places other than the head end 100 and the set-top box 134, and may be miniaturized so as to be integrated into a smartphone or tablet computer.

Figure 2A:
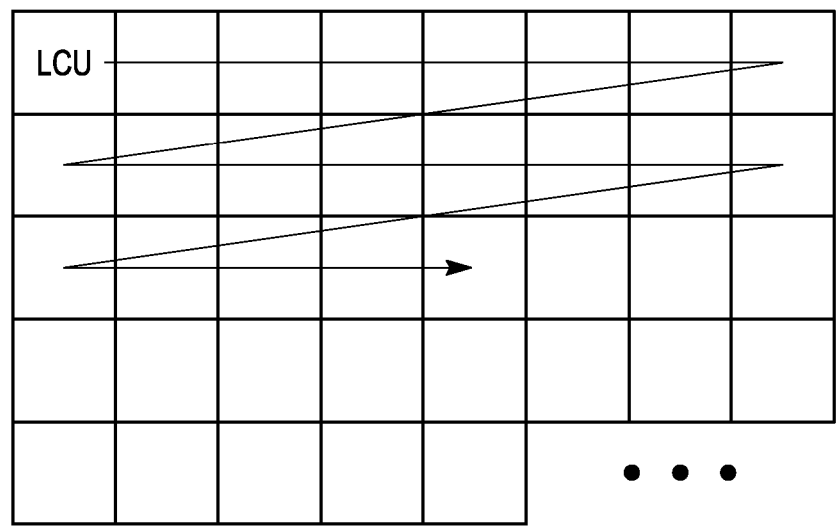
FIGS. 2A, 2B, 3A and 3B illustrate certain video encoding principles according to an embodiment of the invention.
Figure 3A:
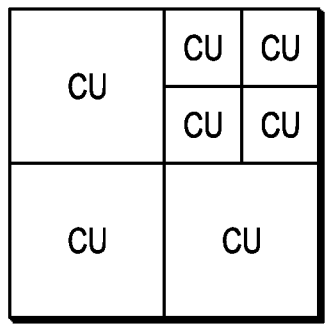

A high-level description of how video data gets encoded and decoded by the encoders 116 and the decoders 138 and 140 in an embodiment of the invention will now be provided. In this embodiment, the encoders and decoders operate according to a High Efficiency Video Coding (HEVC) method. HEVC is a block-based hybrid spatial and temporal predictive coding method. In HEVC, an input picture is first divided into square blocks, called LCUs (largest coding units), as shown in FIG. 2A. Unlike other video coding standards, in which the basic coding unit is a Macroblock of 16×16 pixels, in HEVC, the LCU can be as large as 128×128 pixels. An LCU can be divided into four square blocks, called CUs (coding units), which are a quarter of the size of the LCU. Each CU can be further split into four smaller CUs, which are a quarter of the size of the original CU. The splitting process can be repeated until certain criteria are met. FIG. 3A shows an example of LCU partitioned into CUs.

Figure 3B:
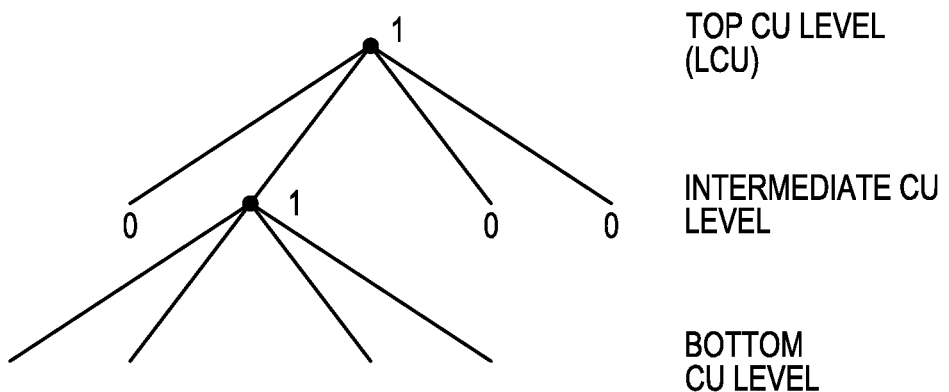

How a particular LCU is split into CUs can be represented by a quadtree. At each node of the quadtree, a flag is set to "1" if the node is further split into sub-nodes. Otherwise, the flag is unset at "0." For example, the LCU partition of FIG. 3A can be represented by the quadtree of FIG. 3B. These "split flags" are jointly coded with other flags in the video bitstream, including a skip mode flag, a merge mode flag, and a predictive unit (PU) mode flag. In the case of the quadtree of FIG. 3B, the split flags 10100 would be coded as overhead along with the other flags.

Figure 2B:
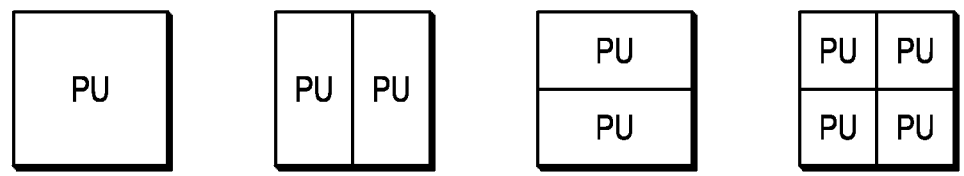

Each CU can be further divided into predictive units (PUs). Thus, at each leaf of a quadtree, a final CU of 2N×2N can possess one of four possible patterns (N×N, N×2N, 2N×N and 2N×2N), as shown in FIG. 2B. A CU can be either spatially or temporally predictive coded. If a CU is coded in intra mode, each PU of the CU can have its own spatial prediction direction. If a CU is coded in inter mode, each PU of the CU can have its own motion vector(s) and associated reference picture(s).

Figure 5A:
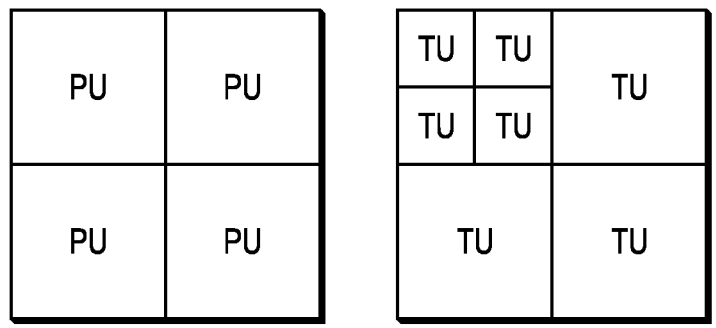
FIGS. 5A and 5B illustrate further video coding principles according to an embodiment of the invention.
Figure 5B:
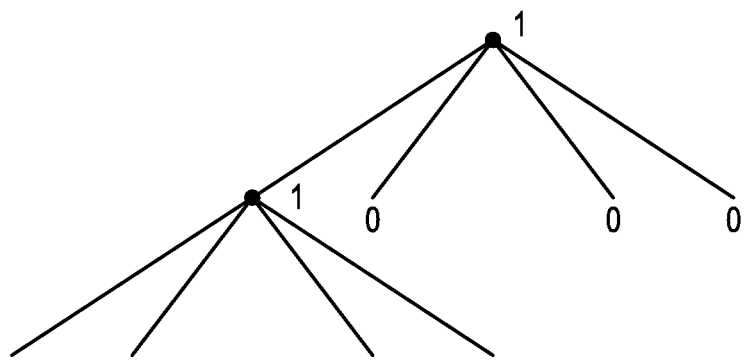

Each CU can also be divided into transform units (TUs) by application of a block transform operation. A block transform operation tends to decorrelate the pixels within the block and compact the block energy into the low order coefficients of the transform block. But, unlike other methods where only one transform of 8×8 or 4×4 is applied to a MB, in the present embodiment, a set of block transforms of different sizes may be applied to a CU, as shown in FIG. 5A where the left block is a CU partitioned into PUs and the right block is the associated set of transform units (TUs). The size and location of each block transform within a CU is described by a separate quadtree, called RQT. FIG. 5B shows the quadtree representation of TUs for the CU in the example of FIG. 5A. In this example, 11000 is coded and transmitted as part of the overhead.

The TUs and PUs of any given CU may be used for different purposes. TUs are typically used for transformation, quantizing and coding operations, while PUs are typically used for spatial and temporal prediction. There is not necessarily a direct relationship between the number of PUs and the number of TUs for a given CU.

Figure 4A:
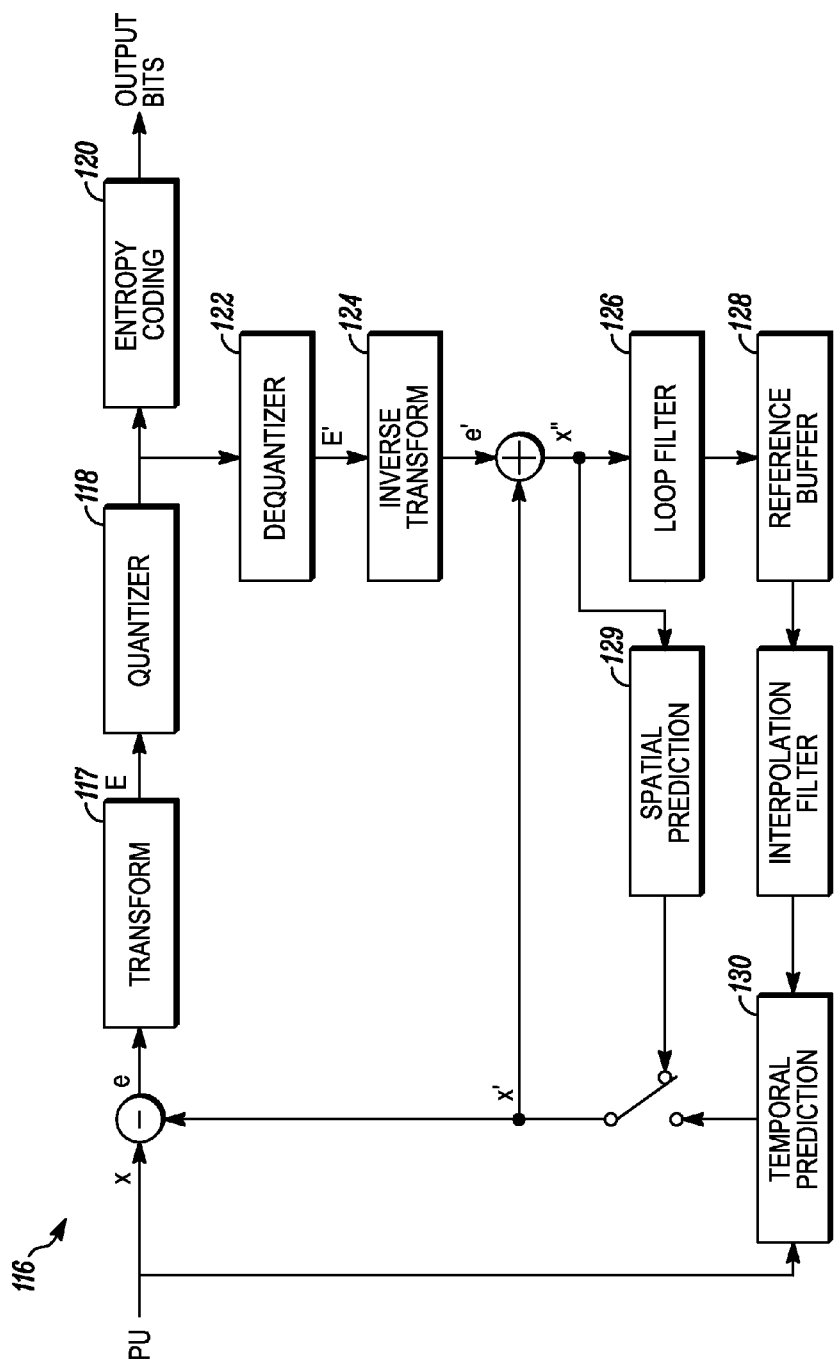
FIGS. 4A and 4B show possible architectures for an encoder and a decoder according to an embodiment of the invention.

The encoders 116 (FIG. 1A) are, according to an embodiment of the invention, composed of several functional modules as shown in FIG. 4A. These modules may be implemented as hardware, software, or any combination of the two. Given a current PU, x, a prediction PU, x', is first obtained through either spatial prediction or temporal prediction. This spatial or temporal prediction is performed by a spatial prediction module 129 or a temporal prediction module 130 respectively.

There are several possible spatial prediction directions that the spatial prediction module 129 can perform per PU, including horizontal, vertical, 45-degree diagonal, 135-degree diagonal, DC, Planar, etc. In one embodiment, the number of Luma intra prediction modes for 4*4, 8*8, 16*16, 32*32, and 64*64 blocks is 18, 35, 35, 35, and 4 respectively. Including the Luma intra prediction modes, an additional mode, called IntraFromLuma, may be used for the Chroma intra prediction mode. A syntax indicates the spatial prediction direction per PU.

The encoder 116 (FIG. 1A) performs temporal prediction through motion estimation operations. Specifically, the temporal prediction module 130 (FIG. 4A) searches for a best match prediction for the current PU over reference pictures. The best match prediction is described by motion vector (MV) and associated reference picture (refIdx). A PU in B pictures can have up to two MVs. Both MV and refIdx are part of the syntax in the bitstream.

The prediction PU is then subtracted from the current PU, resulting in the residual PU, e. The residual PU, e, is then transformed by a transform module 116, one transform unit (TU) at a time, resulting in the residual PU in the transform domain, represented by transform coefficients, E. To accomplish this task, the transform module 116 uses either a square or a non-square block transform.

Referring back to FIG. 4A, the transform coefficients E are quantized by a quantizer module 118, converting the high precision transform coefficients into a finite number of possible values. The quantized coefficients are then entropy coded by an entropy coding module 120, resulting in the final compression bits. The specific steps performed by the entropy coding module 120 will be discussed below in more detail.

To facilitate temporal and spatial prediction, the encoder 116 also takes the quantized transform coefficients E and dequantizes them with a dequantizer module 122 resulting in the dequantized transform coefficients E'. The dequantized transform coefficients E' are then inverse transformed by an inverse transform module 124, resulting in the reconstructed residual PU, e'. The reconstructed residual PU, e', is then added to the corresponding prediction, PU, x', either spatial or temporal, to form a reconstructed PU, x".

Referring still to FIG. 4A, a deblocking filter operation is performed on the reconstructed PU, x", first to reduce blocking artifacts. A sample adaptive offset process is conditionally performed after the completion of the deblocking filter process for the decoded picture, which compensates the pixel value offset between reconstructed pixels and original pixels. An adaptive loop filter function is performed conditionally by a loop filter module 126 over the reconstructed PU, which minimizes the coding distortion between the input and output pictures. If the reconstructed pictures are reference pictures, they will be stored in a reference buffer 128 for future temporal prediction.

In an embodiment of the invention, intra pictures (such as an I picture) and inter pictures (such as P pictures or B pictures) are supported by the encoder 116 (FIG. 1A). An intra picture is coded without referring to other pictures. Hence, spatial prediction is used for a CU/PU inside an intra picture. An intra picture provides a possible point where decoding can begin. On the other hand, an inter picture aims for high compression. Inter picture supports both intra and inter prediction. A CU/PU in inter picture is either spatially or temporally predictive coded. Temporal references are the previously coded intra or inter pictures.

The operation of the entropy coding module 120 (FIG. 4A) according to an embodiment of the invention will now be described in more detail. The entropy coding module 120 takes the quantized matrix of coefficients received from the quantizer module 118 and uses it to generate a sign matrix that represents the signs of all of the quantized coefficients and to generate a significance map. A significance map is a matrix in which each element specifies the position(s) of the non-zero quantized coefficient(s) within the quantized coefficient matrix. Specifically, given a quantized 2D transformed matrix, if the value of a quantized coefficient at a position (y, x) is non zero, it is considered as significant and a "1" is assigned for the position (y, x) in the associated significance map. Otherwise, a "0" is assigned to the position (y, x) in the significance map.

Once the entropy coding module 120 has created the significance map, it codes the significance map. In one embodiment, this is accomplished by using a context-based adaptive binary arithmetic coding (CABAC) technique. In doing so, the entropy coding module 120 scans the significance map along a scanning line and, for each entry in the significance map, the coding module chooses a context model for that entry. The entropy coding module 120 then codes the entry based on the chosen context model. That is, each entry is assigned a probability based on the context model (the mathematical probability model) being used. The probabilities are accumulated until the entire significance map has been encoded.

Figure 4B:
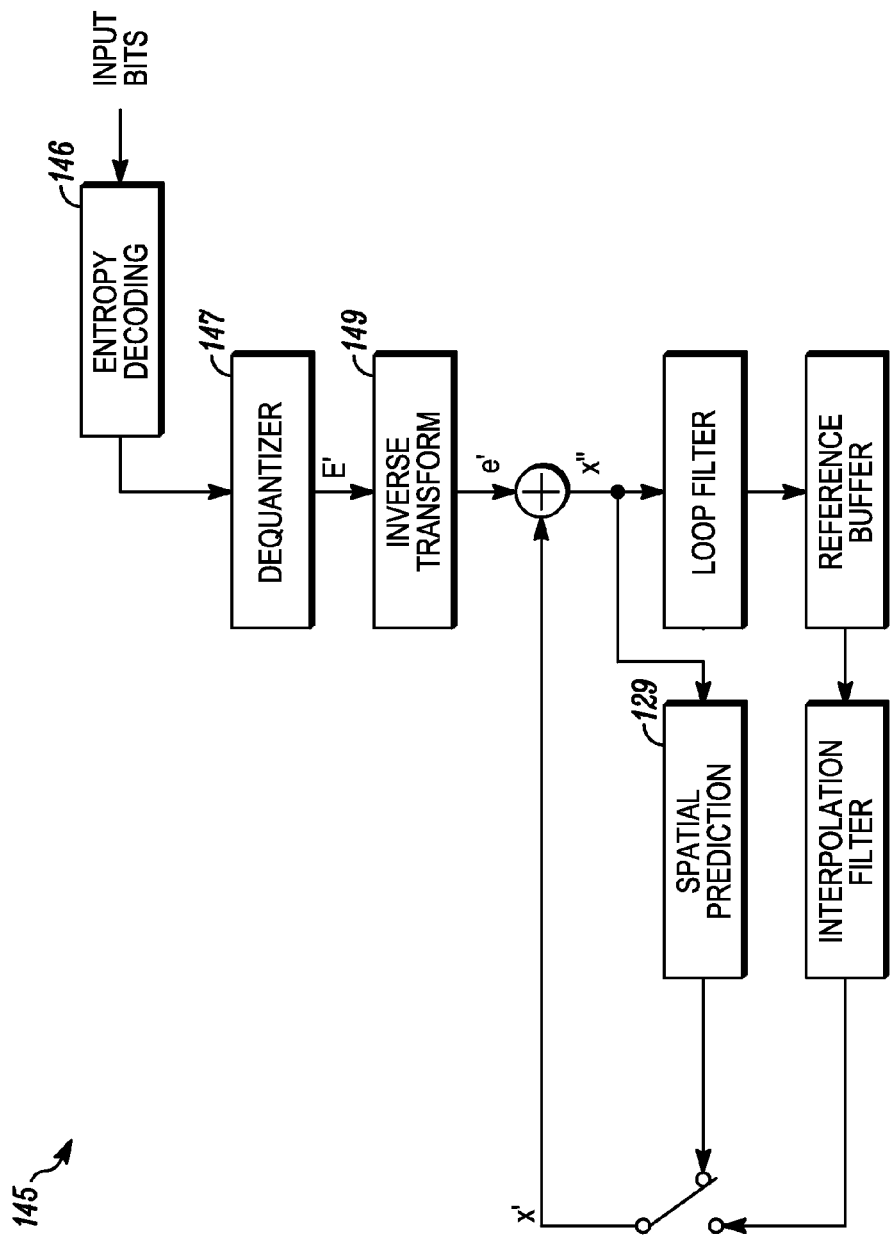

The value output by the entropy coding module 120 as well as the entropy encoded signs, significance map and non-zero coefficients are inserted into the bitstream by the encoder 116 (FIG. 1A). This bitstream is sent to the decoders 138 and 140 over the HFC network 122. When the decoders 138 and 140 (FIG. 1A) receive the bitstream, they performs the functions shown in FIG. 4B. An entropy decoding module 146 of the decoder 138 decodes the sign values, significance map and non-zero coefficients to recreate the quantized and transformed coefficients. In decoding the significance map, the entropy decoding module 120 performs the reverse of the procedure described in conjunction with the entropy coding module 120—decoding the significance map along a scanning pattern made up of scanning lines. The entropy decoding module 146 then provides the coefficients to a dequantizer module 147, which dequantizes the matrix of coefficients, resulting in dequantized transform coefficients E'. The dequantizer module 147 provides the dequantized coefficients E' to an inverse transform module 149. The inverse transform module 149 performs an inverse transform operation on the coefficients E' resulting in the reconstructed residual PU, e'. Filtering and spatial prediction is applied in a manner described in conjunction with FIG. 4A.

As has been described above, converting video pictures into a compressed bitstream on the encoder side and converting the bitstream back into video pictures on the decoder side is a multi-step process. Various embodiments of the invention described herein are generally directed to the part of the process in which the significance map is encoded and decoded.

To accommodate parallel processing according to an embodiment of the present invention, the context models for at least one of the elements of a significance map are chosen based on values of neighboring elements, excluding elements along the same scanning line. In this way, dependencies between elements along the same scanning line are eliminated.

Referring to FIGS. 6A through 6E, the encoder 116 (FIG. 1A) processes a significance map 600 line by line along a scanning pattern. In each of these figures, the scanning pattern is represented by a series of arrow-headed lines, with each line representing a scanning line within the scanning pattern. The scanning pattern may be, for example, a zigzag scan, such as zigzag scan shown in FIG. 6A, a diagonal down-left scan, such as diagonal down-left scan shown in FIG. 6B, a diagonal top-right scan, such as diagonal top-right scan shown in FIG. 6C, a vertical scan, such as vertical scan shown in FIG. 6D, or a horizontal scan, such as horizontal scan shown in FIG. 6E. The scanning patterns shown in FIGS. 6A-6E may also be performed in reverse, so that the pattern would begin in the opposite corner and the directions of the arrow-heads would be reversed.

In each example, elements 602 and 604 are along the same scanning line within the scanning pattern, but can be processed in parallel with one another. This is because the context models for each of these two elements does not depend on the value of the other element. In other words, the context model for the first element 602 does not depend on the value of the second element 604.

A more specific example will now be provided. If the elements of the significance map are processed along a diagonal scanning pattern (as in FIG. 6A, 6B or 6C), then the procedure of FIG. 7A may be used. FIG. 7A is a matrix representation of a set of processing rules for a significance map. These rules may be expressed as follows, where "height" is the height of the significance map matrix (the number of elements along the y axis) and "width" is the width of the significance map matrix (the number of elements along the x axis):

Rule A: For an element at position (0, 0), (0, 1) or (1, 0), the encoder or decoder assigns a unique context model. That is, an element at position (0, 0), (0, 1) or (1, 0) in a current block shares the same context model with other elements in significance maps of other blocks at the same position (0, 0), (0, 1) or (1, 0).

Rule B: For an element at position (0, x>1) the encoder or decoder chooses the context model based on the values (0 or 1) of the element's neighbors at positions (0, x−1), (0, x−2), and (1, x−2).

Rule C: For an element at position (y>1, 0), the encoder or decoder chooses the context model based on the values (0 or 1) of the element's neighbors at positions (y−1, 0), (y−2, 0) and (y−2, 1).

Rule D: For an element at position (y>0, x>0), the encoder or decoder chooses the context model based on the value (0 or 1) of the element's neighbors at positions (y−1, x−1), (y−1, x) and (y, x−1) as well as on:

Rule E: (y−1, x−2) and (y, x−2) if x>1,

Rule F: (y+1, x−2) if x is larger than 1 and y is smaller than the height−1,

Rule G: (y−2, x−1) and (y−2, x) if y is larger than 1, and

Rule H: (y−2, x+1) if y is larger than 1 and x is smaller than the width−1.

The total number of instances of a binary '1' is calculated and the encoder or decoder uses a context model that corresponds to that number. For example, if Rules D, E, and F are applied to element within (y,x), the encoder or decoder would calculate the number of instances of binary '1' among the neighboring elements at (y−1,x−1), (y−1,x), (y,x−1), (y−1,x−2), (y,x−2) and (y+1,x−2). If there are three instances of binary '1' among those neighboring elements, then the context model number three is used to encode or decode the element being processed. Each context model may yield a different probability for an element in a significance map.

Referring to the flowchart of FIG. 7B, an application of Rules A through H above in accordance with an embodiment of the invention will now be described. At step 702, the encoder or decoder determines whether the element is at position (0,0), (0,1) or (1,0). If it is, then the process continues to step 704, at which the encoder or decoder uses the same context model as the element in the same position in other transform units (TUs) of the same size. For example, if the element at position (0,1) in the previous TU of the same size uses context model 1, then the element at position (0,1) will use context model 1.

At step 706, the encoder or decoder determines whether the element is at position (0,x>1). If so, then the process continues to step 708, in which the encoder or decoder selects the context model based on the value (0 or 1) of the element's neighbors at positions (0,x−1), (0,x−2) and (1,x−2). Otherwise the process moves to step 710, at which the encoder or decoder determines whether the element is at position (y>1, 0). If it is, then the process moves to step 712, at which the encoder or decoder selects the context model for the element based on the neighboring elements (y−1,0), (y−2,0) and (y−2, 1).

At step 714, the encoder or decoder determines whether the element is at position (y>0,x>0). If it is, then the process moves to step 716, at which the encoder or decoder selects the context model for that element based on the value of the elements at positions (y−1,x−1), (y−1,x), and (y,x−1). If not, then the process moves to step 718, at which the encoder or decoder determines whether the x coordinate of the element is greater than 1. If it is, then the process moves to step 720, at which the encoder or decoder additionally considers the value of the elements at positions (y−1,x−2) and (y,x−2). If not, then the process moves to step 726.

At step 722, the encoder or decoder determines whether y is less than the height of the significance map minus 1. If it is, then the encoder or decoder additionally considers the value of the element at position (y+1,x−2) at step 724. At step 726, the encoder or decoder determines whether y is greater than 1. If it is, then the encoder or decoder additionally considers the values of the elements at positions (y−2,x−1) and (y−2, x) at step 728. At step 730, the encoder or decoder determines whether x is less than the width of the significance map minus 1. If it is, then the encoder or decoder additionally considers the value of the element at position (y−2,x+1).

Turning now to FIGS. 8-15, an example of how multiple elements of a significance map can be processed in parallel using the processing scheme described above will now be illustrated. In this example, it is assumed that two decoders 138 and 140 (FIG. 1A) (referred to as the first and second decoders) are decoding a significance map (i.e., the hypothetical significance map of FIGS. 8-15).

Figure 6A:
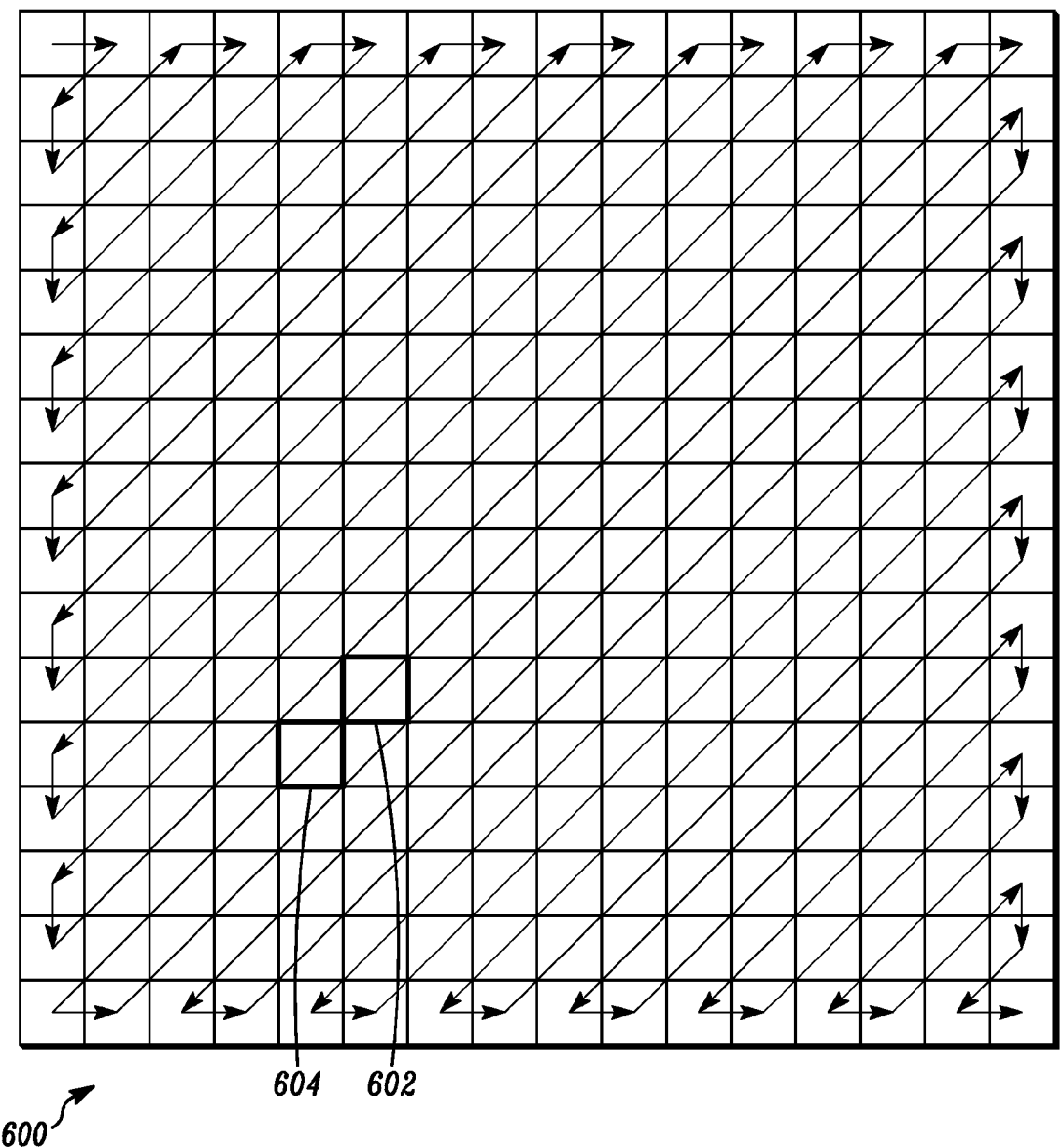
FIGS. 6A-6E show possible scanning patterns that may be used in conjunction with various embodiments of the invention.
Figure 6B:
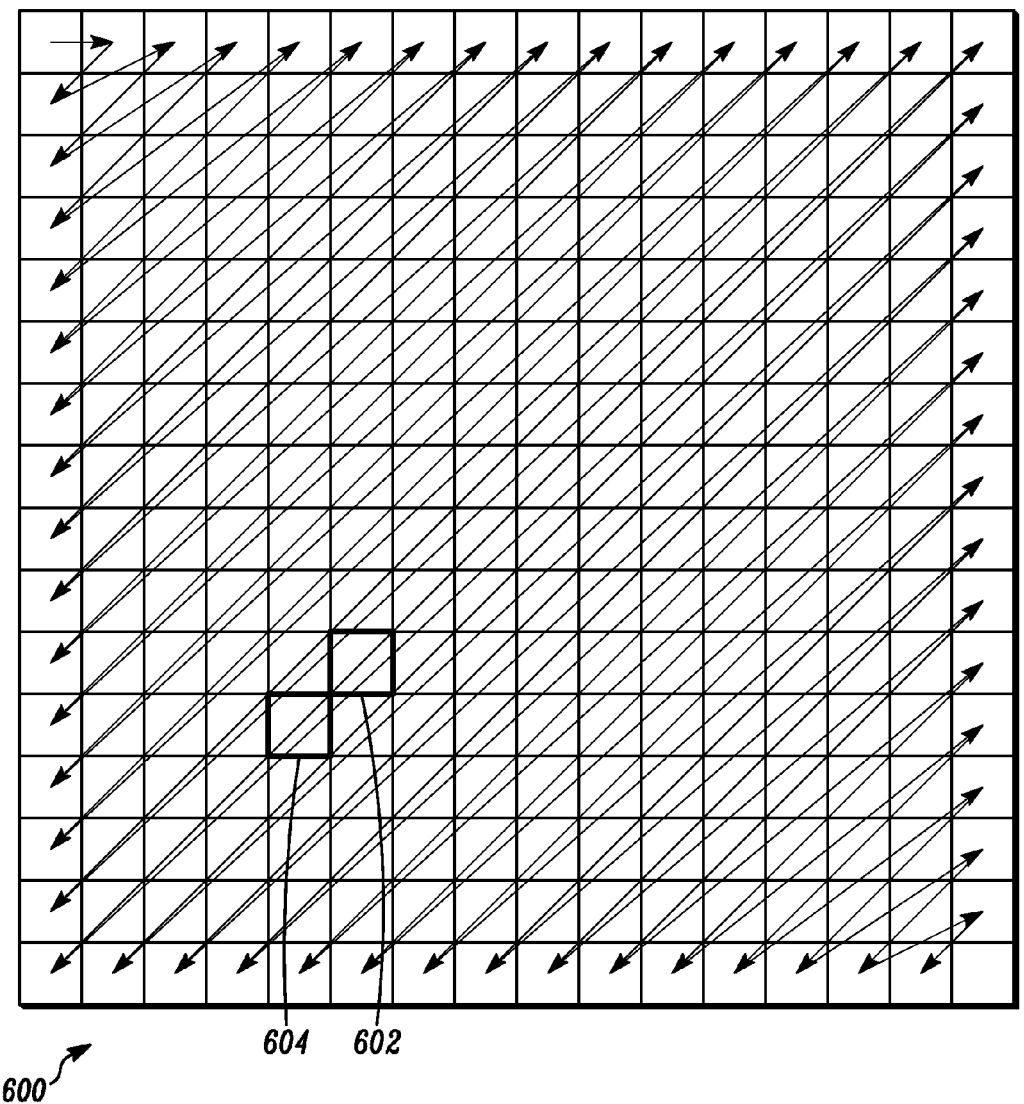
Figure 6C:
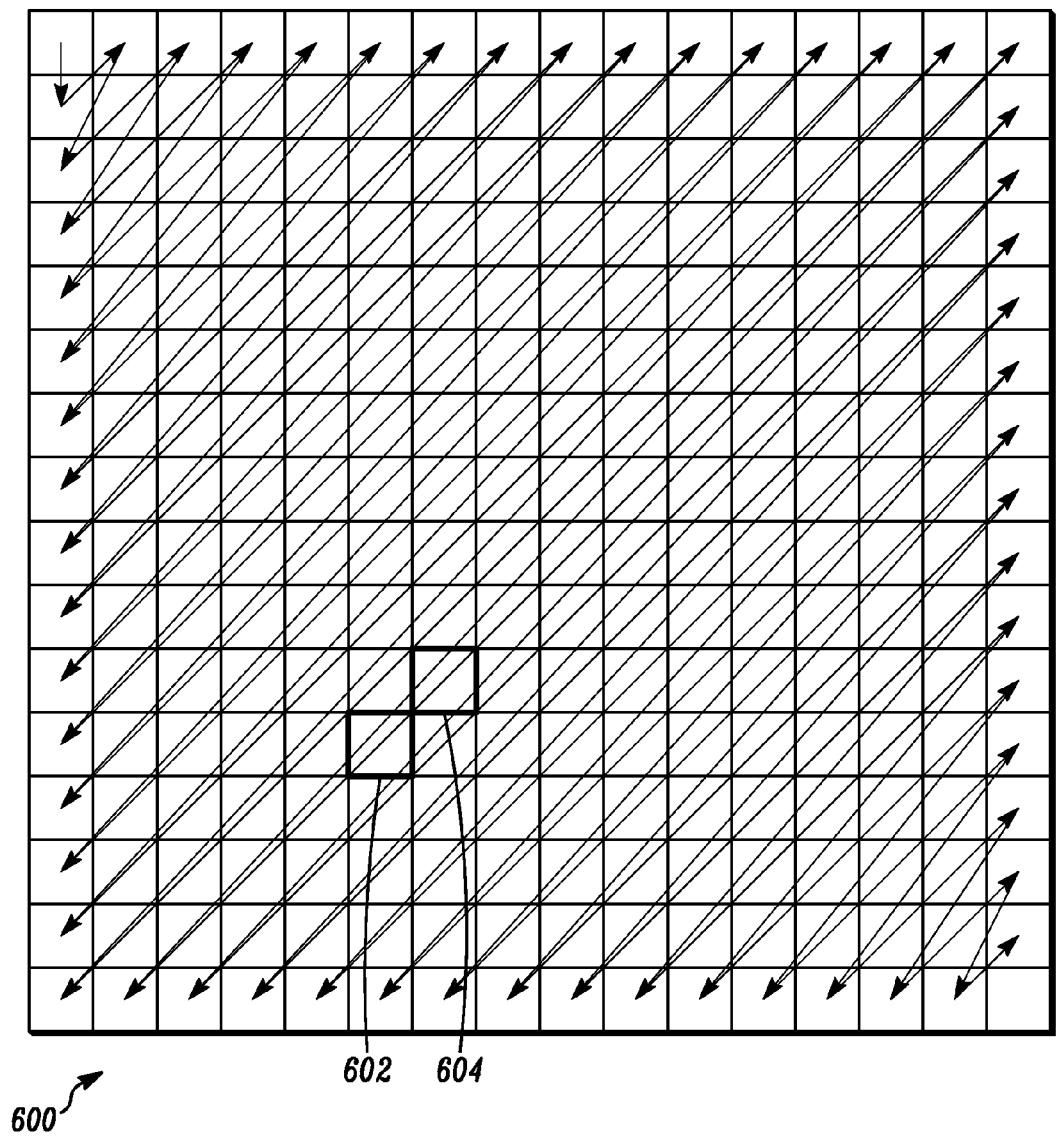
Figure 6D:
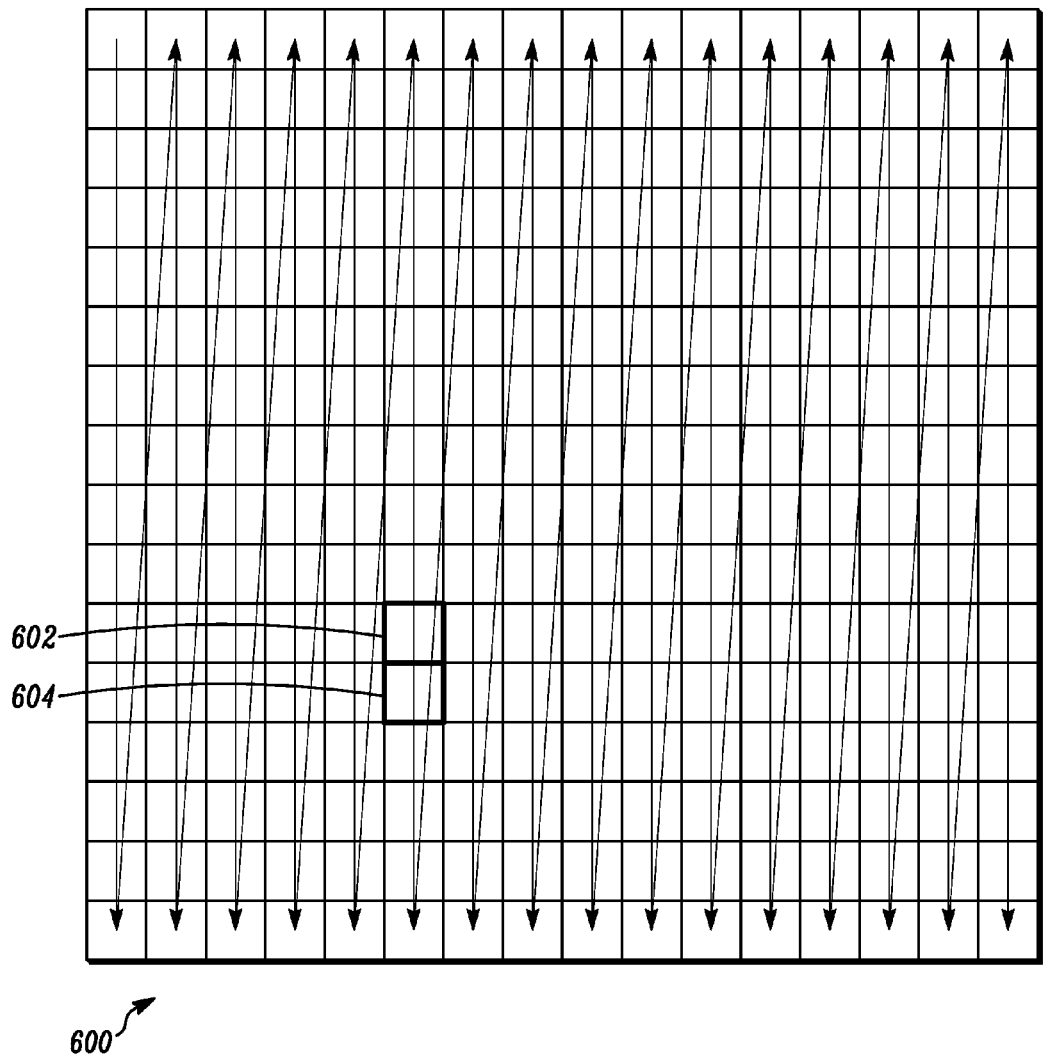
Figure 6E:
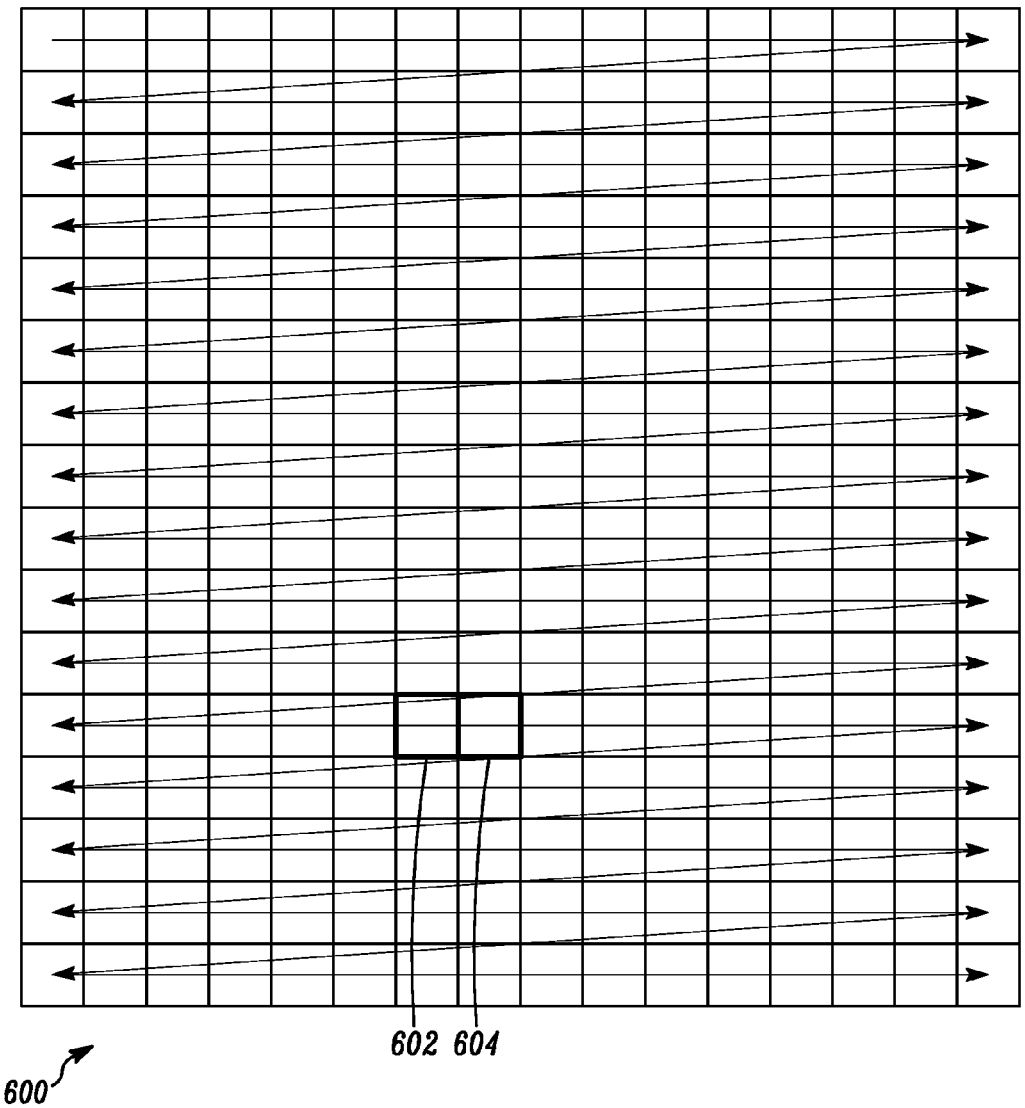
Figure 7A:
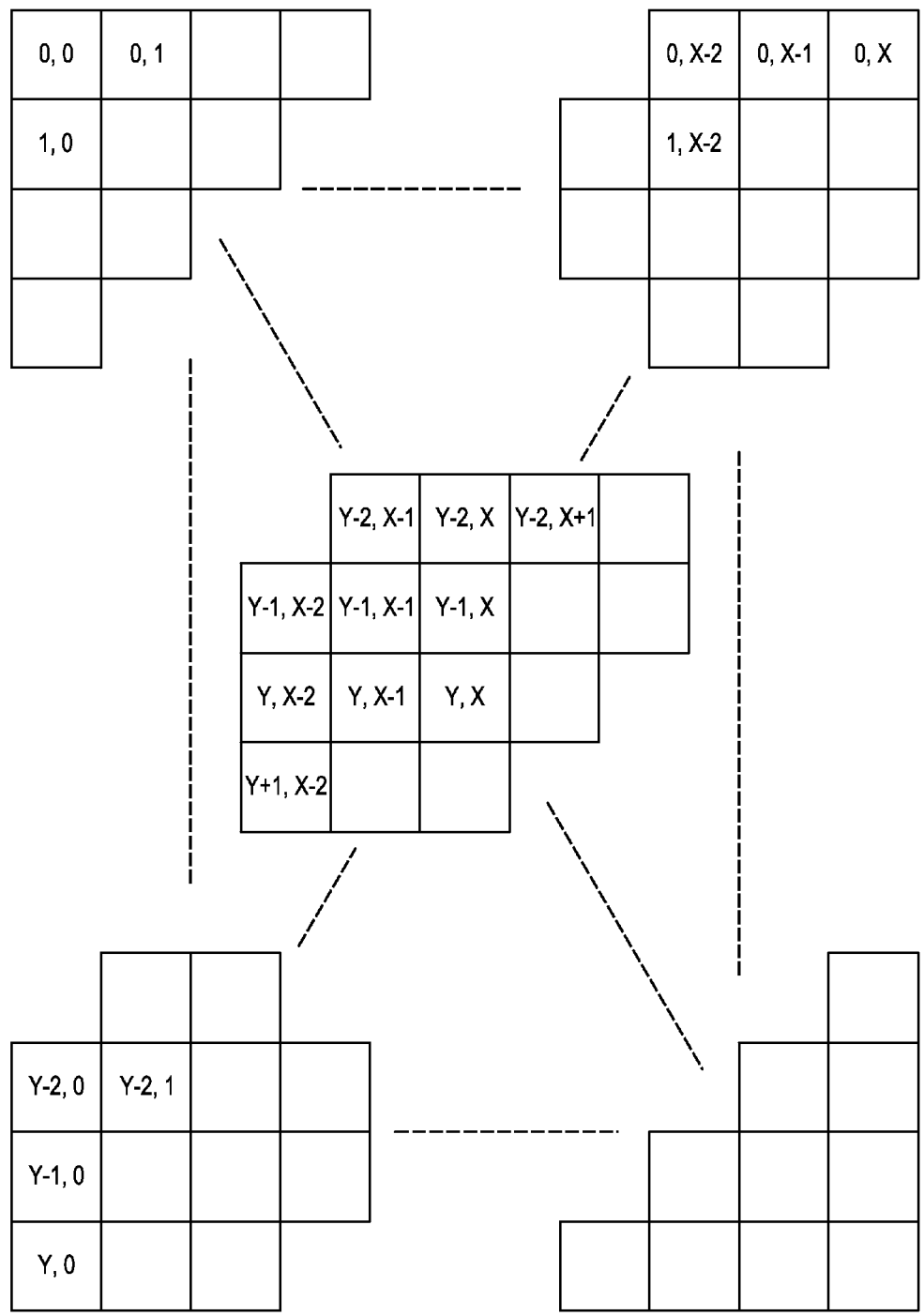
FIGS. 7A and 7B illustrate processing methods that may be used in an embodiment of the invention.

The first decoder and the second decoder decode the significance map in a diagonal down-left scanning path (like the scanning path shown in FIG. 6B). Pursuant to Rule A outlined previously, the first decoder applies the same context model to the element at position (0,0) that was applied to decode the element at position (0,0) in a previously decoded significance map. The second decoder applies the same context model to the element at position (0,1) that was applied to decode the element at position (0,1) in a previously decoded significance map. In parallel with the operation of the second decoder, the first decoder applies the same context model to the element at position (1,0) that was applied to decode the element at position (1,0) in a previously decoded significance map.

The first decoder selects the context model for the element at position (1,1) based on the values of elements at positions (0,0), (0,1) and (1,0). The second decoder simultaneously determines the context model for the element at position (2,0) by using the same group of elements—(0,0), (0,1) and (1,0). This process continues for each scanning line along the scanning pattern. Table 1 below lists the coordinates of the elements of the significance map being decoded along with the neighboring elements used to determine the context model used, the figure and reference number showing the grouping of neighbors, and the rules (from Rules A through H above) being used. Examples of multiple elements that can be encoded in parallel by a first decoder and a second decoder are indicated in the first column. For the sake of conciseness, not every element of the significance map is shown being decoded. The elements shown in Table 1 are intended to be examples only.

TABLE 1

Figures 10, 11:
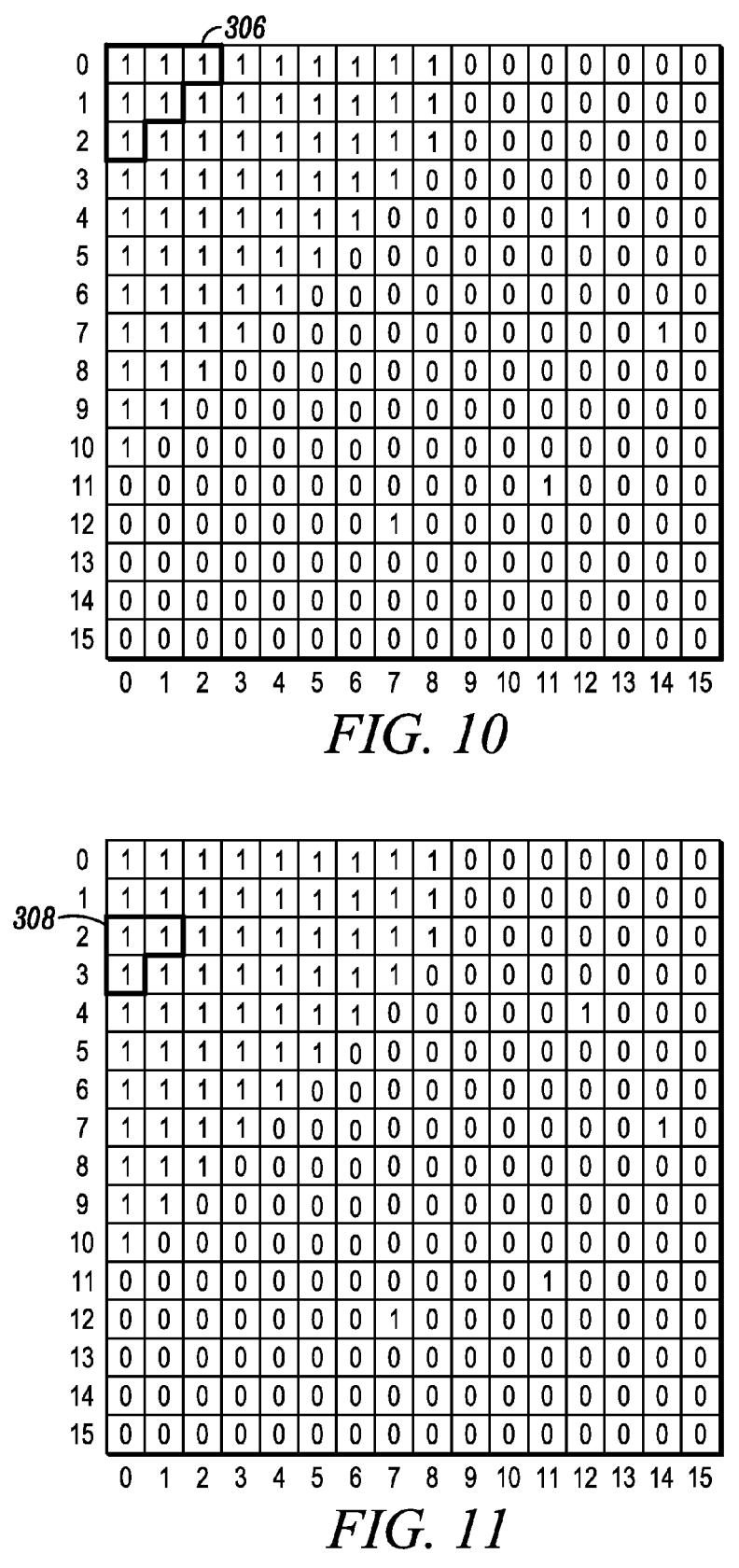
Figures 12, 13:
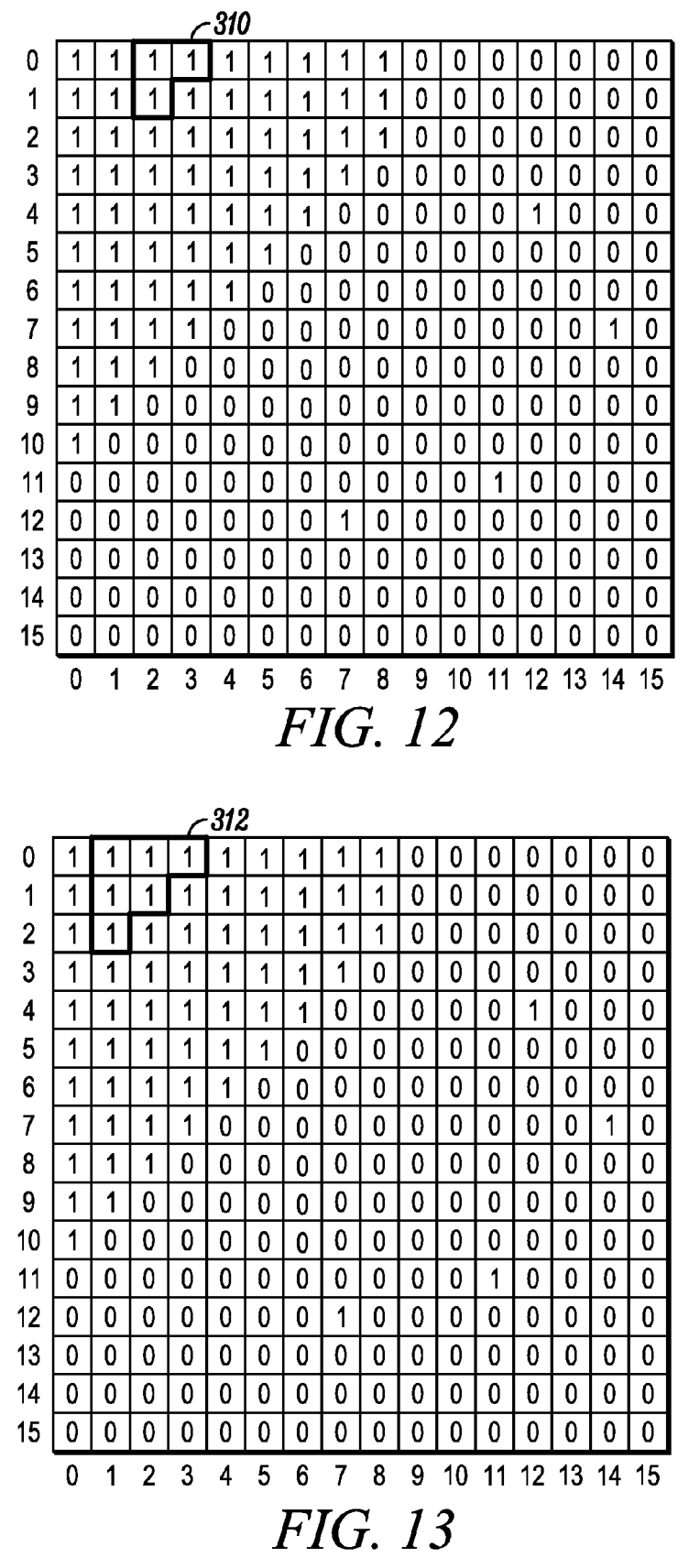

| Parallel processing | Coordinates (y,x) of element being decoded | Elements used to determine context model for decoding the element | Figure | Ref. # | Rules applied |
|---|---|---|---|---|---|
| Processed in parallel | (1,1) | (0,0) (0,1) (1,0) | FIG. 8 | 300 | A |
|  | (2,0) | (0,0) (0,1) (1,0) | FIG. 8 | 300 | A |
| Processed in parallel | (0,3) | (0,1) (0,2) (1,1) | FIG. 9 | 302 | B |
|  | (1,2) | (0,0) (0,1) (1,0) (0,2) (1,1) (2,0) | FIG. 10 | 306 | D, E, F |
| Processed in parallel | (2,1) | (0,0) (0,1) (1,0) (0,2) (1,1) (2,0) | FIG. 10 | 306 | D, G, H |
|  | (3,0) | (1,0) (1,1) (2,0) | FIG. 11 | 308 | C |
| Processed in parallel | (0,4) | (0,2) (0,3) (1,2) | FIG. 12 | 310 | B |
|  | (1,3) | (0,1) (0,2) (1,1) (0,3) (1,2) (2,1) | FIG. 13 | 312 | D, E, F |
| Processed in parallel | (2,2) | (0,1) (1,0) (0,2) (1,1) (2,0) (0,3) (1,2) (2,1) (3,0) | FIG. 14 | 314 | D, E, F, G, H |
|  | (3,1) | (1,0) (1,1) (2,0) (1,2) (2,1) (3,0) | FIG. 15 | 316 | D, G, H |

Figure 7B:
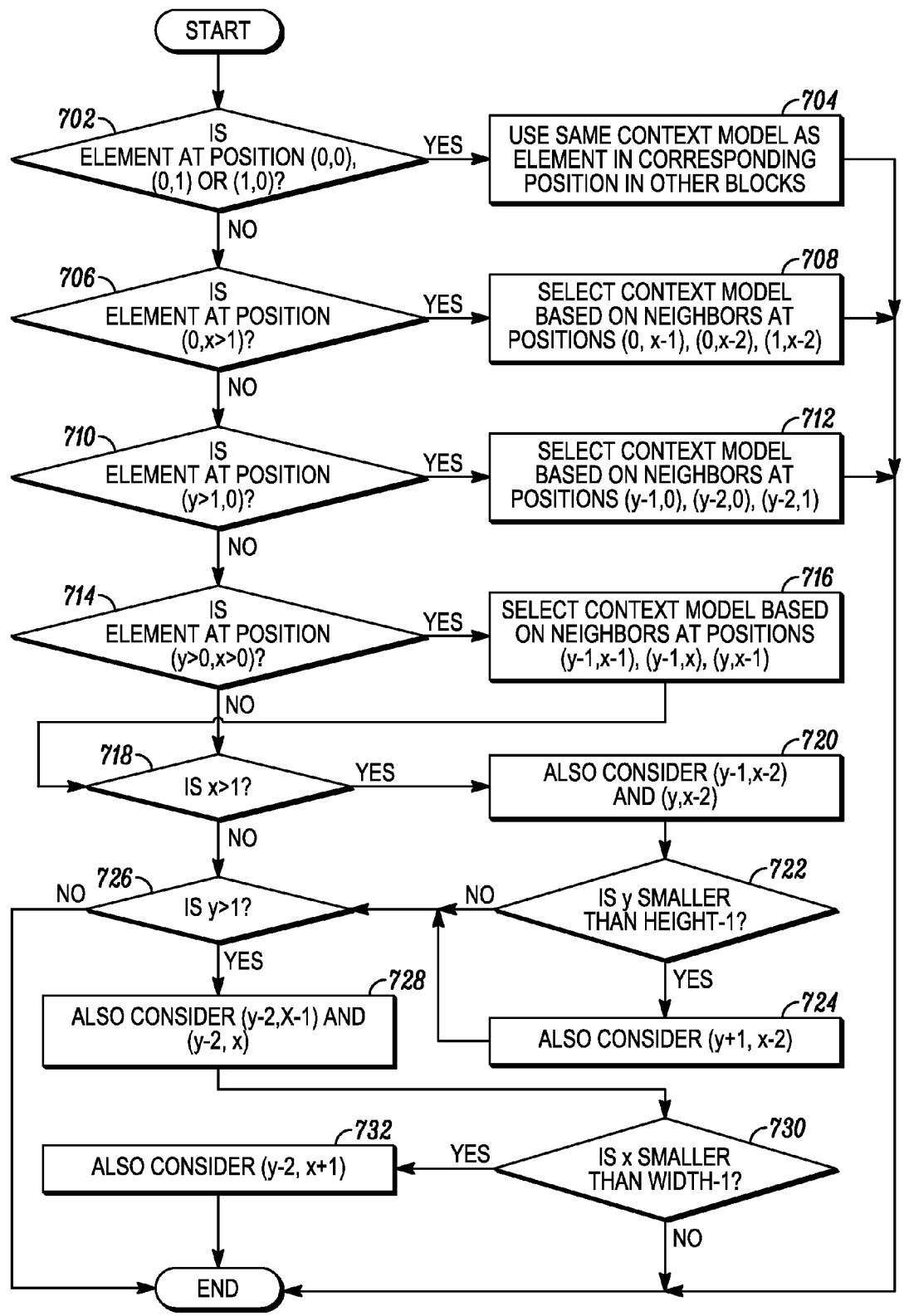

FIGS. 7A and 7B and their accompanying description above illustrate an example of how a significance map can be encoded or decoded by choosing context models that do not rely on elements that are in the same line of scanning. There are, however, many other possible ways of encoding and decoding a significance map according to other embodiments of the invention. The following examples 1 through 18 illustrate some of these other ways.

Example 1

Figure 16:
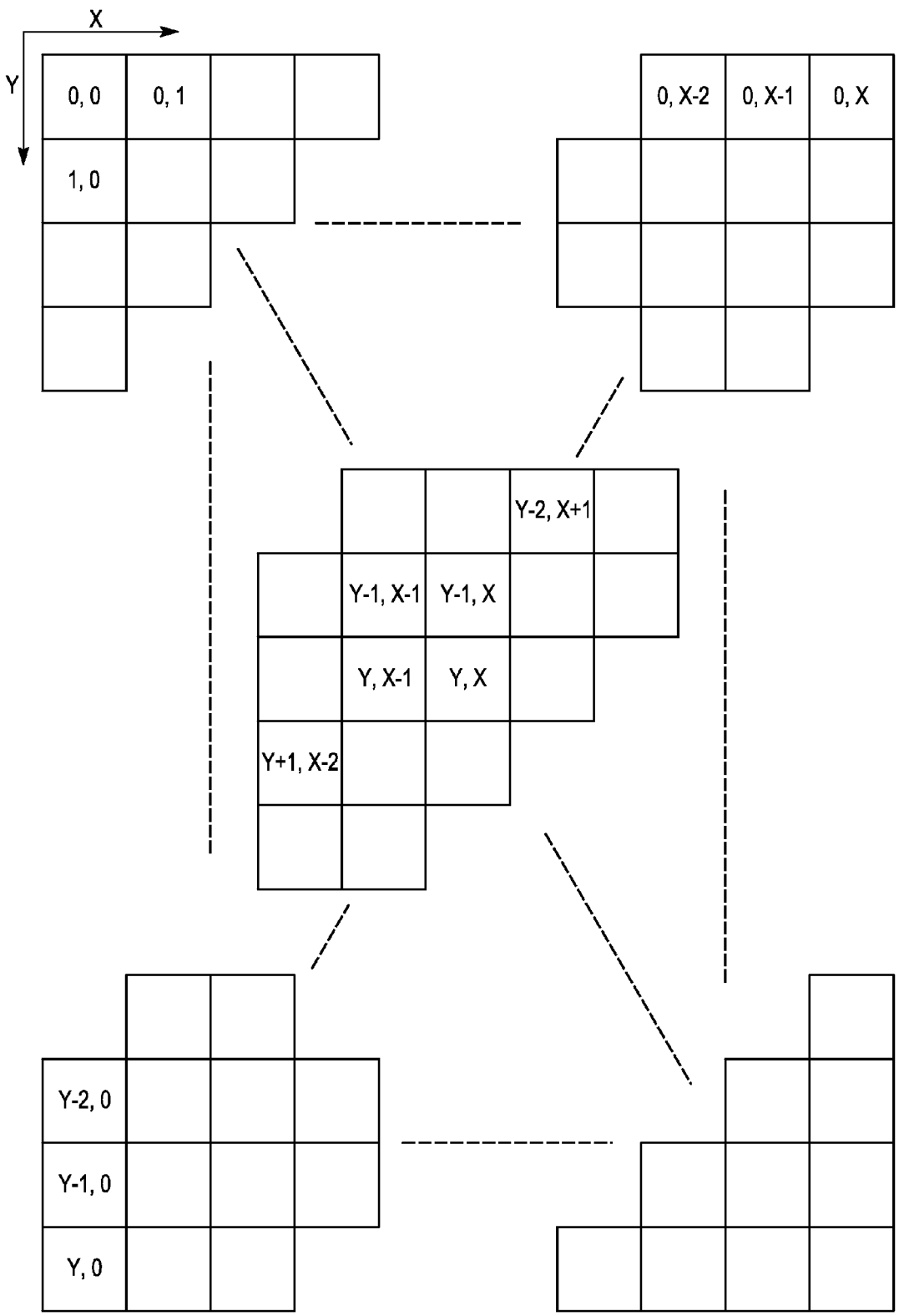
FIGS. 16-51 illustrate alternative embodiments of the invention.

This example shows the context model selection for the zigzag scan pattern utilizing up to 5 coded neighbors. Specifically, given a significance map (FIG. 16) of height by width, the context model for an element in the significance map is determined as follows.

For an element at position (0, 0), (0, 1) or (1, 0) a unique context model is assigned. That is, an element at position (0, 0), (0, 1) or (1, 0) in a current block will share the same context model with other elements in other blocks at the same position (0, 0), (0, 1) or (1, 0) (Steps 1700 and 1702 of FIG. 17).

Figure 17:
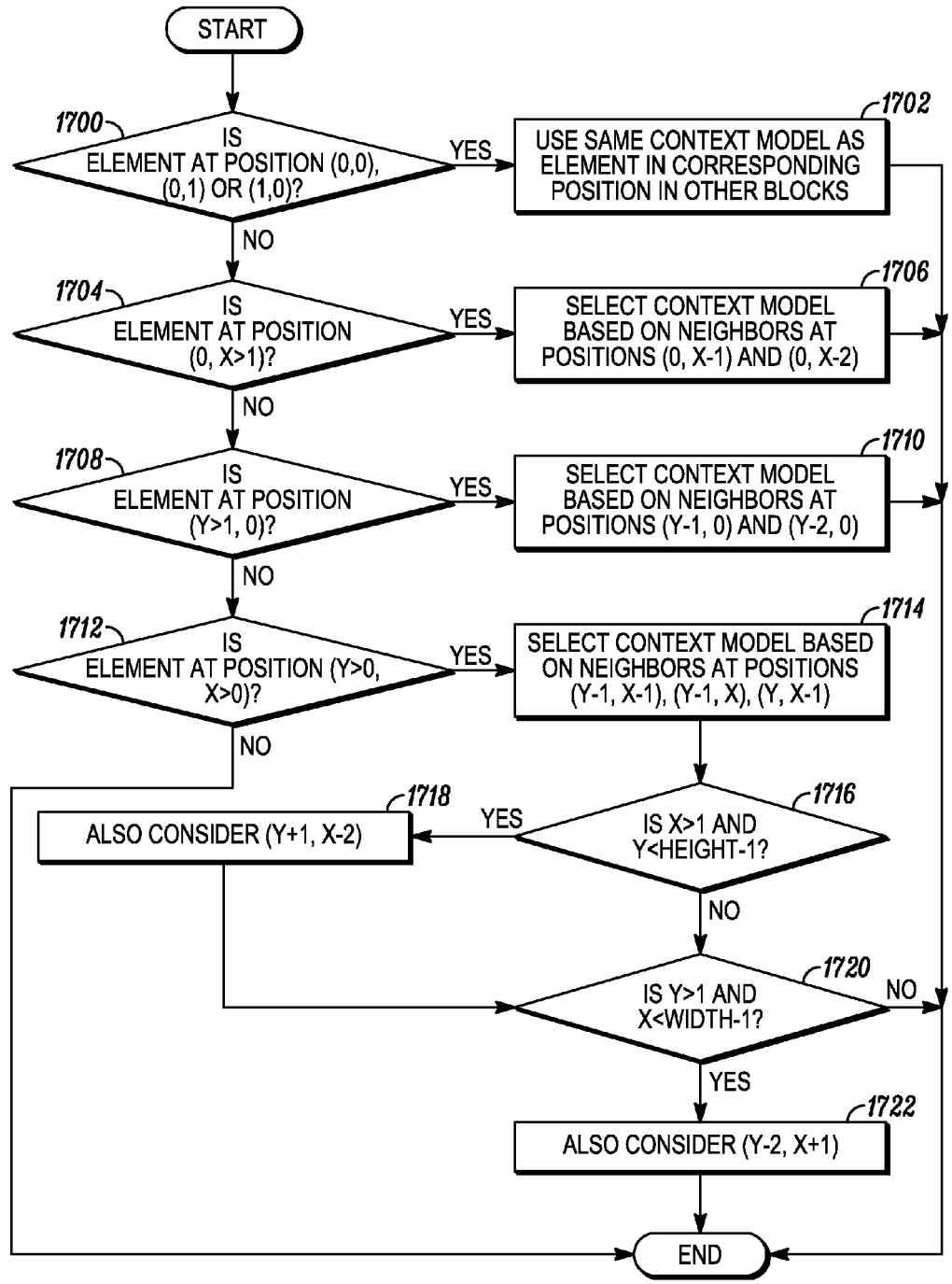

For an element at position (0, x>1), the context model is selected based on the values (0 or 1) of the element's neighbors at positions (0, x−1) and (0, x−2) (Steps 1704 and 1706 of FIG. 17).

For an element at position (y>1, 0), the context model is selected based on the values (0 or 1) of the element's neighbors at positions (y−1, 0) and (y−2, 0) (Steps 1708 and 1710 of FIG. 17).

For an element at position (y>0, x>0), the context model is selected based on the value (0 or 1) of the element's neighbors at positions (y−1, x−1) and (y−1, x) and (y, x−1) (Steps 1712 and 1714 of FIG. 17), and (y+1, x−2) if x is larger than 1 and y is smaller than height−1 (Steps 1716 and 1718 of FIG. 17), and (y−2, x+1) if y is larger than 1 and x is smaller than width−1 (Steps 1720 and 1722 of FIG. 17).

By using the scheme provided in this example, only the coefficients in two neighboring scanning lines need to be stored.

Example 2

Figure 18:
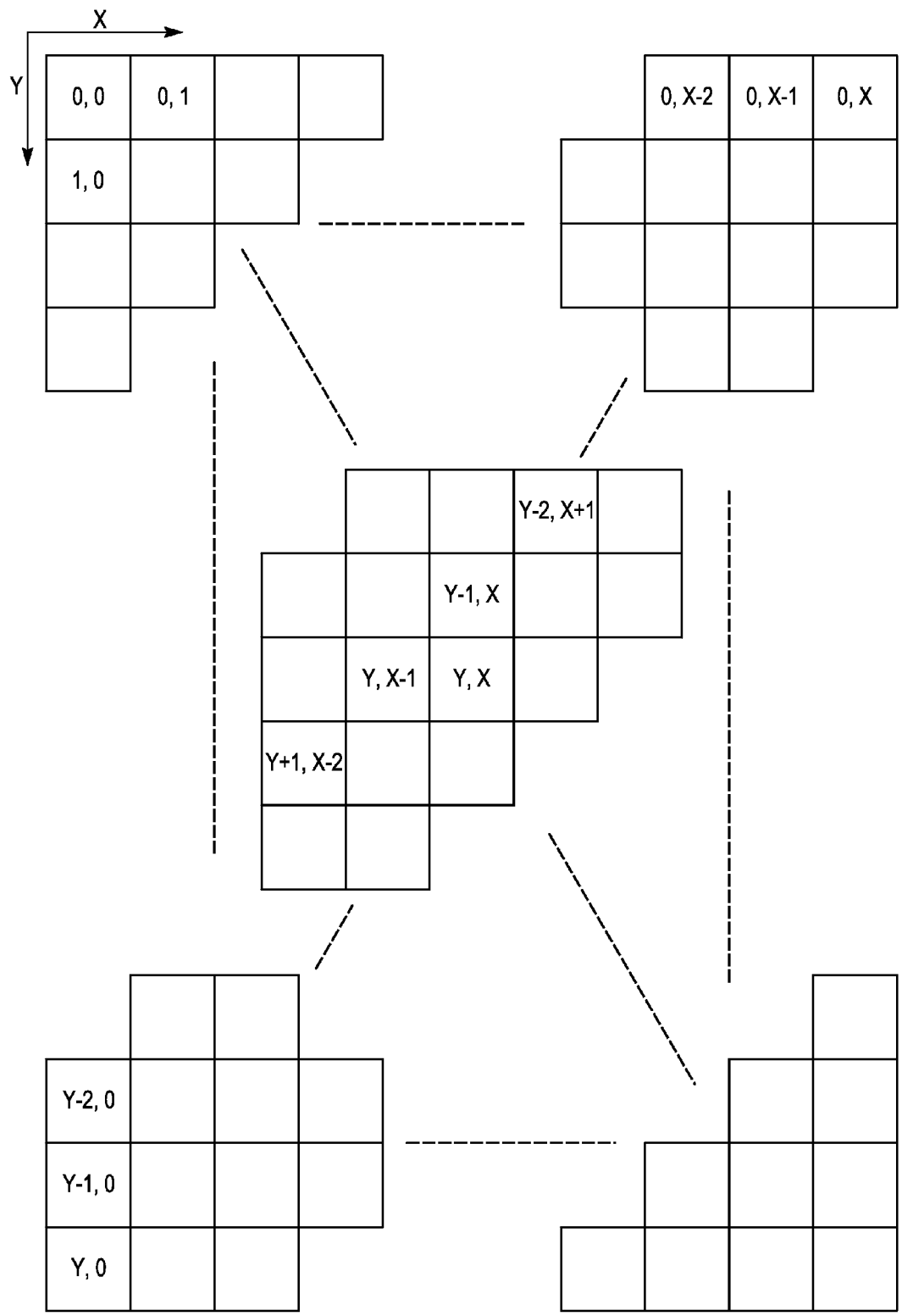

This example shows the context model selection for the zigzag scan pattern utilizing up to 4 coded neighbors. Specifically, given a significance map (FIG. 18) of height by width, the context model for an element in the significance map is determined as follows.

For an element at position (0, 0), (0, 1) or (1, 0), a unique context model is assigned. That is, an element at position (0, 0), (0, 1) or (1, 0) in a current block will share the same context model with other elements in other blocks at the same position (0, 0), (0, 1) or (1, 0) (Steps 1900 and 1902 of FIG. 19).

Figure 19:
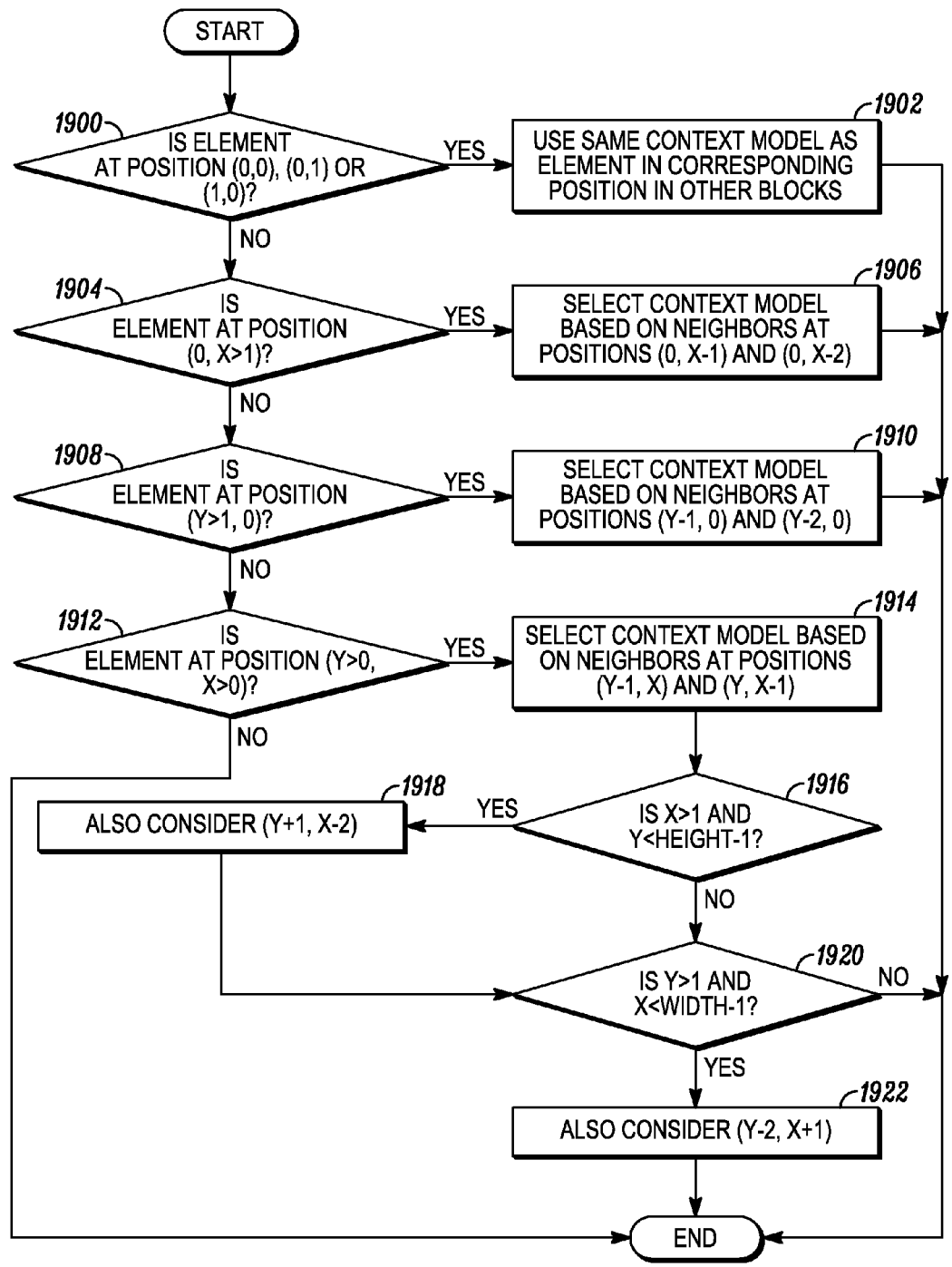

For an element at position (0, x>1), the context model is selected based on the values (0 or 1) of the element's neighbors at positions (0, x−1) and (0, x−2) (Steps 1904 and 1906 of FIG. 19).

For an element at position (y>1, 0), the context model is selected based on the values (0 or 1) of the element's neighbors at positions (y−1, 0) and (y−2, 0) (Steps 1908 and 1910 of FIG. 19).

For an element at position (y>0, x>0), the context model is selected based on the value (0 or 1) of the element's neighbors at positions (y−1, x) and (y, x−1) (Steps 1912 and 1914 of FIG. 19), and (y+1, x−2) if x is larger than 1 and y is smaller than height−1 (Steps 1916 and 1918 of FIG. 19), and (y−2, x+1) if y is larger than 1 and x is smaller than width−1 (Steps 1920 and 1922 of FIG. 19).

By using the scheme provided in this example, only the coefficients in one neighboring scanning line need to be stored.

Example 3

Figure 20:
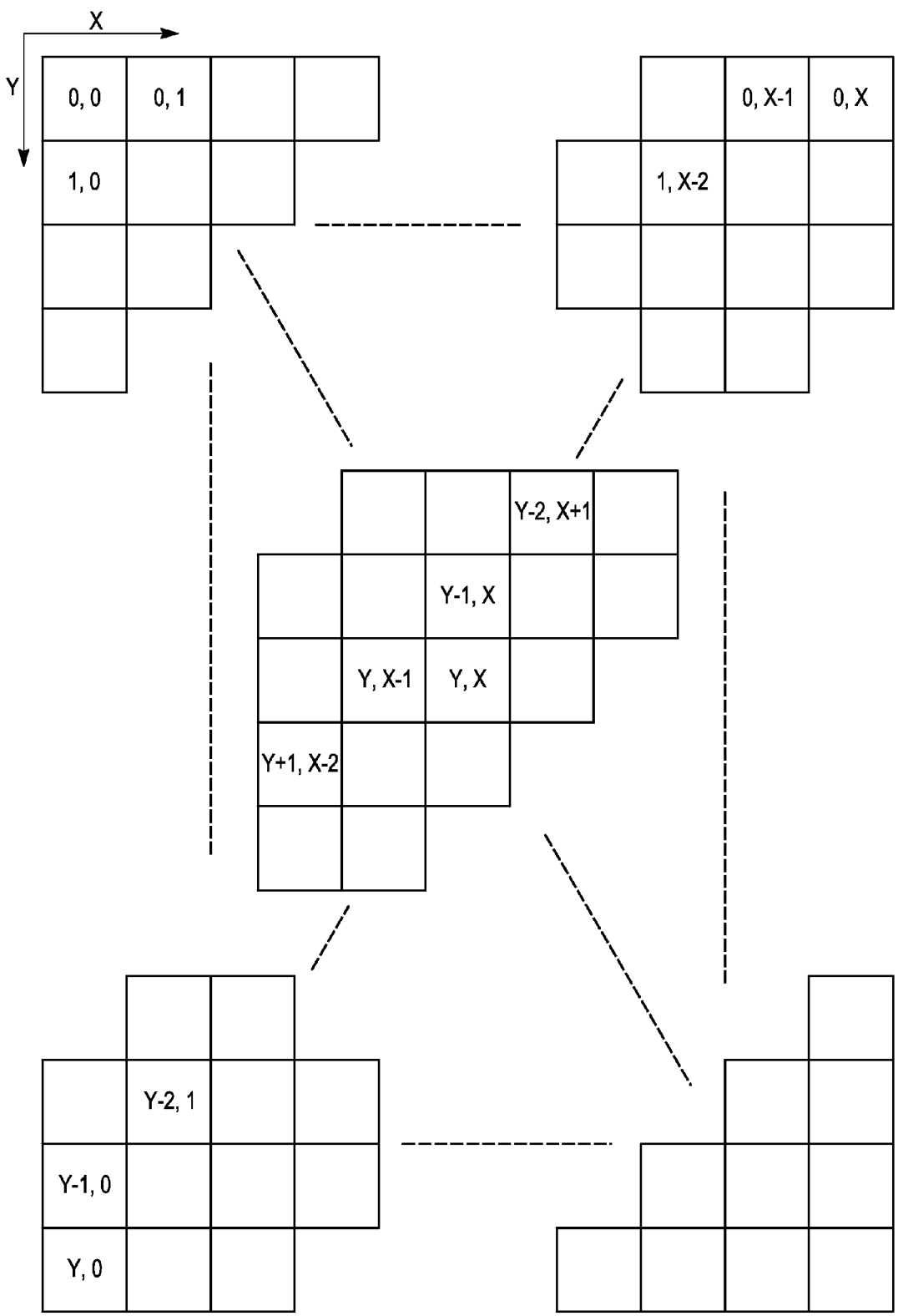

This example shows the context model selection for the zigzag scan pattern utilizing up to 4 coded neighbors. Specifically, given a significance map (FIG. 20) of height by width, the context model for an element in the significance map is determined as follows.

For an element at position (0, 0), (0, 1) or (1, 0), a unique context model is assigned. That is, an element at position (0, 0), (0, 1) or (1, 0) in a current block will share the same context model with other elements in other blocks at the same position (0, 0), (0, 1) or (1, 0) (Steps 2100 and 2102 of FIG. 21).

Figure 21:
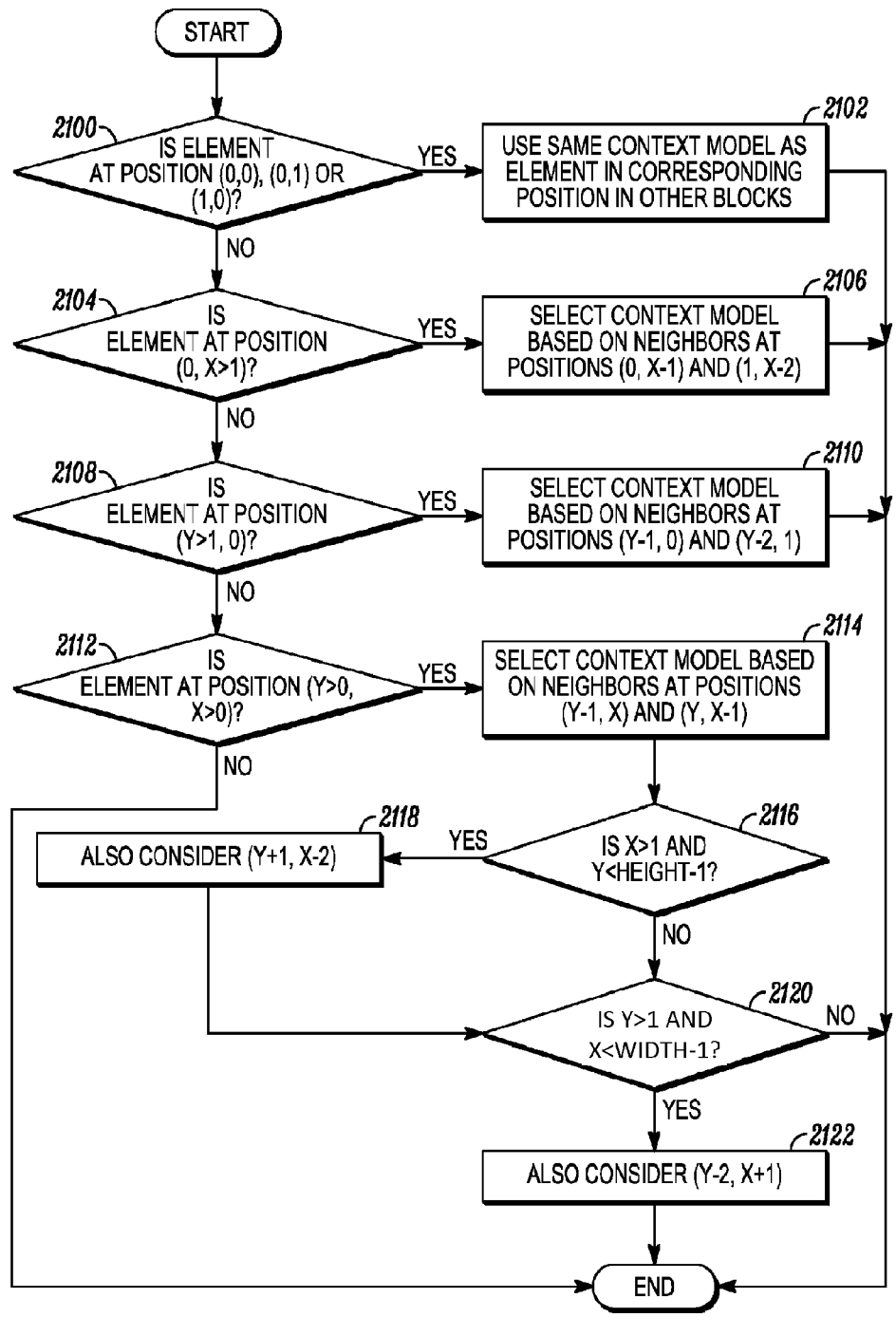

For an element at position (0, x>1), the context model is selected based on the values (0 or 1) of the element's neighbors at positions (0, x−1) and (1, x−2) (Steps 2104 and 2106 of FIG. 21).

For an element at position (y>1, 0), the context model is selected based on the values (0 or 1) of the element's neighbors at positions (y−1, 0) and (y−2, 1) (Steps 2108 and 2110 of FIG. 21).

For an element at position (y>0, x>0), the context model is selected based on the value (0 or 1) of the element's neighbors at positions (y−1, x) and (y, x−1) (Steps 2112 and 2114 of FIG. 21), and (y+1, x−2) if x is larger than 1 and y is smaller than height−1 (Steps 2116 and 2118 of FIG. 21), and (y−2, x+1) if y is larger than 1 and x is smaller than width−1 (Steps 2120 and 2122 of FIG. 21).

By using the scheme provided in this example, only the coefficients in one neighboring scanning line need to be stored.

Example 4

Figure 22:
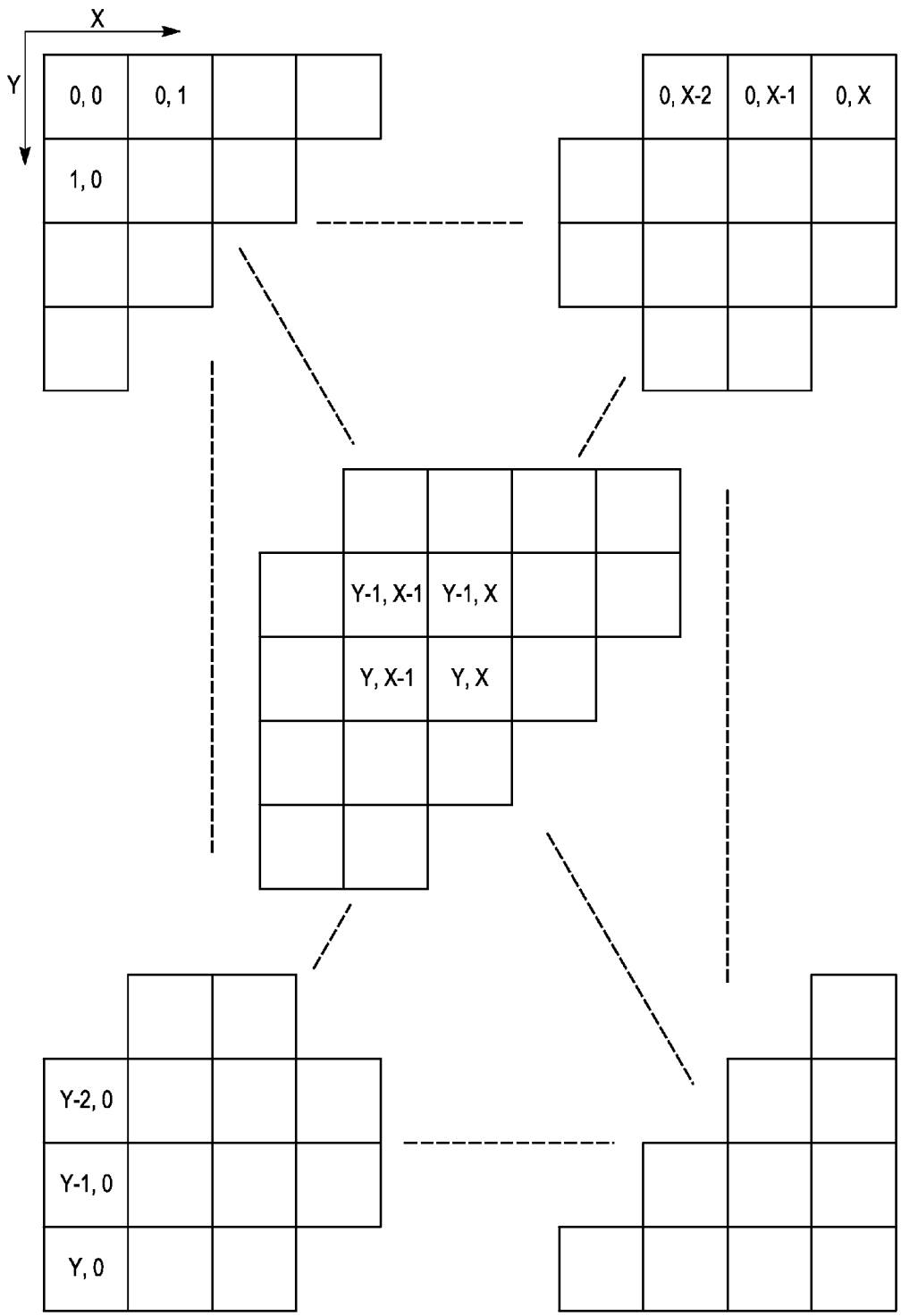

This example shows the context model selection for the zigzag scan pattern utilizing up to 3 coded neighbors. Specifically, given a significance map (FIG. 22) of height by width, the context model for an element in the significance map is determined as follows.

For an element at position (0, 0), (0, 1) or (1, 0), a unique context model is assigned. That is, an element at position (0, 0), (0, 1) or (1, 0) in a current block will share the same context model with other elements in other blocks at the same position (0, 0), (0, 1) or (1, 0) (Steps 2300 and 2302 of FIG. 23).

Figure 23:
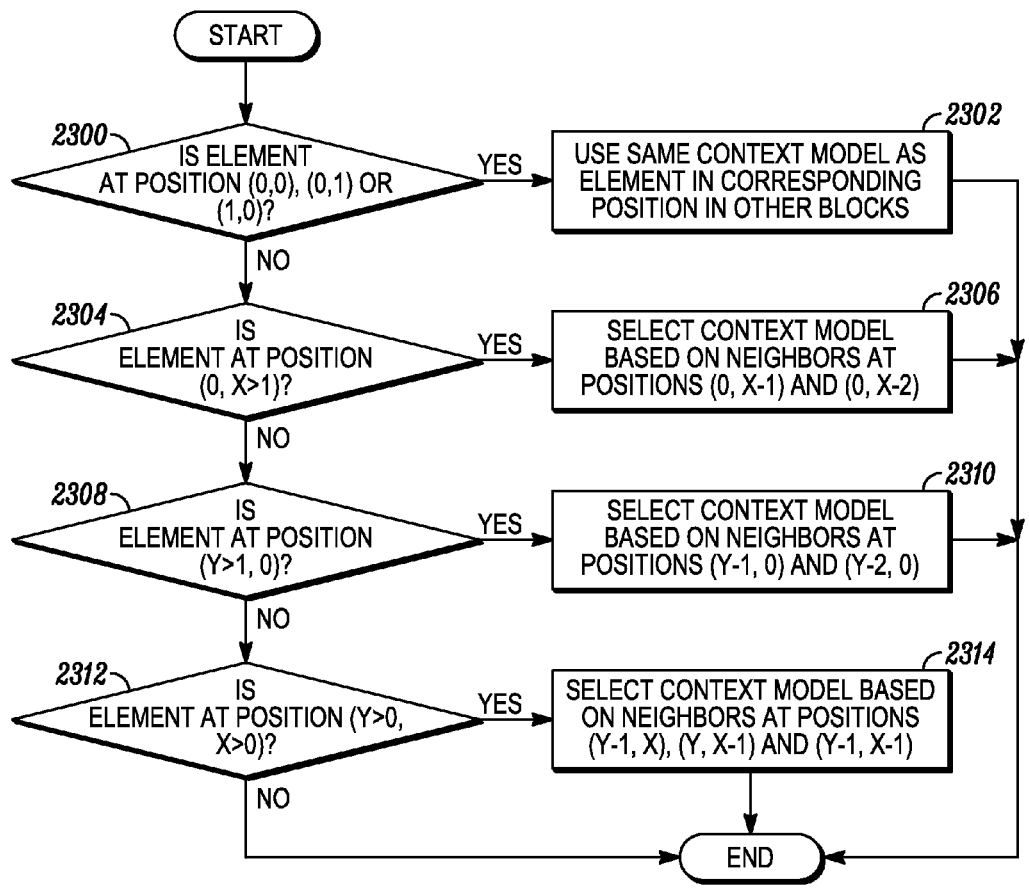

For an element at position (0, x>1), the context model is selected based on the values (0 or 1) of the element's neighbors at positions (0, x−1) and (0, x−2) (Steps 2304 and 2306 of FIG. 23).

For an element at position (y>1, 0), the context model is selected based on the values (0 or 1) of the element's neighbors at positions (y−1, 0) and (y−2, 0) (Steps 2308 and 2310 of FIG. 23).

For an element at position (y>0, x>0), the context model is selected based on the value (0 or 1) of the element's neighbors at positions (y−1, x), (y, x−1) and (y−1, x−1) (Steps 2312 and 2314 of FIG. 23).

By using the scheme provided in this example, only the coefficients in two neighboring scanning lines need to be stored.

Example 5

Figure 24:
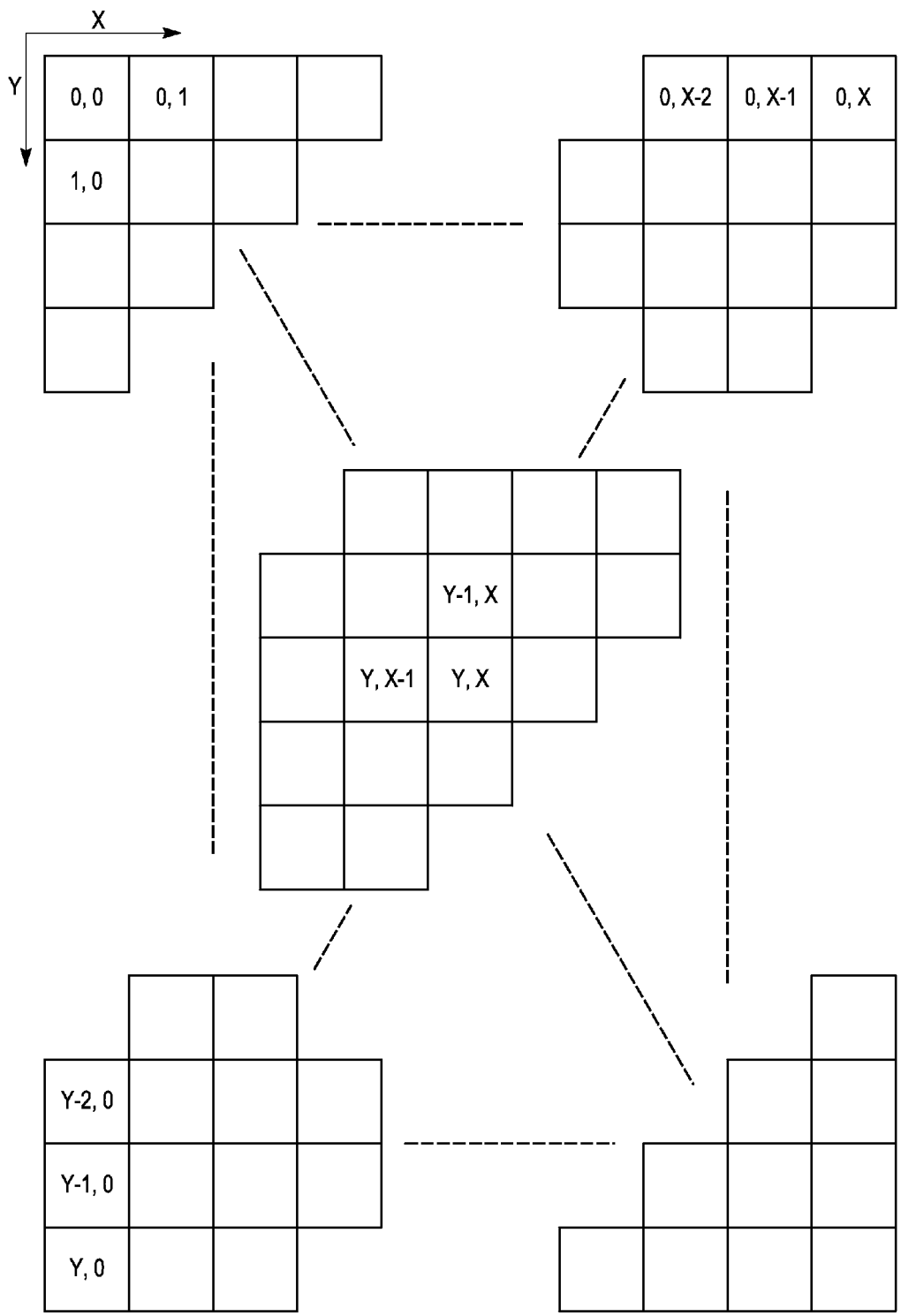

This example shows the context model selection for the zigzag scan pattern utilizing up to 2 coded neighbors. Specifically, given a significance map (FIG. 24) of height by width, the context model for an element in the significance map is determined as follows.

For an element at position (0, 0), (0, 1) or (1, 0), a unique context model is assigned. That is, an element at position (0, 0), (0, 1) or (1, 0) in a current block will share the same context model with other elements in other blocks at the same position (0, 0), (0, 1) or (1, 0) (Steps 2500 and 2502 of FIG. 25).

Figure 25:
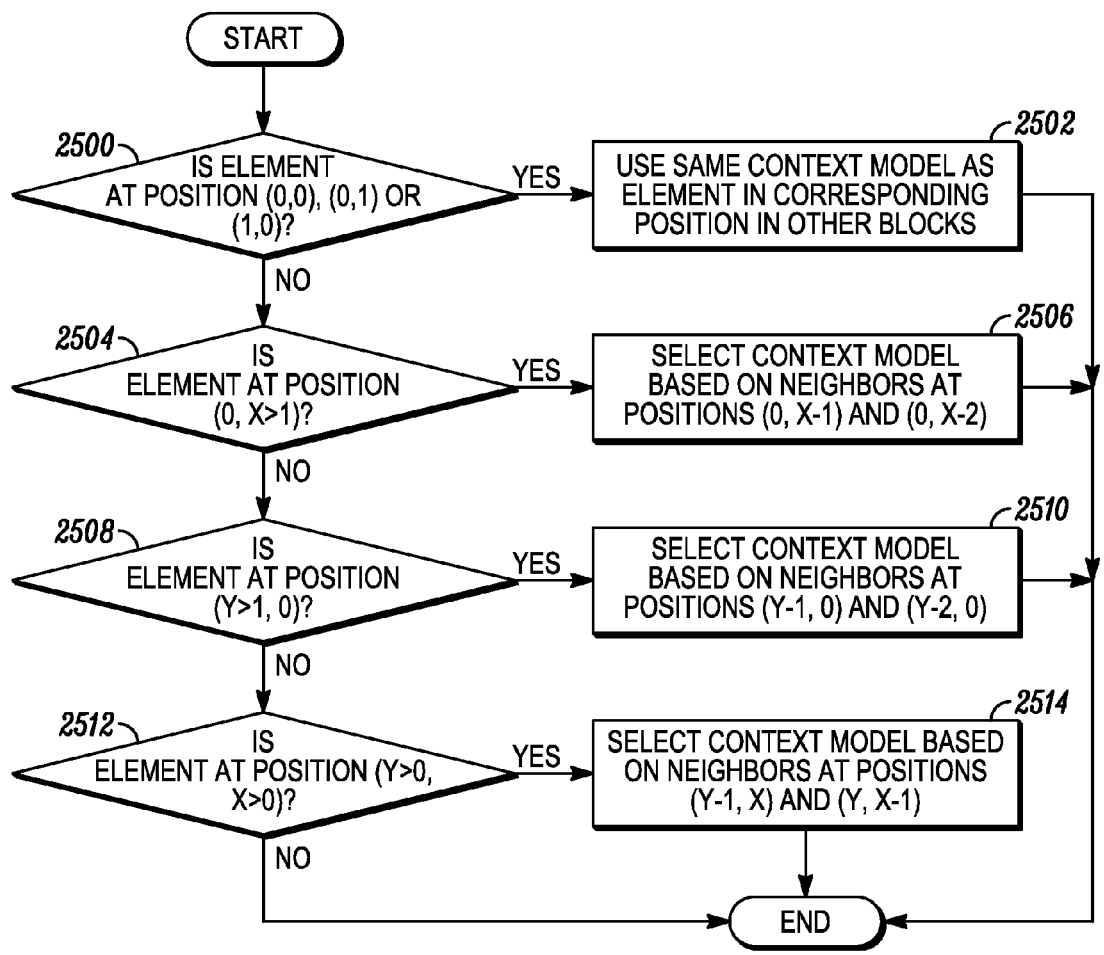

For an element at position (0, x>1), the context model is selected based on the values (0 or 1) of the element's neighbors at positions (0, x−1) and (0, x−2) (Steps 2504 and 2506 of FIG. 25).

For an element at position (y>1, 0), the context model is selected based on the values (0 or 1) of the element's neighbors at positions (y−1, 0) and (y−2, 0) (Steps 2508 and 2510 of FIG. 25).

For an element at position (y>0, x>0), the context model is selected based on the value (0 or 1) of the element's neighbors at positions (y−1, x) and (y, x−1) (Steps 2512 and 2514 of FIG. 25).

By using the scheme provided in this example, only the coefficients in one neighboring scanning line need to be stored.

Example 6

Figure 26:
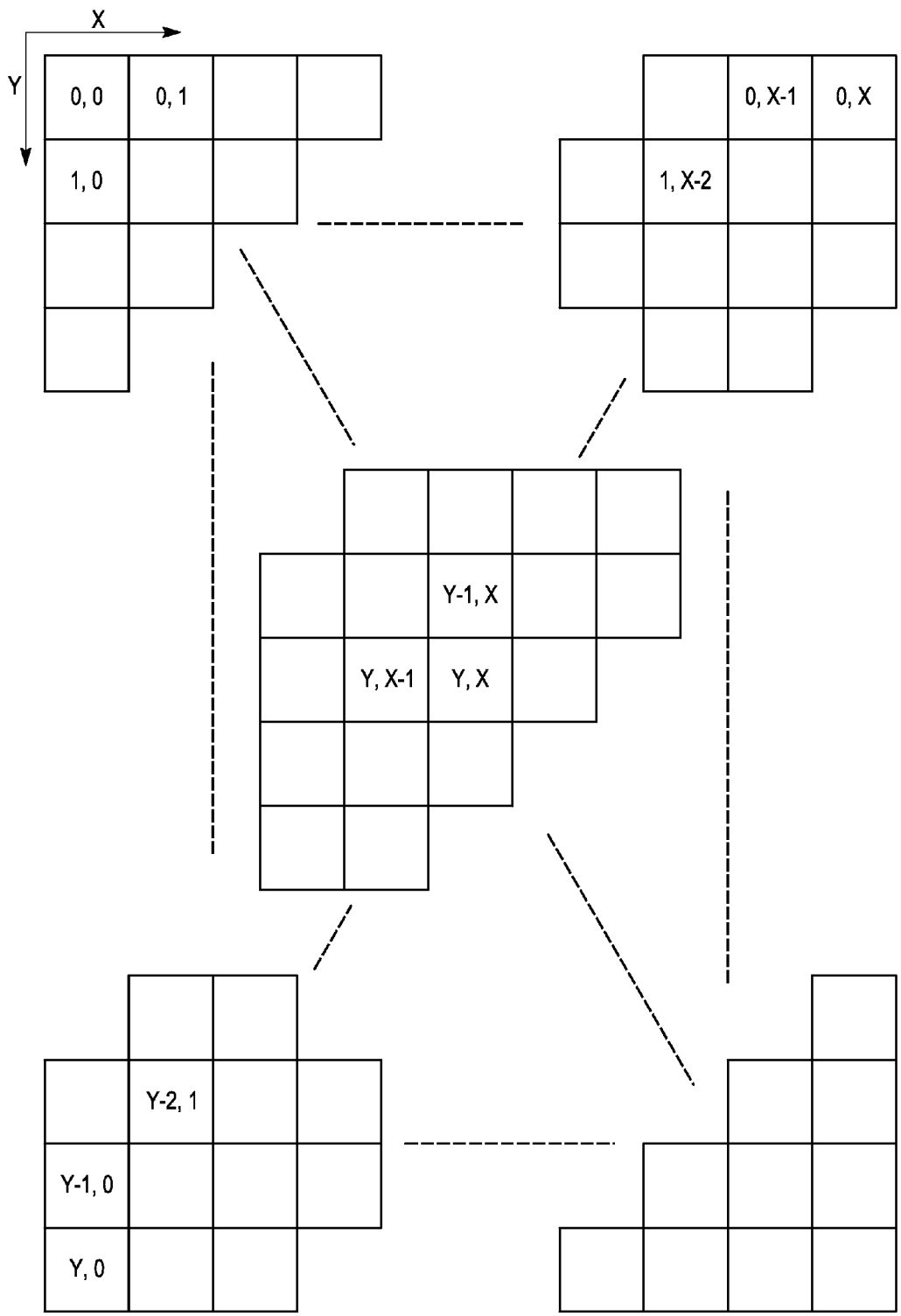

This example shows the context model selection for the zigzag scan pattern utilizing up to 2 coded neighbors. Specifically, given a significance map (FIG. 26) of height by width, the context model for an element in the significance map is determined as follows.

For an element at position (0, 0), (0, 1) or (1, 0), a unique context model is assigned. That is, an element at position (0, 0), (0, 1) or (1, 0) in a current block will share the same context model with other elements in other blocks at the same position (0, 0), (0, 1) or (1, 0) (Steps 2700 and 2702 of FIG. 27).

Figure 27:
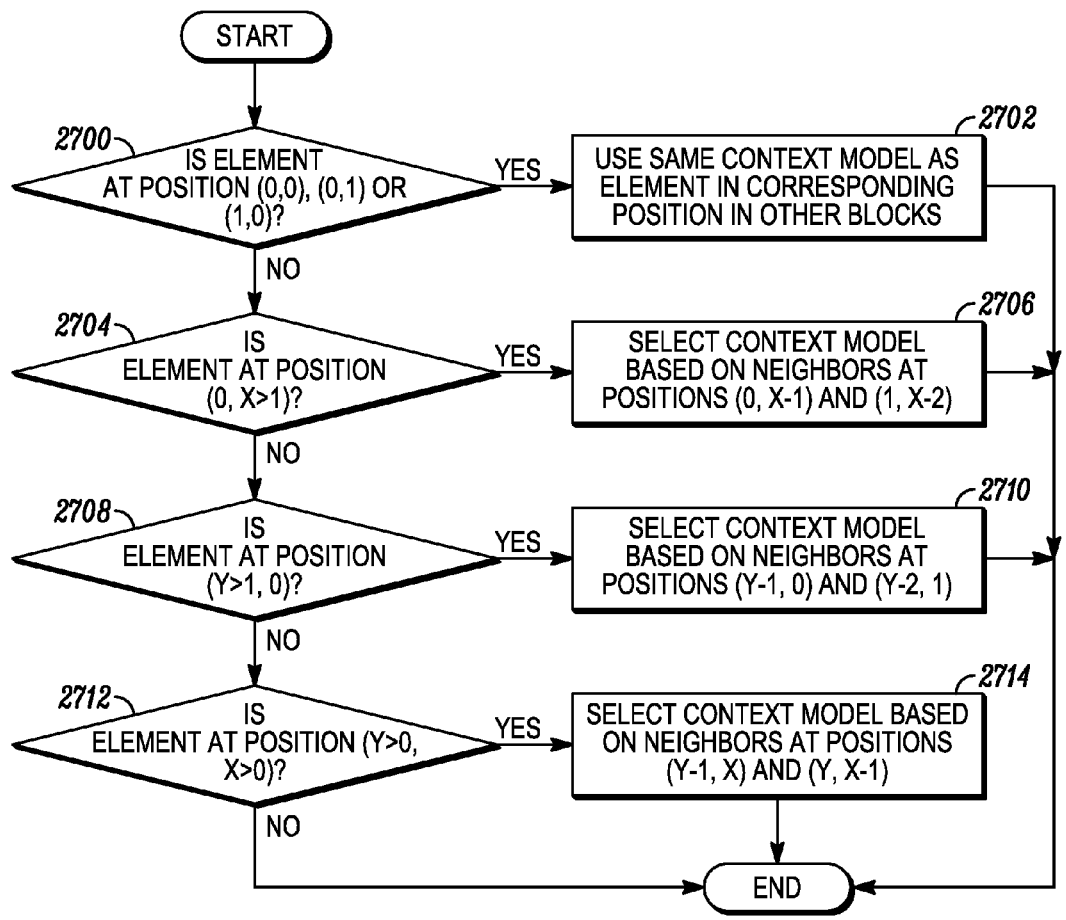

For an element at position (0, x>1), the context model is selected based on the values (0 or 1) of the element's neighbors at positions (0, x−1) and (1, x−2) (Steps 2704 and 2706 of FIG. 27).

For an element at position (y>1, 0), the context model is selected based on the values (0 or 1) of the element's neighbors at positions (y−1, 0) and (y−2, 1) (Steps 2708 and 2710 of FIG. 27).

For an element at position (y>0, x>0), the context model is selected based on the value (0 or 1) of the element's neighbors at positions (y−1, x) and (y, x−1) (Steps 2712 and 2714 of FIG. 27).

By using the scheme provided in this example, only the coefficients in one neighboring scanning line need to be stored.

Example 7

Figure 28:
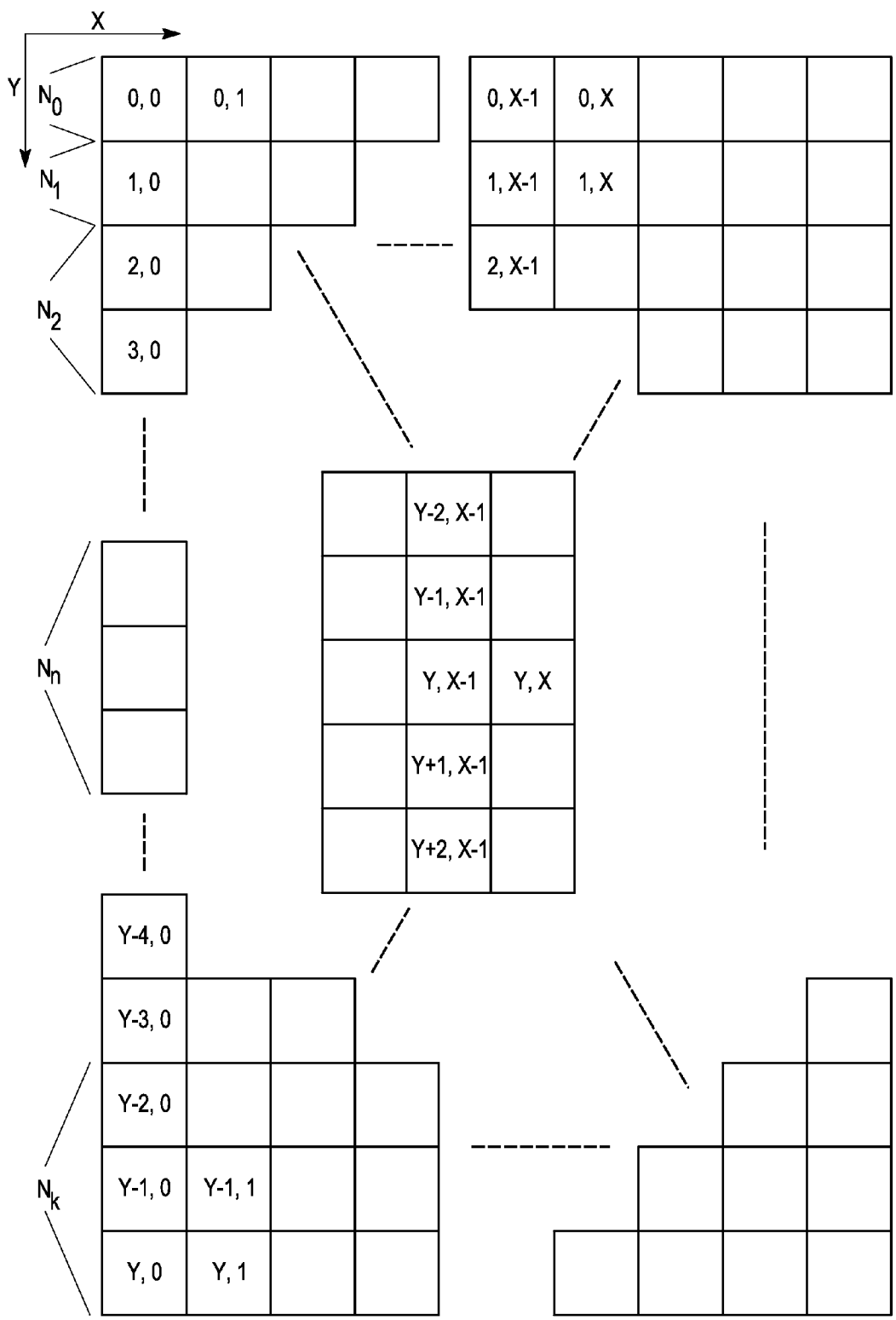

This example shows the context model selection for the vertical scan pattern utilizing up to 5 coded neighbors. Specifically, given a significance map (FIG. 28) of height by width, the context model for an element in the significance map is determined as follows.

For an element at position (y, 0) or (0, 1), a unique or combined context model is assigned. That is, an element at position (y, 0), or (0, 1) in a current block will share the same context model with other elements in other blocks at the same position (y, 0), or (0, 1), n elements could be combined to share the same context while $0 < N_0, N_1, \ldots N_k <$ height and sum$(N_0, N_1, \ldots N_k) =$ height (Steps 2900 and 2902 of FIG. 29).

Figure 29:
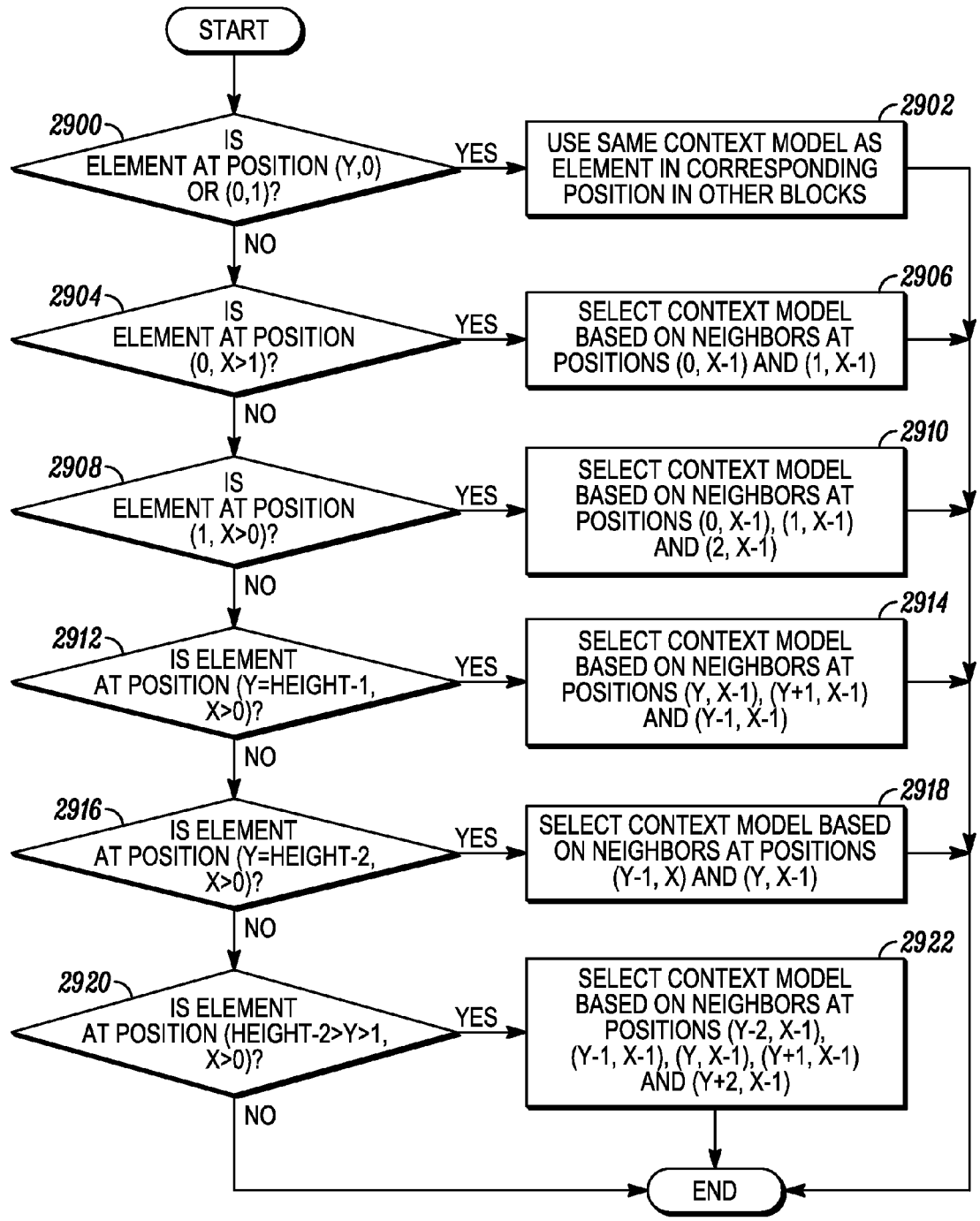

For an element at position (0, x>1), the context model is selected based on the values (0 or 1) of the element's neighbors at positions (0, x−1) and (1, x−1) (Steps 2904 and 2906 of FIG. 29).

For an element at position (1, x>0), the context model is selected based on the values (0 or 1) of the element's neighbors at positions (0, x−1), (1, x−1) and (2, x−1) (Steps 2908 and 2910 of FIG. 29).

For an element at position (y=height−1, x>0), the context model is selected based on the values (0 or 1) of the element's neighbors at positions (y, x−1) and (y−1, x−1) (Steps 2912 and 2914 of FIG. 29).

For an element at position (y=height−2, x>0), the context model is selected based on the values (0 or 1) of the element's neighbors at positions (y, x−1) and (y+1, x−1), (y−1, x−1) (Steps 2916 and 2918 of FIG. 29).

For an element at position (height−2>y>1, x>0), the context model is selected based on the value (0 or 1) of the element's neighbors at positions (y−2, x−1), (y−1, x−1), (y, x−1), (y+1, x−1) and (y+2, x−1) (Steps 2920 and 2922 of FIG. 29).

By using the scheme provided in this example, only the coefficients in one neighboring scanning line need to be stored.

Example 8

Figure 30:
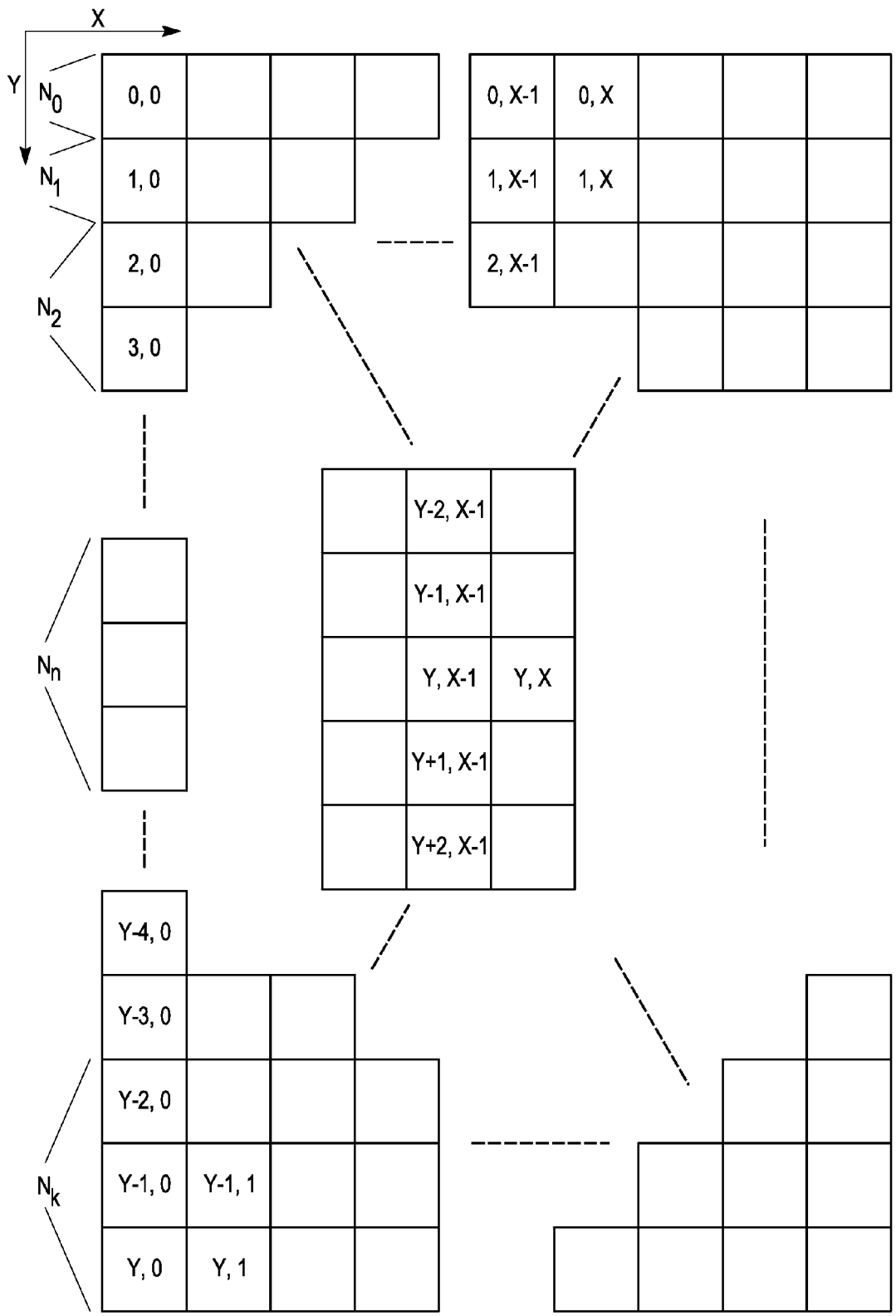

This example shows the context model selection for the vertical scan pattern utilizing up to 5 coded neighbors. Specifically, given a significance map (FIG. 30) of height by width, the context model for an element in the significance map is determined as follows.

For an element at position (y, 0), a unique or combined context model is assigned. That is, an element at position (y, 0) in a current block will share the same context model with other elements in other blocks at the same position (y, 0), n elements could be combined to share the same context while $0 < N_0, N_1, \ldots N_k <$ height and sum$(N_0, N_1, \ldots N_k) =$ height (Steps 3100 and 3102 of FIG. 31).

Figure 31:
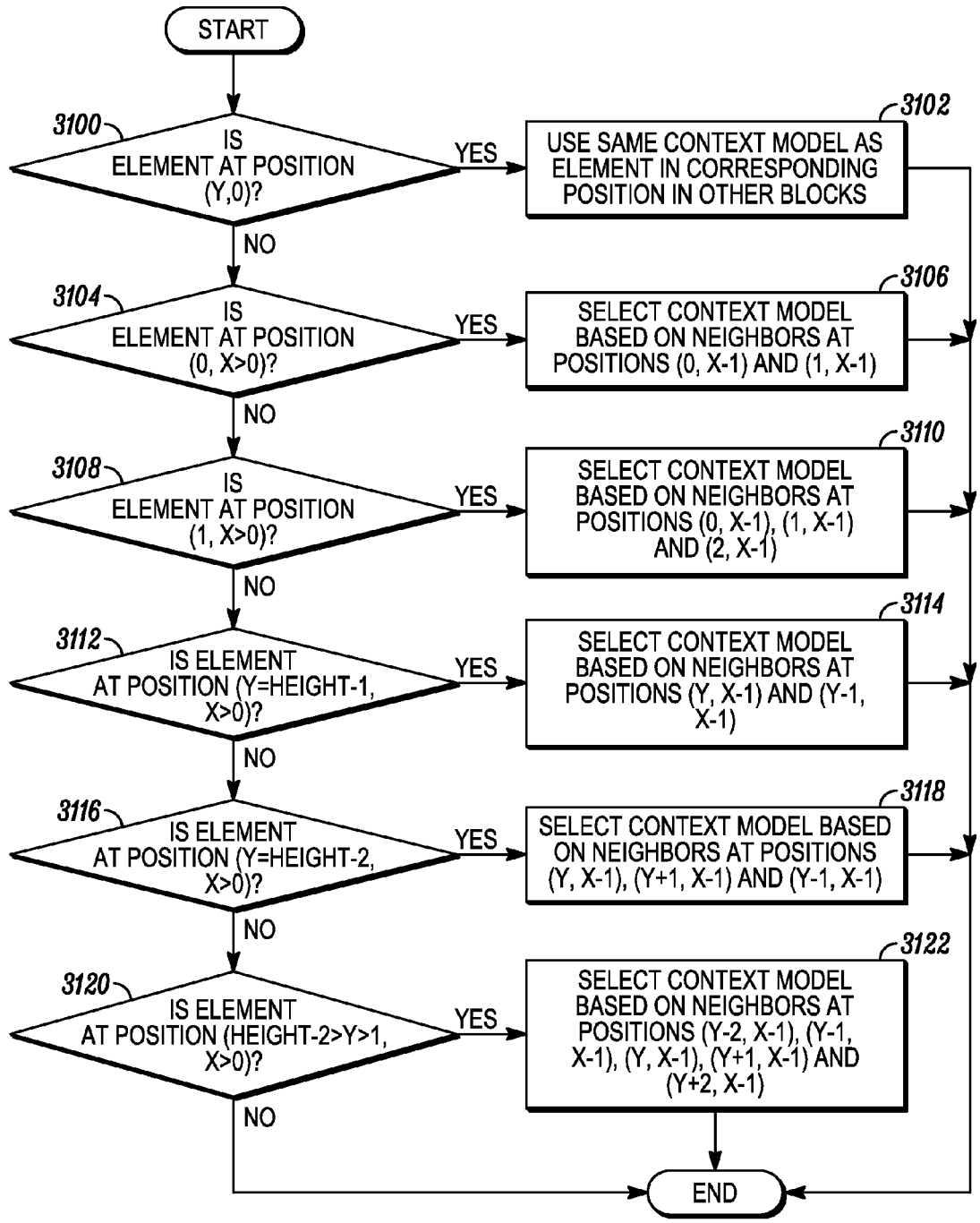

For an element at position (0, x>0), the context model is selected based on the values (0 or 1) of the element's neighbors at positions (0, x−1) and (1, x−1) (Steps 3104 and 3106 of FIG. 31).

For an element at position (1, x>0), the context model is selected based on the values (0 or 1) of the element's neighbors at positions (0, x−1), (1, x−1) and (2, x−1) (Steps 3108 and 3110 of FIG. 31).

For an element at position (y=height−1, x>0), the context model is selected based on the values (0 or 1) of the element's neighbors at positions (y, x−1) and (y−1, x−1) (Steps 3112 and 3114 of FIG. 31).

For an element at position (y=height−2, x>0), the context model is selected based on the values (0 or 1) of the element's neighbors at positions (y, x−1), (y+1, x−1) and (y−1, x−1) (Steps 3116 and 3118 of FIG. 31).

For an element at position (height−2>y>1, x>0), the context model is selected based on the value (0 or 1) of the element's neighbors at positions (y−2, x−1), (y−1, x−1), (y, x−1), (y+1, x−1) and (y+2, x−1) (Steps 3120 and 3122 of FIG. 31).

By using the scheme provided in this example, only the coefficients in one neighboring scanning line need to be stored and using position as the context only applies on the first column, which simplifies the algorithm.

Example 9

Figure 32:
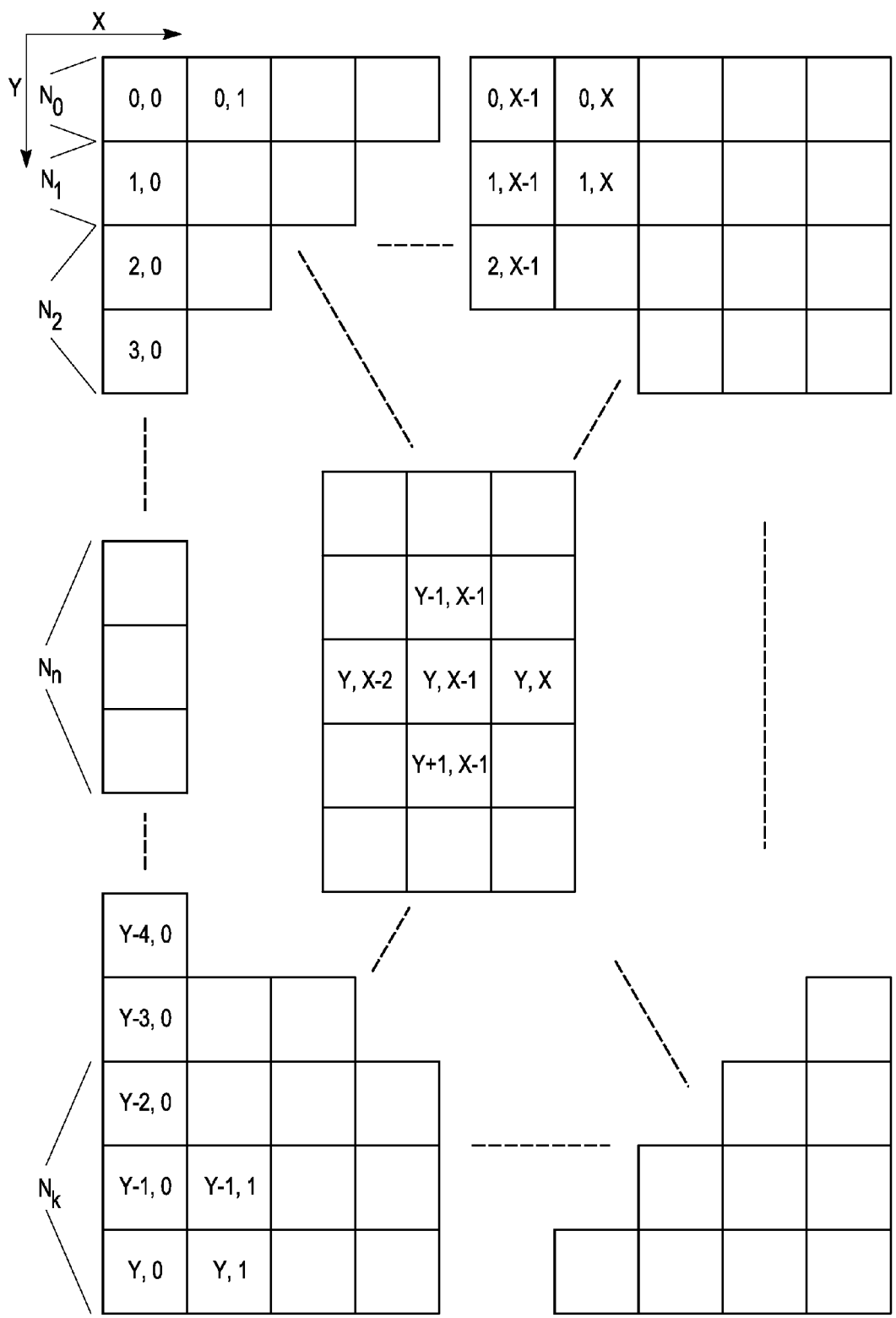

This example shows the context model selection for the vertical scan pattern utilizing up to 4 coded neighbors. Specifically, given a significance map (FIG. 32) of height by width, the context model for an element in the significance map is determined as follows.

For an element at position (y, 0) or (0, 1), a unique or combined context model is assigned. That is, an element at position (y, 0), or (0, 1) in a current block will share the same context model with other elements in other blocks at the same position (y, 0), or (0, 1), n elements could be combined to share the same context while $0 < N_0, N_1, \ldots N_k <$ height and sum$(N_0, N_1, \ldots N_k) =$ height (Steps 3300 and 3302 of FIG. 33).

Figure 33:
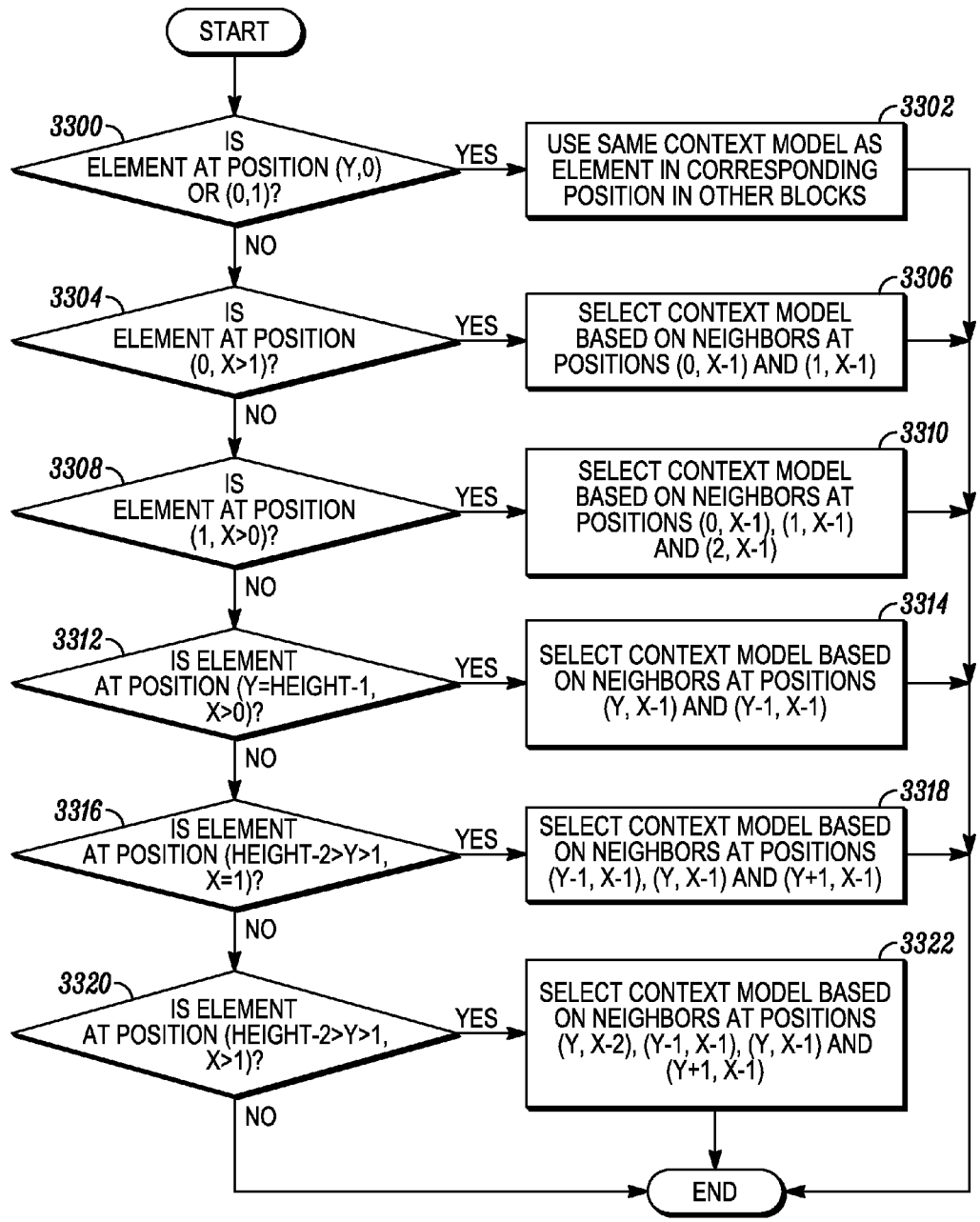

For an element at position (0, x>1), the context model is selected based on the values (0 or 1) of the element's neighbors at positions (0, x−1) and (1, x−1) (Steps 3304 and 3306 of FIG. 33).

For an element at position (1, x>0), the context model is selected based on the values (0 or 1) of the element's neighbors at positions (0, x−1), (1, x−1) and (2, x−1) (Steps 3308 and 3310 of FIG. 33).

For an element at position (y=height−1, x>0), the context model is selected based on the values (0 or 1) of the element's neighbors at positions (y, x−1) and (y−1, x−1) (Steps 3312 and 3314 of FIG. 33).

For an element at position (height−2>y>1, x=1), the context model is selected based on the value (0 or 1) of the element's neighbors at positions (y−1, x−1), (y, x−1) and (y+1, x−1) (Steps 3316 and 3318 of FIG. 33).

For an element at position (height−2>y>1, x>1), the context model is selected based on the value (0 or 1) of the element's neighbors at positions (y, x−2), (y−1, x−1), (y, x−1) and (y+1, x−1) (Steps 3320 and 3322 of FIG. 33).

By using the scheme provided in this example, only the coefficients in two neighboring scanning lines need to be stored.

Example 10

Figure 34:
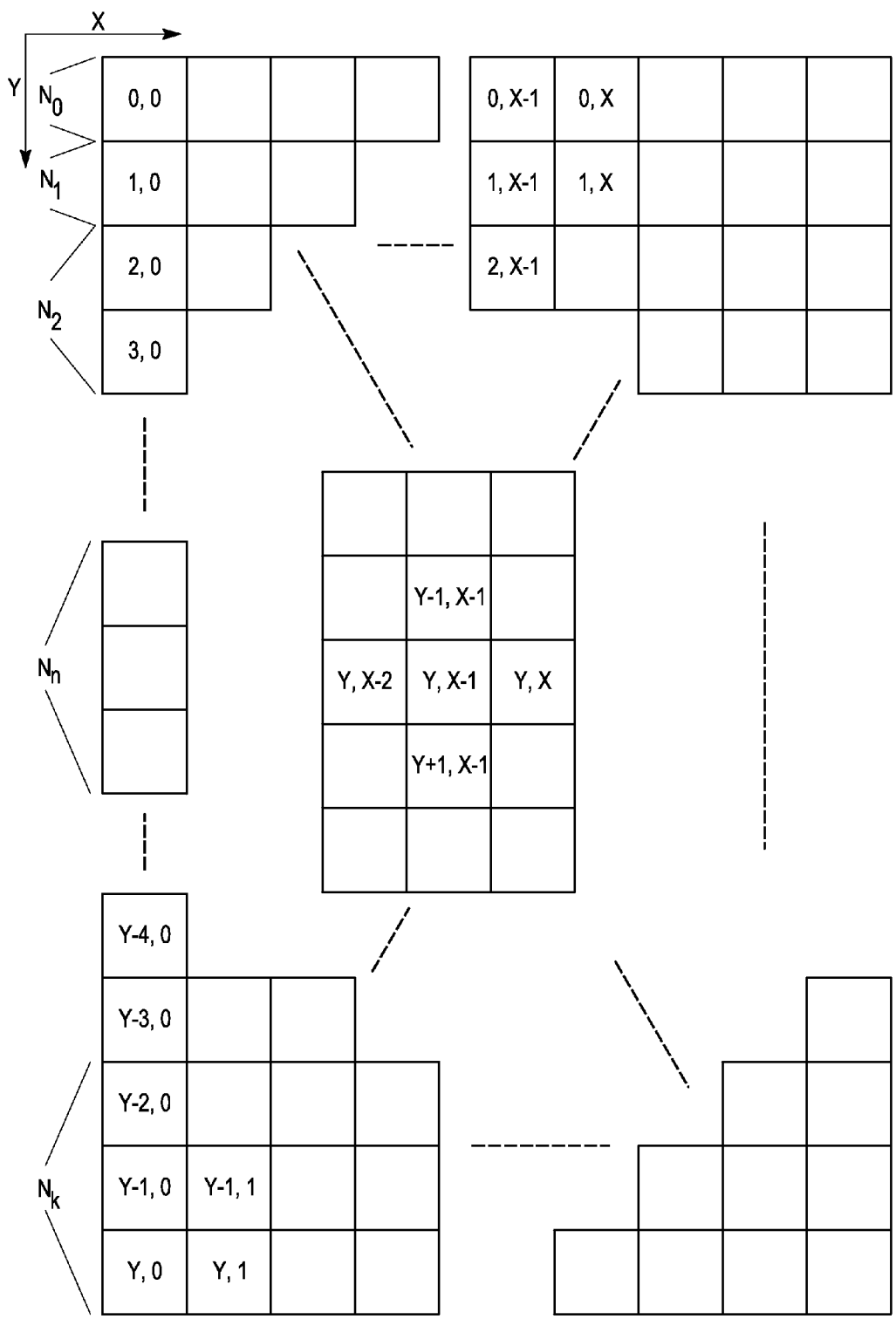

This example shows the context model selection for the vertical scan pattern utilizing up to 4 coded neighbors. Specifically, given a significance map (FIG. 34) of height by width, the context model for an element in the significance map is determined as follows.

For an element at position (y, 0), a unique or combined context model is assigned. That is, an element at position (y, 0) in a current block will share the same context model with other elements in other blocks at the same position (y, 0), n elements could be combined to share the same context while $0<N_0, N_1, \ldots N_k<$height and sum($N_0, N_1, \ldots N_k$)=height (Steps 3500 and 3502 of FIG. 35).

Figure 35:
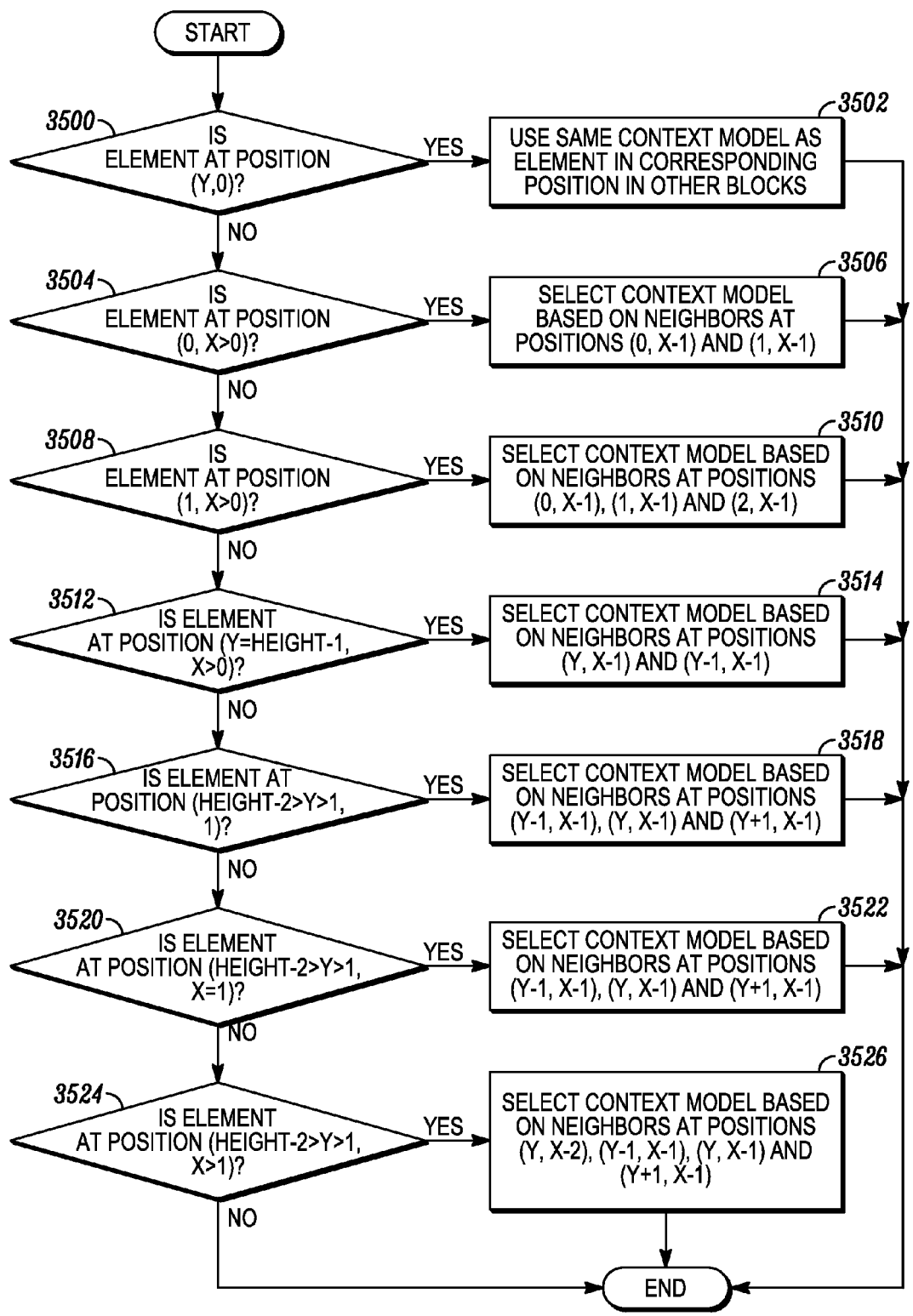

For an element at position (0, x>0), the context model is selected based on the values (0 or 1) of the element's neighbors at positions (0, x−1) and (1, x−1) (Steps 3504 and 3506 of FIG. 35).

For an element at position (1, x>0), the context model is selected based on the values (0 or 1) of the element's neighbors at positions (0, x−1), (1, x−1) and (2, x−1) (Steps 3508 and 3510 of FIG. 35).

For an element at position (y=height−1, x>0), the context model is selected based on the values (0 or 1) of the element's neighbors at positions (y, x−1) and (y−1, x−1) (Steps 3512 and 3514 of FIG. 35).

For an element at position (height−2>y>1, 1), the context model is selected based on the value (0 or 1) of the element's neighbors at positions (y−1, x−1), (y, x−1) and (y+1, x−1) (Steps 3516 and 3518 of FIG. 35).

For an element at position (height−2>y>1, x=1), the context model is selected based on the value (0 or 1) of the element's neighbors at positions (y−1, x−1), (y, x−1) and (y+1, x−1) (Steps 3520 and 3522 of FIG. 35).

For an element at position (height−2>y>1, x>1), the context model is selected based on the value (0 or 1) of the element's neighbors at positions (y, x−2), (y−1, x−1), (y, x−1) and (y+1, x−1) (Steps 3524 and 3526 of FIG. 35).

By using the scheme provided in this example, only the coefficients in two neighboring scanning lines need to be stored and using position as the context only applies on the first column, which simplifies the algorithm.

Example 11

Figure 36:
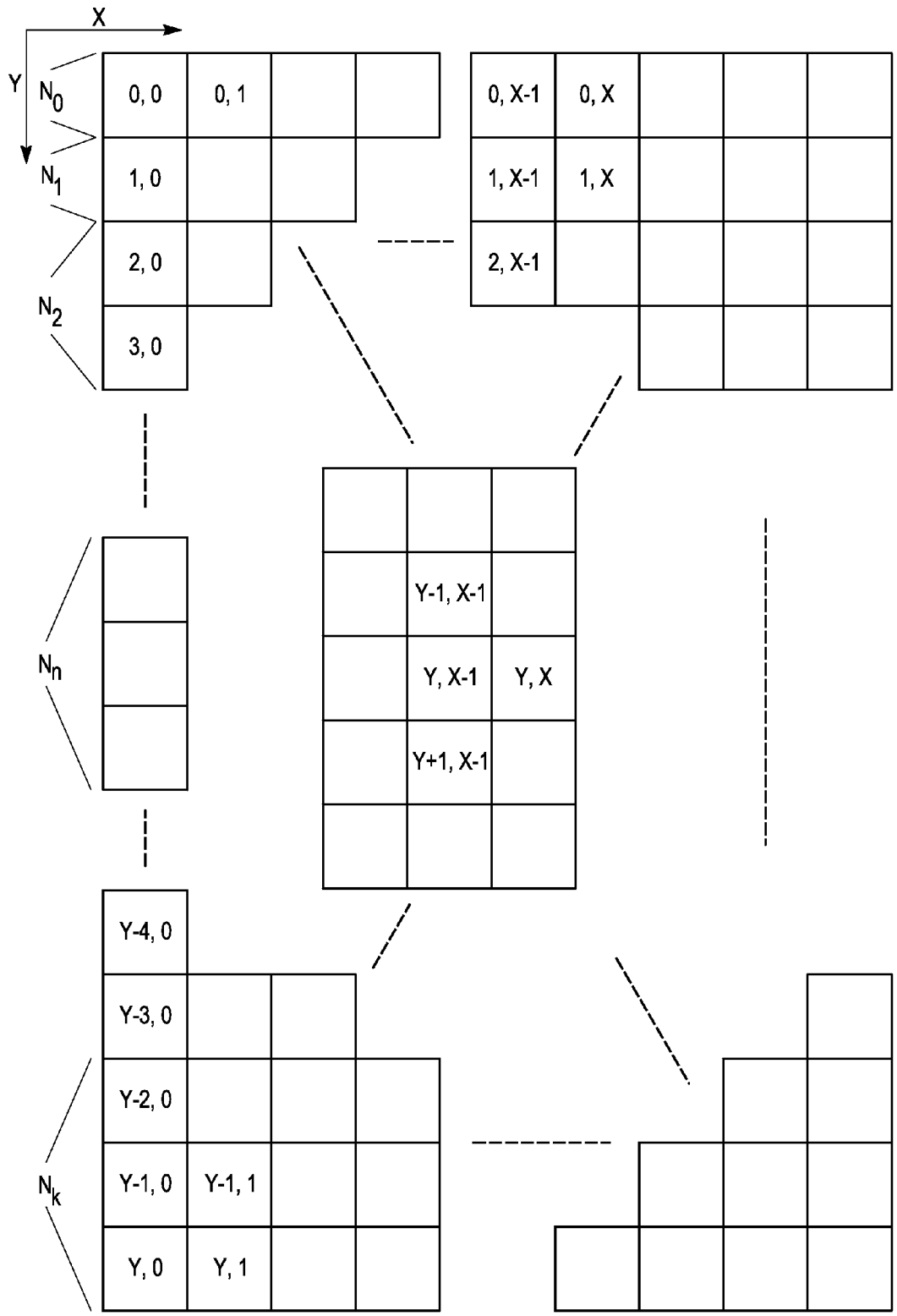

This example shows the context model selection for the vertical scan pattern utilizing up to 3 coded neighbors. Specifically, given a significance map (FIG. 36) of height by width, the context model for an element in the significance map is determined as follows.

For an element at position (y, 0) or (0, 1), a unique or combined context model is assigned. That is, an element at position (y, 0), or (0, 1) in a current block will share the same context model with other elements in other blocks at the same position (y, 0), or (0, 1), n elements could be combined to share the same context while $0<N_0, N_1, \ldots N_k<$height and sum($N_0, N_1, \ldots N_k$)=height (Steps 3700 and 3702 of FIG. 37).

Figure 37:
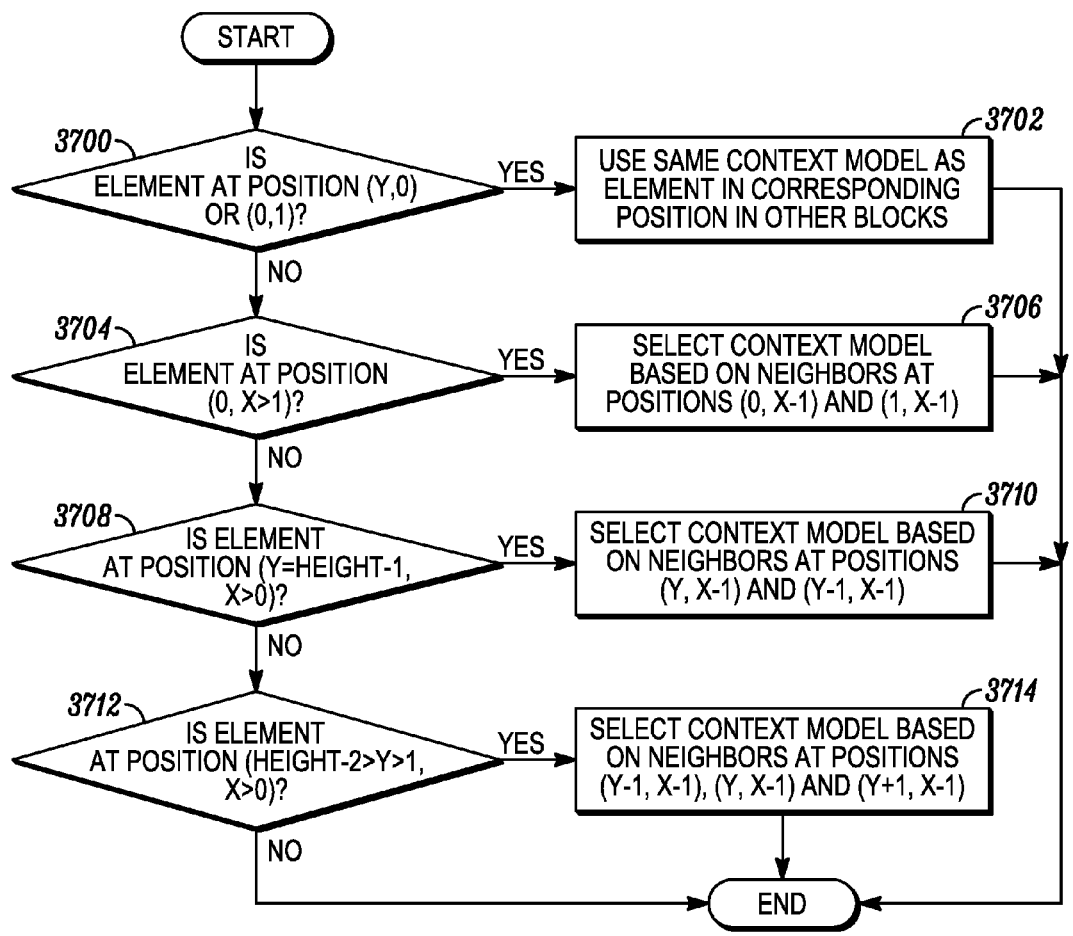

For an element at position (0, x>1), the context model is selected based on the values (0 or 1) of the element's neighbors at positions (0, x−1) and (1, x−1) (Steps 3704 and 3706 of FIG. 37).

For an element at position (y=height−1, x>0), the context model is selected based on the values (0 or 1) of the element's neighbors at positions (y, x−1) and (y−1, x−1) (Steps 3708 and 3710 of FIG. 37).

For an element at position (height−2>y>1, x>0), the context model is selected based on the value (0 or 1) of the element's neighbors at positions (y−1, x−1), (y, x−1) and (y+1, x−1) (Steps 3712 and 3714 of FIG. 37).

By using the scheme provided in this example, only the coefficients in one neighboring scanning line need to be stored.

Example 12

Figure 38:
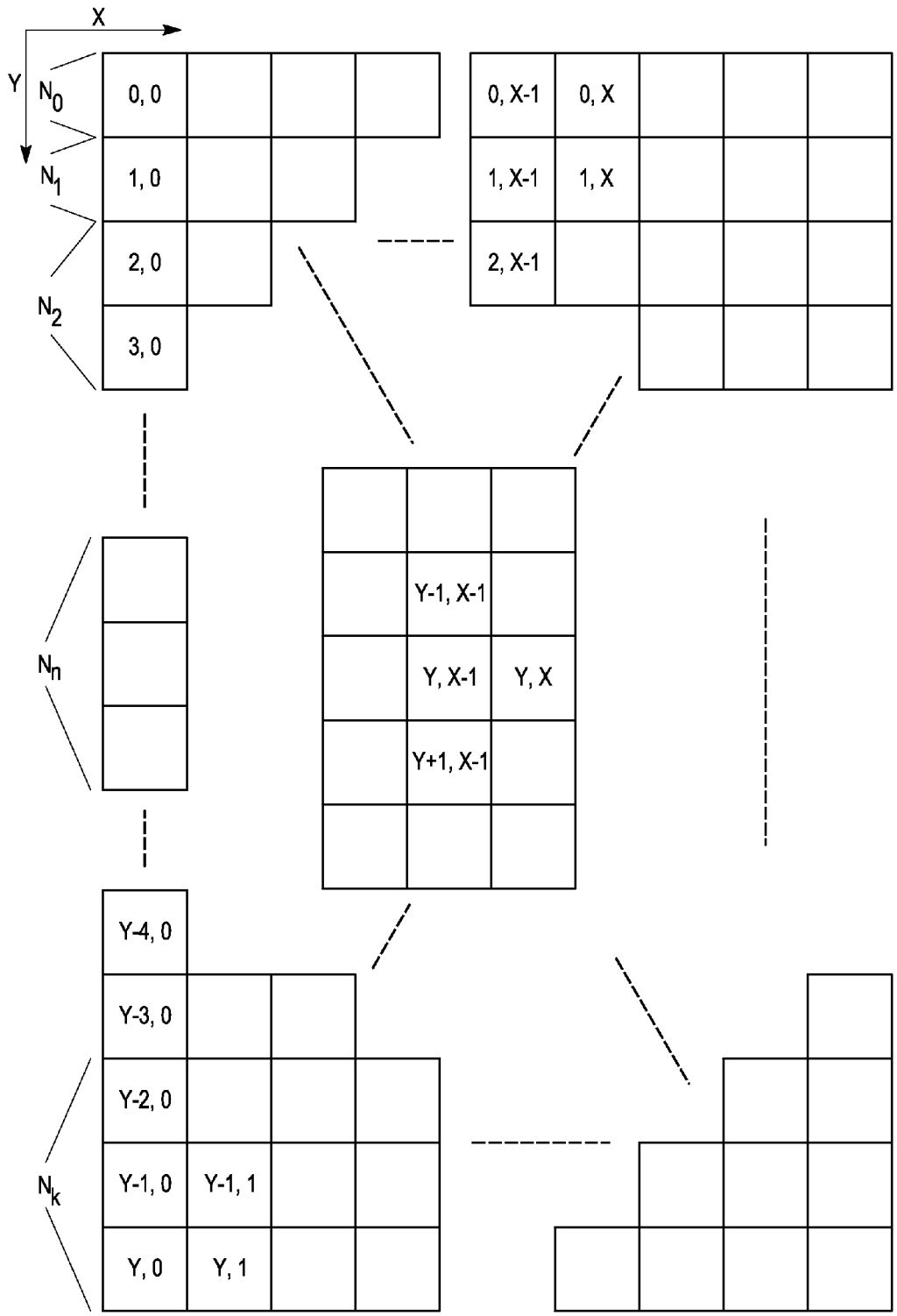

This example shows the context model selection for the vertical scan pattern utilizing up to 3 coded neighbors. Specifically, given a significance map (FIG. 38) of height by width, the context model for an element in the significance map is determined as follows.

For an element at position (y, 0), a unique or combined context model is assigned. That is, an element at position (y, 0) in a current block will share the same context model with other elements in other blocks at the same position (y, 0), n elements could be combined to share the same context while $0<N_0, N_1, \ldots N_k<$height and sum($N_0, N_1, \ldots N_k$)=height (Steps 3900 and 3902 of FIG. 39).

Figure 39:
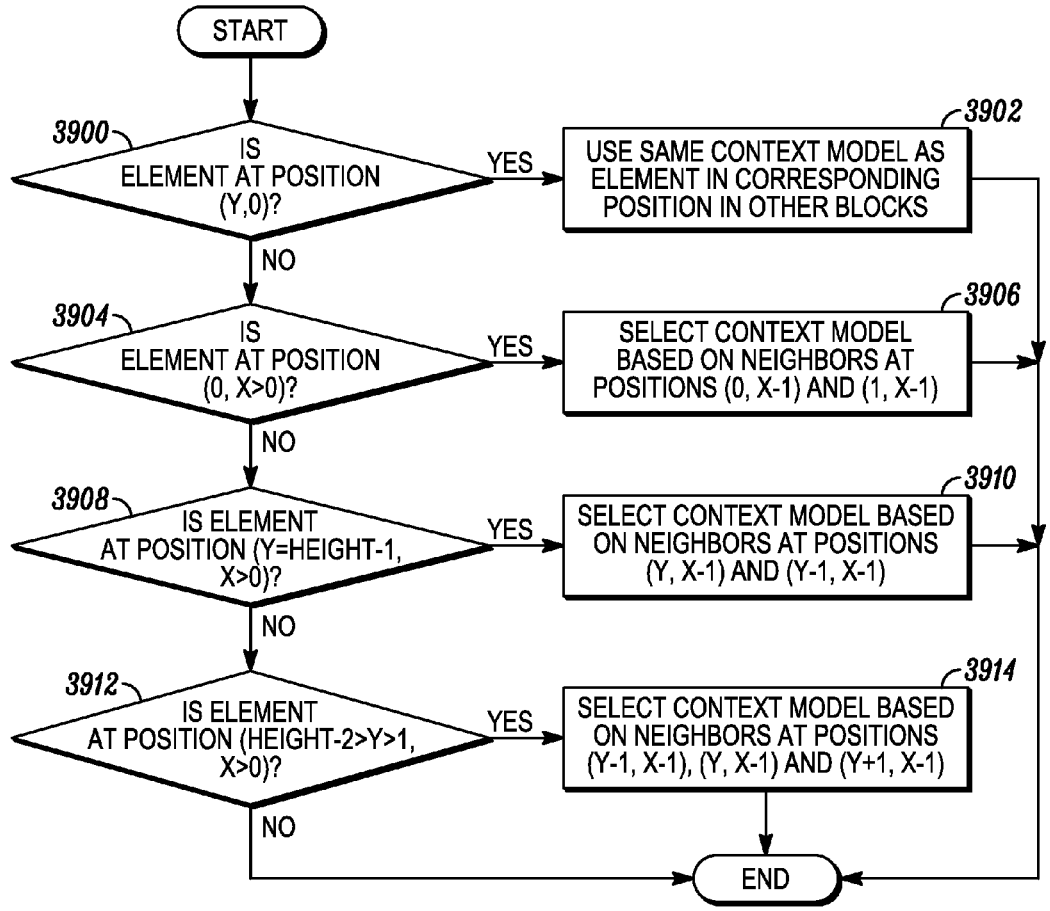

For an element at position (0, x>0), the context model is selected based on the values (0 or 1) of the element's neighbors at positions (0, x−1) and (1, x−1) (Steps 3904 and 3906 of FIG. 39).

For an element at position (y=height−1, x>0), the context model is selected based on the values (0 or 1) of the element's neighbors at positions (y, x−1) and (y−1, x−1) (Steps 3908 and 3910 of FIG. 39).

For an element at position (height−2>y>1, x>0), the context model is selected based on the value (0 or 1) of the element's neighbors at positions (y−1, x−1), (y, x−1) and (y+1, x−1) (Steps 3912 and 3914 of FIG. 39).

By using the scheme provided in this example, only the coefficients in one neighboring scanning line need to be stored and using position as the context only applies on the first column, which simplifies the algorithm.

Example 13

Figure 40:
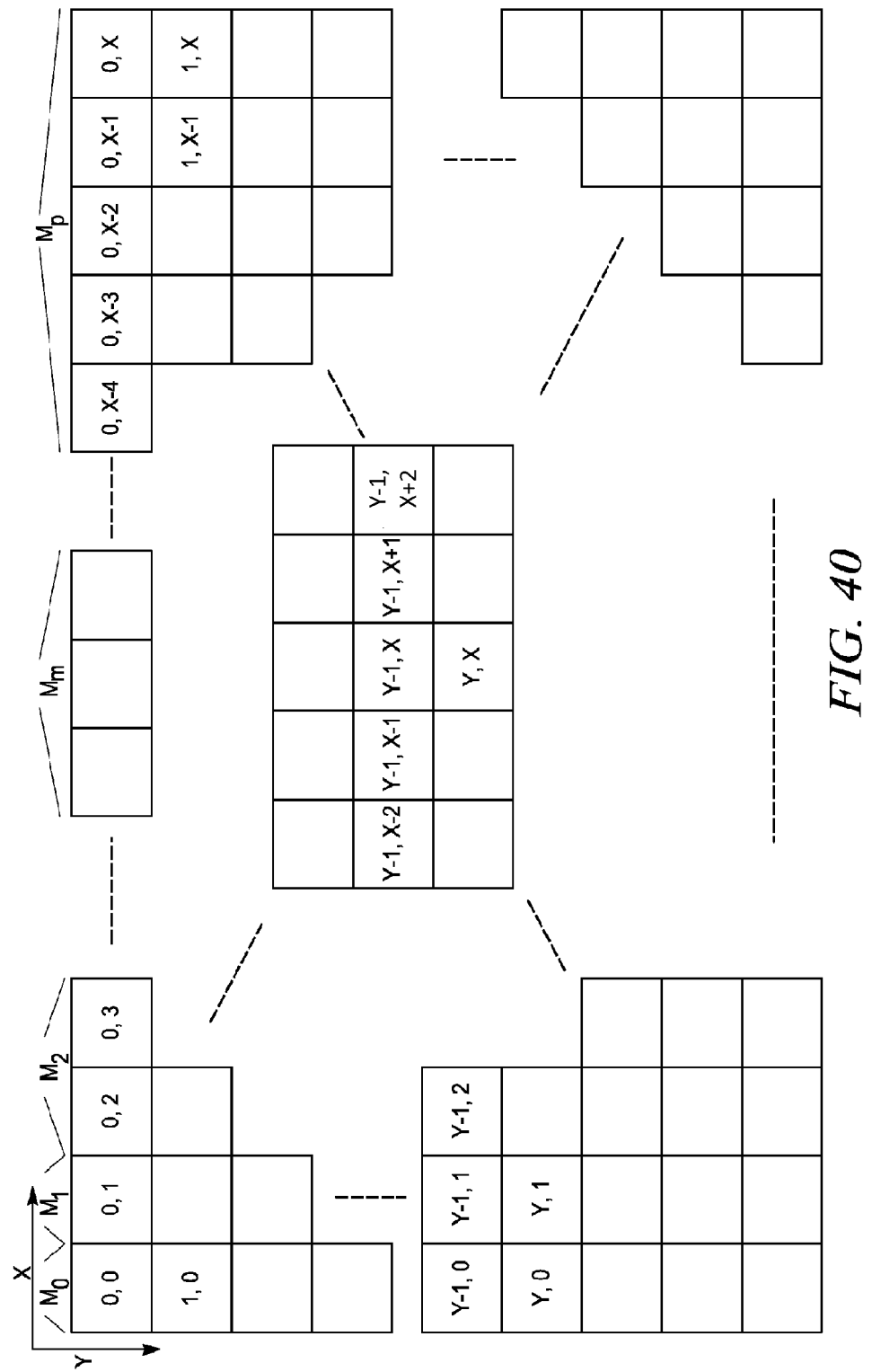

This example shows the context model selection for the horizontal scan pattern utilizing up to 5 coded neighbors. Specifically, given a significance map (FIG. 40) of height by width, the context model for an element in the significance map is determined as follows.

For an element at position (0, x) or (1, 0), a unique or combined context model is assigned. That is, an element at position (0, x), or (1, 0) in a current block will share the same context model with other elements in other blocks at the same position (0, x), or (1, 0), m elements could be combined to share the same context while $0<M0, M1, \ldots M_p<$width and sum(M0, M1, ... $M_p$)=width (Steps 4100 and 4102 of FIG. 41).

Figure 41:
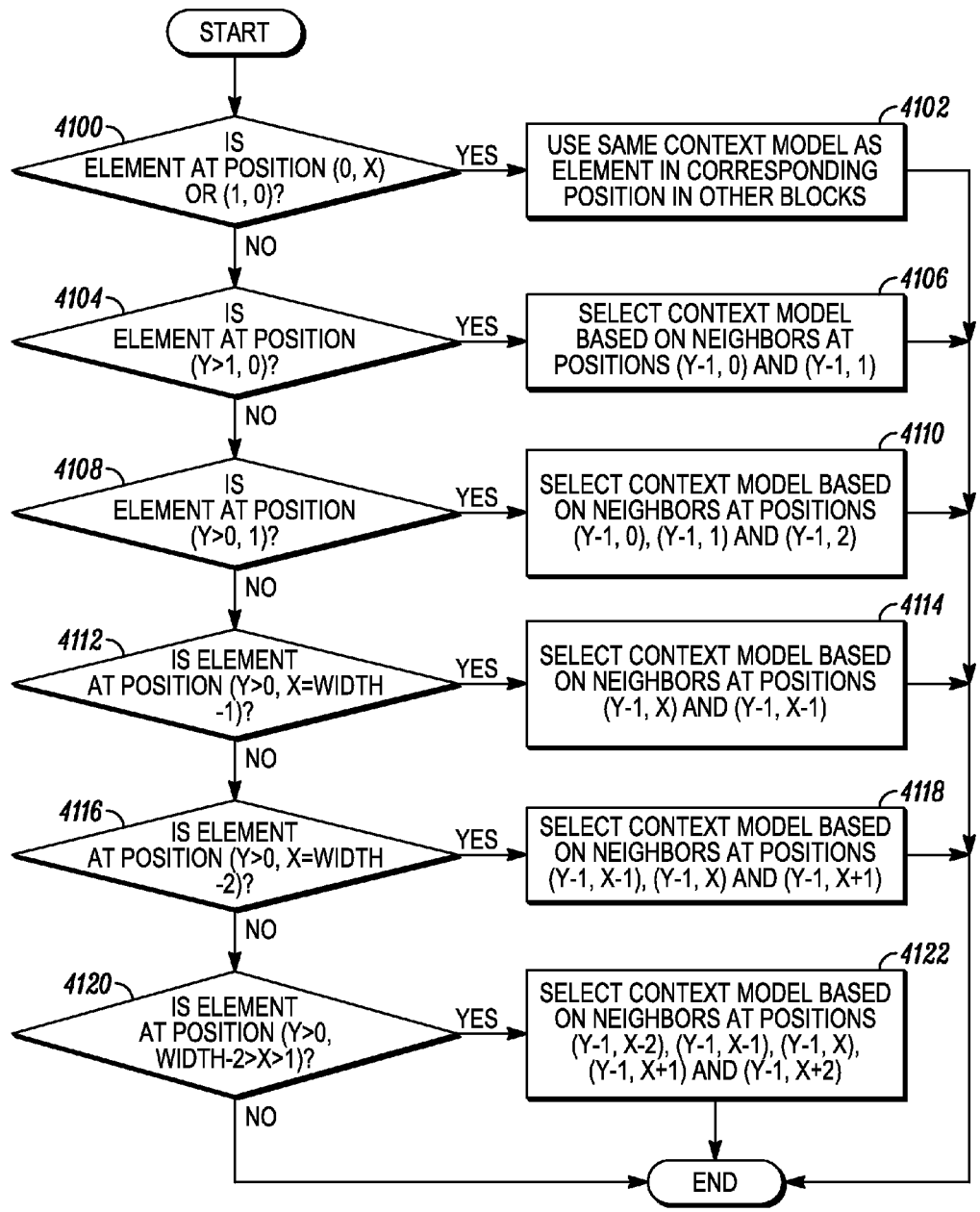

For an element at position (y>1, 0), the context model is selected based on the values (0 or 1) of the element's neighbors at positions (y−1, 0) and (y−1, 1) (Steps 4104 and 4106 of FIG. 41).

For an element at position (y>0, 1), the context model is selected based on the values (0 or 1) of the element's neighbors at positions (y−1, 0), (y−1, 1) and (y−1, 2) (Steps 4108 and 4110 of FIG. 41).

For an element at position (y>0, x=width−1), the context model is selected based on the values (0 or 1) of the element's neighbors at positions (y−1, x) and (y−1, x−1) (Steps 4112 and 4114 of FIG. 41).

For an element at position (y>0, x=width−2), the context model is selected based on the values (0 or 1) of the element's neighbors at positions (y−1, x−1), (y−1, x) and (y−1, x+1) (Steps 4116 and 4118 of FIG. 41).

For an element at position (y>0, width−2>x>1), the context model is selected based on the value (0 or 1) of the element's neighbors at positions (y−1, x−2), (y−1, x−1), (y−1, x), (y−1, x+1) and (y−1, x+2) (Steps 4118 and 4120 of FIG. 41).

By using the scheme provided in this example, only the coefficients in one neighboring scanning line need to be stored.

Example 14

Figure 42:
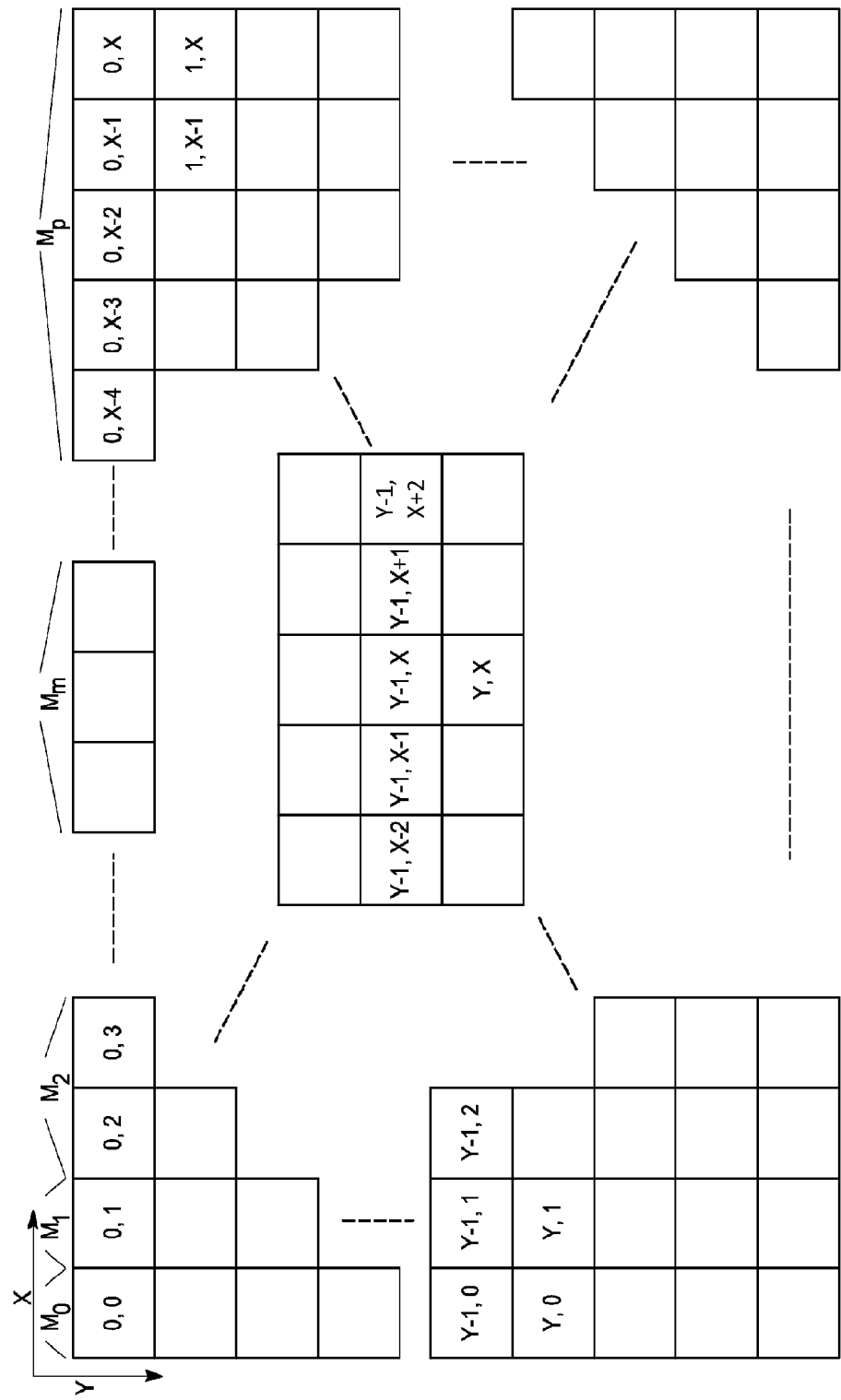

This example shows the context model selection for the horizontal scan pattern utilizing up to 5 coded neighbors. Specifically, given a significance map (FIG. 42) of height by width, the context model for an element in the significance map is determined as follows.

For an element at position (0, x), a unique or combined context model is assigned. That is, an element at position (0, x) in a current block will share the same context model with other elements in other blocks at the same position (0, x), m elements could be combined to share the same context while $0<M0, M1, \ldots M_p<$width and sum$(M0, M1, \ldots M_p)=$width (Steps 4300 and 4302 of FIG. 43).

Figure 43:
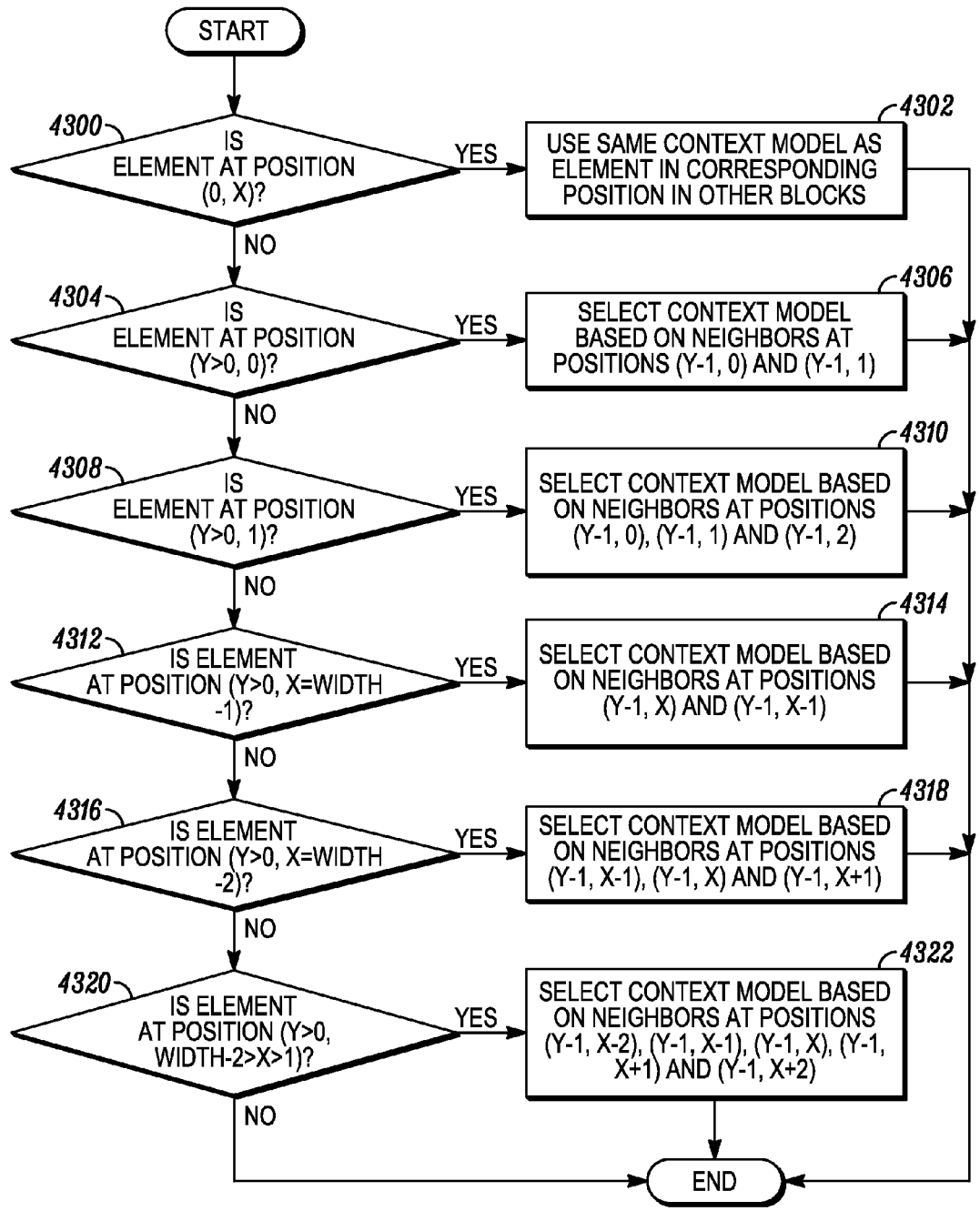

For an element at position (y>0, 0), the context model is selected based on the values (0 or 1) of the element's neighbors at positions (y−1, 0) and (y−1, 1) (Steps 4304 and 4306 of FIG. 43).

For an element at position (y>0, 1), the context model is selected based on the values (0 or 1) of the element's neighbors at positions (y−1, 0), (y−1, 1) and (y−1, 2) (Steps 4308 and 4310 of FIG. 43).

For an element at position (y>0, x=width−1), the context model is selected based on the values (0 or 1) of the element's neighbors at positions (y−1, x) and (y−1, x−1) (Steps 4312 and 4314 of FIG. 43).

For an element at position (y>0, x=width−2), the context model is selected based on the values (0 or 1) of the element's neighbors at positions (y−1, x−1), (y−1, x) and (y−1, x+1) (Steps 4316 and 4318 of FIG. 43).

For an element at position (y>0, width−2>x>1), the context model is selected based on the value (0 or 1) of the element's neighbors at positions (y−1, x−2), (y−1, x−1), (y−1, x), (y−1, x+1) and (y−1, x+2) (Steps 4320 and 4322 of FIG. 43).

By using the scheme provided in this example, only the coefficients in one neighboring scanning line need to be stored and using position as the context only applies on the first row which simplifies the algorithm.

Example 15

Figure 44:
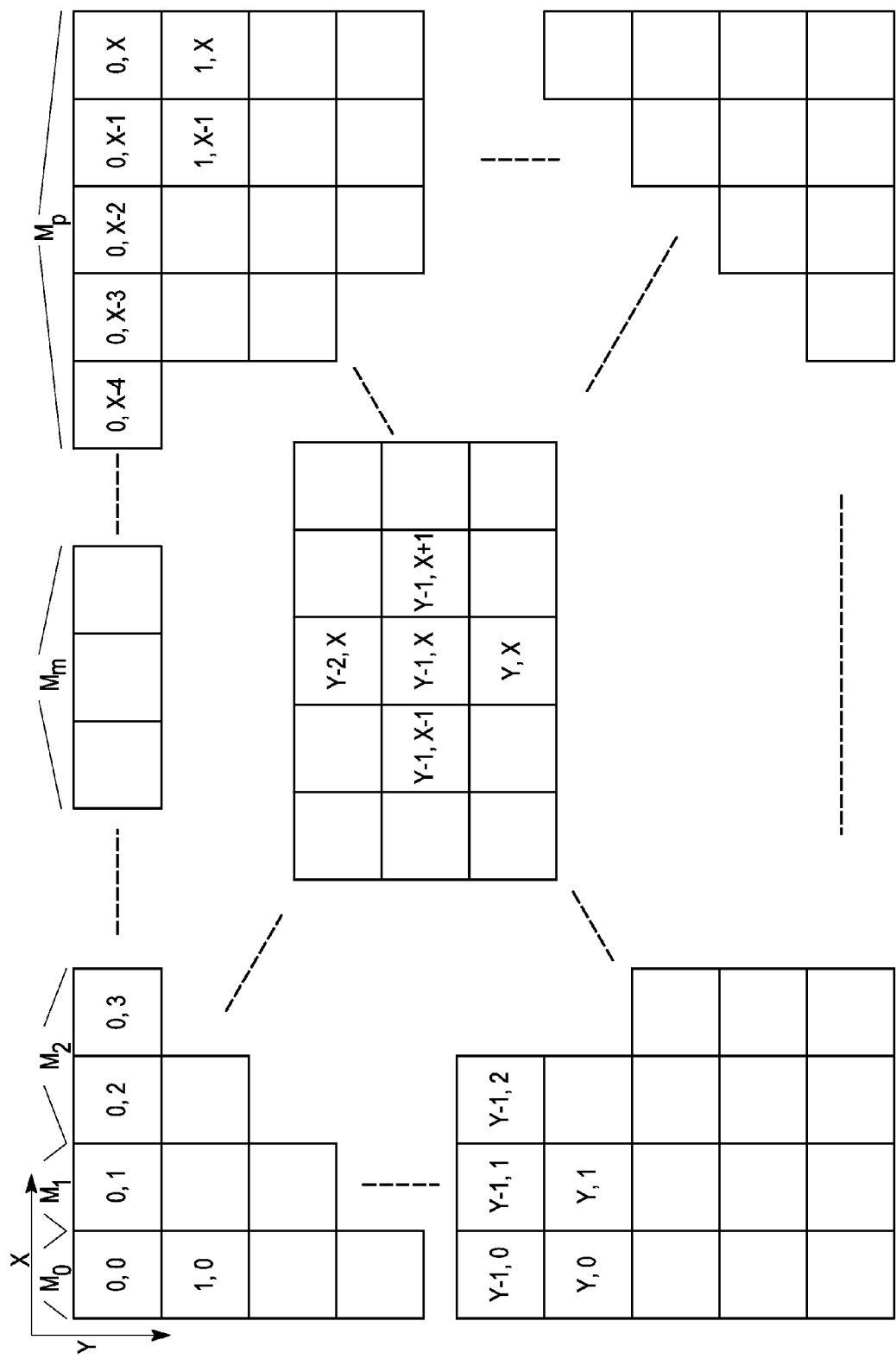

This example shows the context model selection for the horizontal scan pattern utilizing up to 4 coded neighbors. Specifically, given a significance map (FIG. 44) of height by width, the context model for an element in the significance map is determined as follows.

For an element at position (0, x) or (1, 0), a unique or combined context model is assigned. That is, an element at position (0, x), or (1, 0) in a current block will share the same context model with other elements in other blocks at the same position (0, x), or (1, 0), m elements could be combined to share the same context while $0<M0, M1, \ldots M_p<$width and sum$(M0, M1, \ldots M_p)=$width (Steps 4500 and 4502 of FIG. 45).

Figure 45:
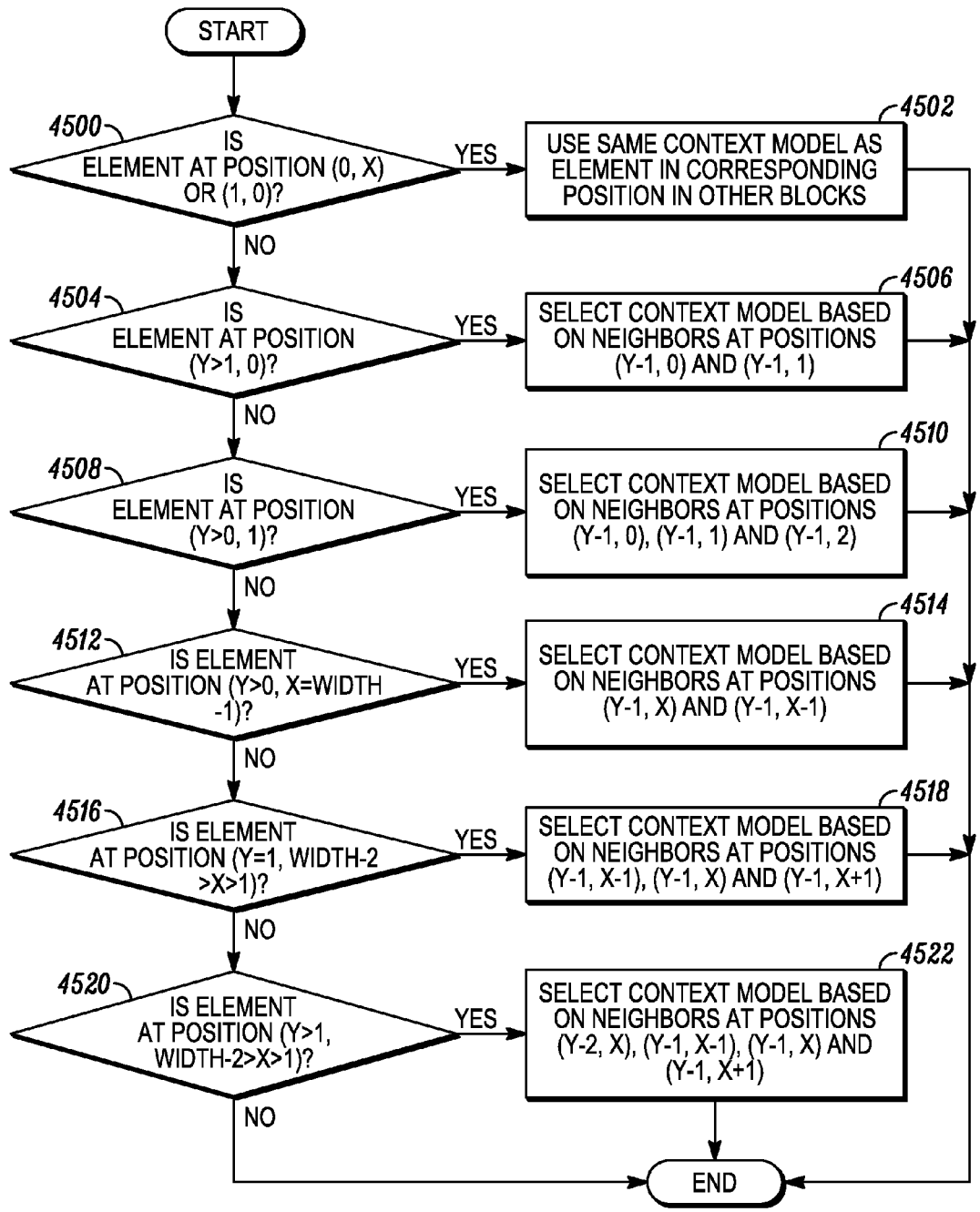

For an element at position (y>1, 0), the context model is selected based on the values (0 or 1) of the element's neighbors at positions (y−1, 0) and (y−1, 1) (Steps 4504 and 4506 of FIG. 45).

For an element at position (y>0, 1), the context model is selected based on the values (0 or 1) of the element's neighbors at positions (y−1, 0), (y−1, 1) and (y−1, 2) (Steps 4508 and 4510 of FIG. 45).

For an element at position (y>0, x=width−1), the context model is selected based on the values (0 or 1) of the element's neighbors at positions (y−1, x) and (y−1, x−1) (Steps 4512 and 4514 of FIG. 45).

For an element at position (y=1, width−2>x>1), the context model is selected based on the value (0 or 1) of the element's neighbors at positions (y−1, x−1), (y−1, x) and (y−1, x+1) (Steps 4516 and 4518 of FIG. 45).

For an element at position (y>1, width−2>x>1), the context model is selected based on the value (0 or 1) of the element's neighbors at positions (y−2, x), (y−1, x−1), (y−1, x) and (y−1, x+1) (Steps 4520 and 4522 of FIG. 45).

By using the scheme provided in this example, only the coefficients in two neighboring scanning lines need to be stored.

Example 16

Figure 46:
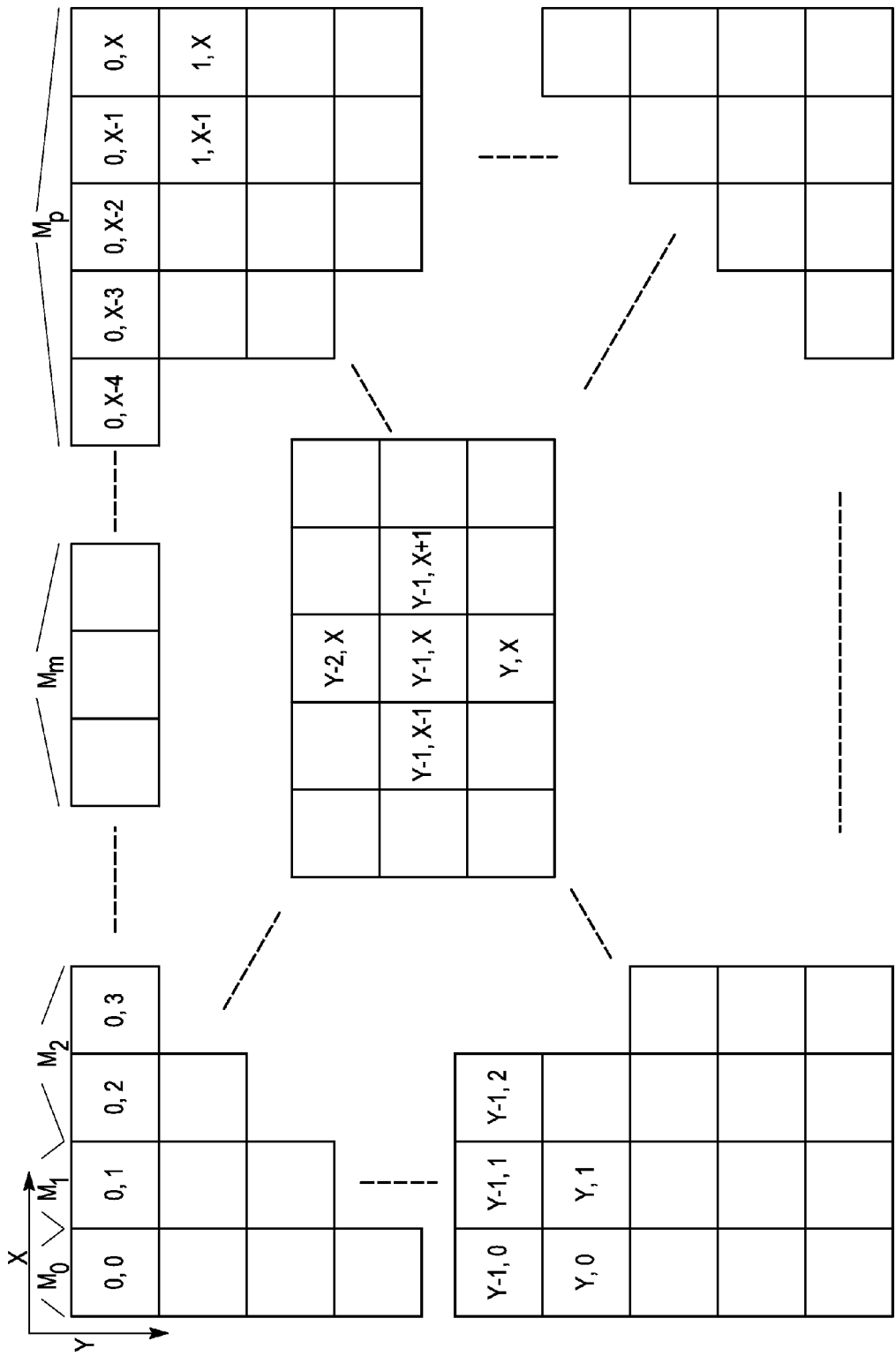

This example shows the context model selection for the horizontal scan pattern utilizing up to 4 coded neighbors. Specifically, given a significance map (FIG. 46) of height by width, the context model for an element in the significance map is determined as follows.

For an element at position (0, x), a unique or combined context model is assigned. That is, an element at position (0, x) in a current block will share the same context model with other elements in other blocks at the same position (0, x), m elements could be combined to share the same context while $0<M0, M1, \ldots M_p<$width and sum$(M0, M1, \ldots M_p)=$width (Steps 4700 and 4702 of FIG. 47).

Figure 47:
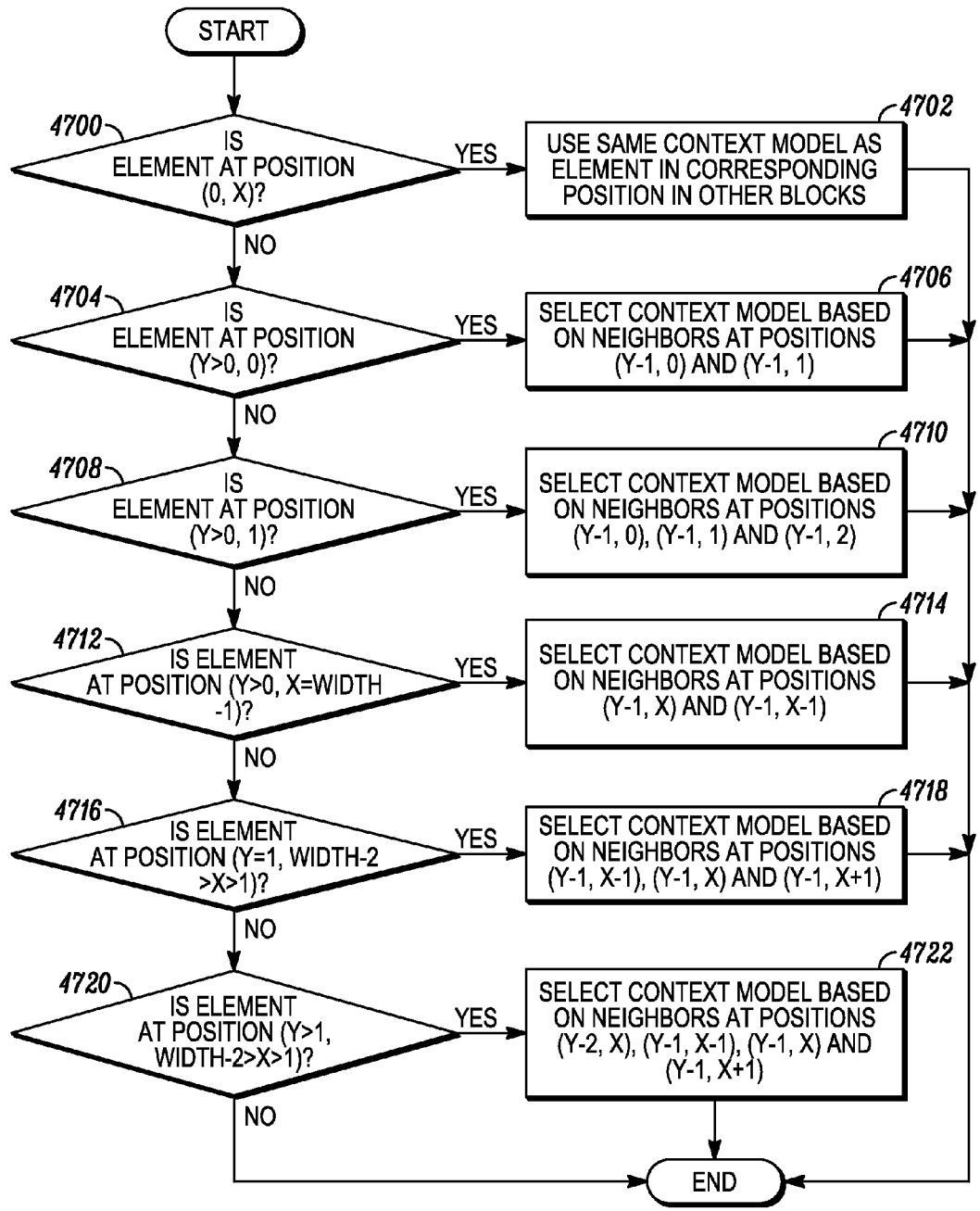

For an element at position (y>0, 0), the context model is selected based on the values (0 or 1) of the element's neighbors at positions (y−1, 0) and (y−1, 1) (Steps 4704 and 4706 of FIG. 47).

For an element at position (y>0, 1), the context model is selected based on the values (0 or 1) of the element's neighbors at positions (y−1, 0), (y−1, 1) and (y−1, 2) (Steps 4708 and 4710 of FIG. 47).

For an element at position (y>0, x=width−1), the context model is selected based on the values (0 or 1) of the element's neighbors at positions (y−1, x) and (y−1, x−1) (Steps 4712 and 4714 of FIG. 47).

For an element at position (y=1, width−2>x>1), the context model is selected based on the value (0 or 1) of the element's neighbors at positions (y−1, x−1), (y−1, x) and (y−1, x+1) (Steps 4716 and 4718 of FIG. 47).

For an element at position (y>1, width−2>x>1), the context model is selected based on the value (0 or 1) of the element's neighbors at positions (y−2, x), (y−1, x−1), (y−1, x) and (y−1, x+1) (Steps 4720 and 4722 of FIG. 47).

By using the scheme provided in this example, only the coefficients in two neighboring scanning lines need to be stored and using position as the context only applies on the first row, which simplifies the algorithm.

Example 17

Figure 48:
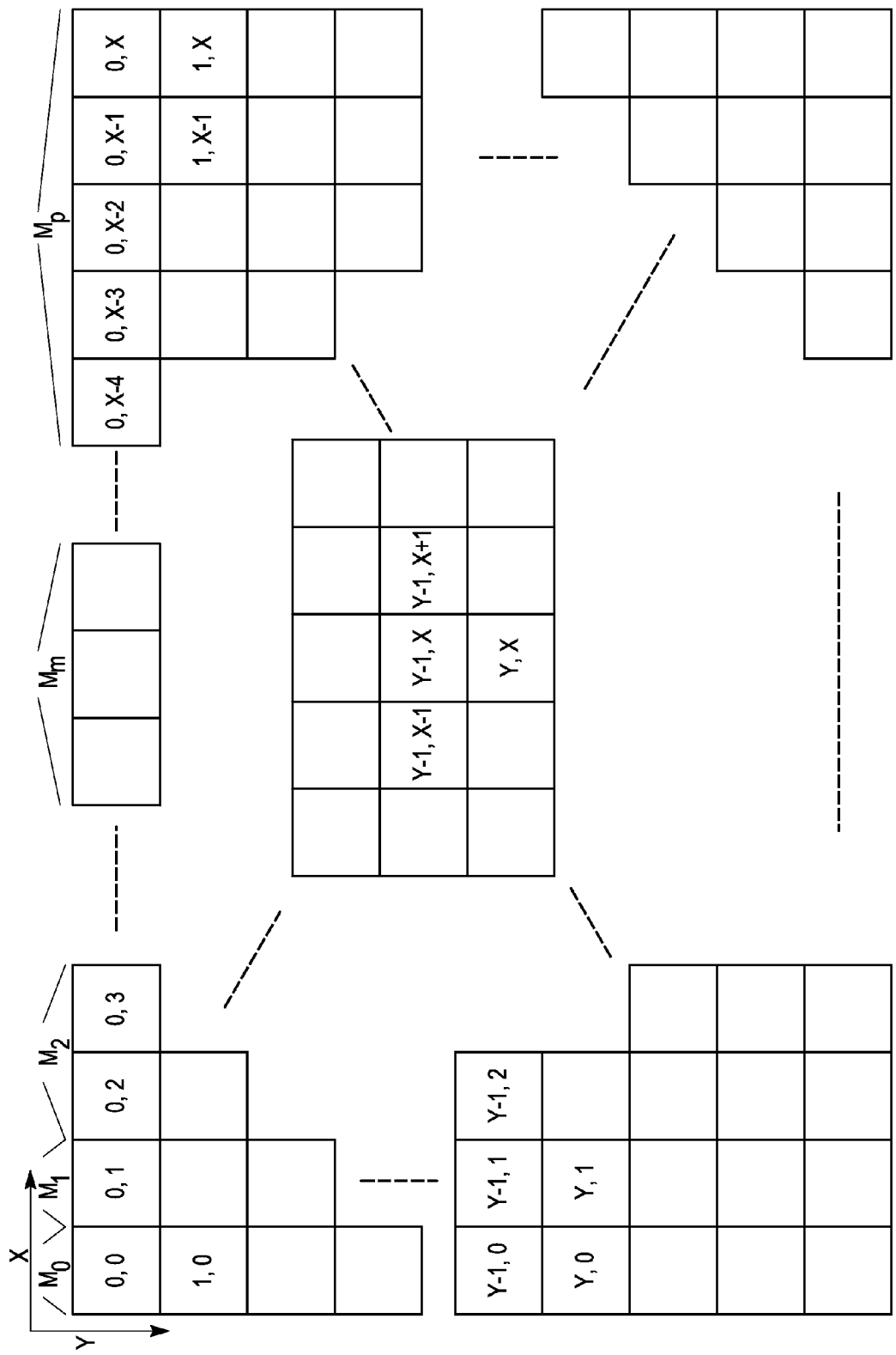

This example shows the context model selection for the horizontal scan pattern utilizing up to 3 coded neighbors. Specifically, given a significance map (FIG. 48) of height by width, the context model for an element in the significance map is determined as follows.

19

For an element at position (0, x) or (1, 0), a unique or combined context model is assigned. That is, an element at position (0, x), or (1, 0) in a current block will share the same context model with other elements in other blocks at the same position (0, x), or (1, 0), m elements could be combined to share the same context while 0<M0, M1, ... $M_p$<width and sum(M0, M1, ... $M_p$)=width (Steps 4900 and 4902 of FIG. 49).

Figure 49:
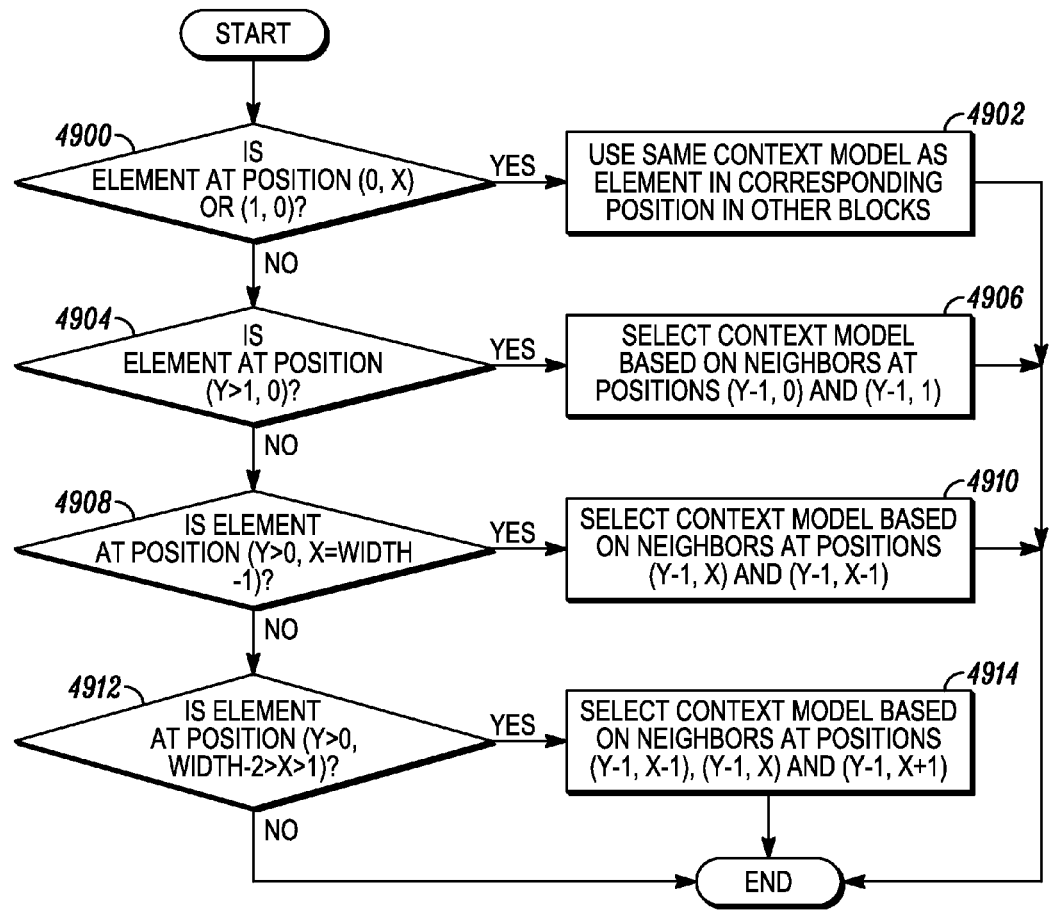

For an element at position (y>1, 0), the context model is selected based on the values (0 or 1) of the element's neighbors at positions (y−1, 0) and (y−1, 1) (Steps 4904 and 4906 of FIG. 49).

For an element at position (y>0, x=width−1), the context model is selected based on the values (0 or 1) of the element's neighbors at positions (y−1, x) and (y−1, x−1) (Steps 4908 and 4910 of FIG. 49).

For an element at position (y>0, width−2>x>1), the context model is selected based on the value (0 or 1) of the element's neighbors at positions (y−1, x−1), (y−1, x) and (y−1, x+1) (Steps 4912 and 4914 of FIG. 49).

By using the scheme provided in this example, only the coefficients in one neighboring scanning line need to be stored.

Example 18

Figure 50:
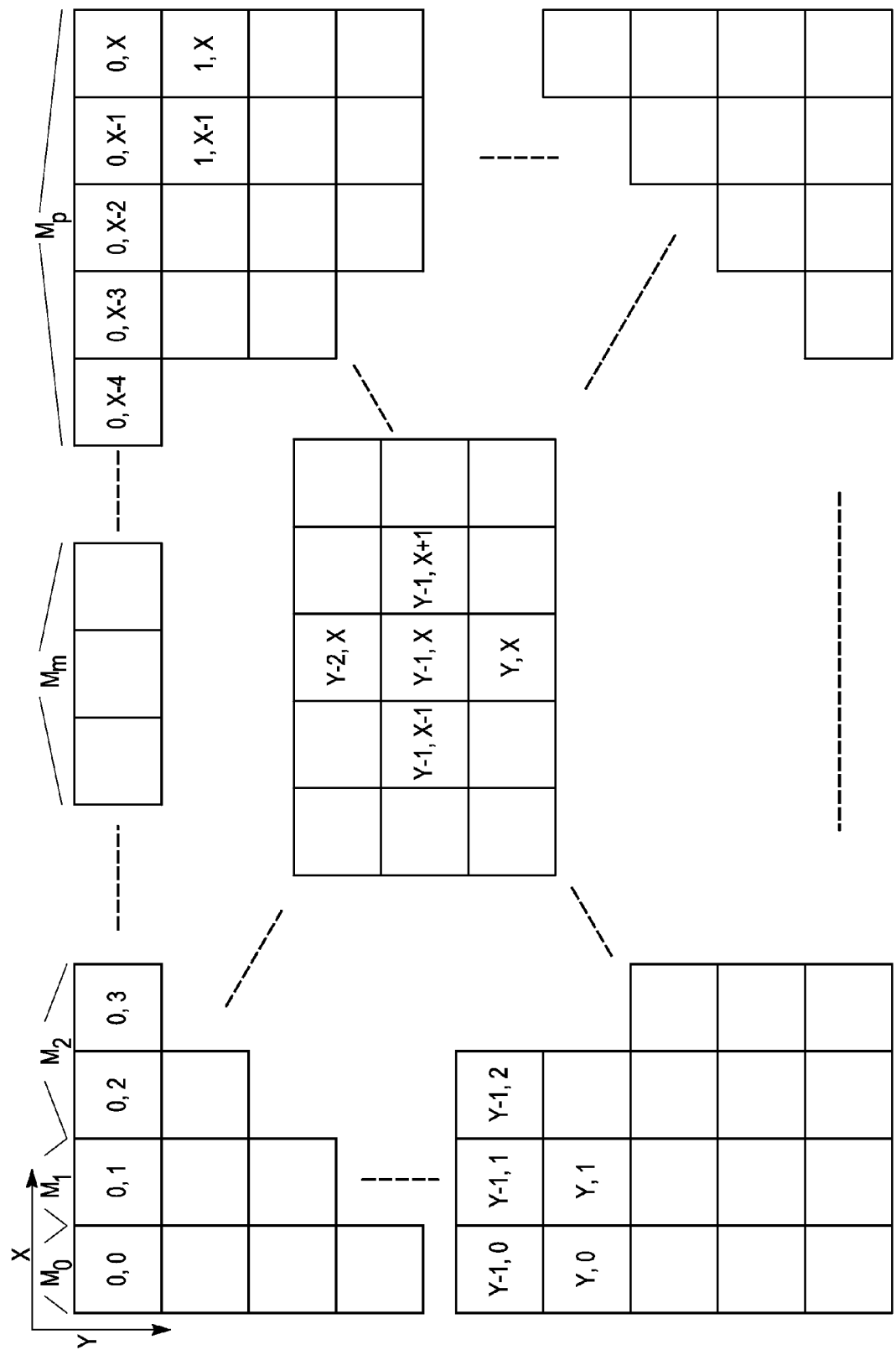

This example shows the context model selection for the horizontal scan pattern utilizing up to 3 coded neighbors. Specifically, given a significance map (FIG. 50) of height by width, the context model for an element in the significance map is determined as follows.

For an element at position (0, x), a unique or combined context model is assigned. That is, an element at position (0, x) in a current block will share the same context model with other elements in other blocks at the same position (0, x), m elements could be combined to share the same context while 0<M0, M1, ... $M_p$<width and sum(M0, M1, ... $M_p$)=width (Steps 5100 and 5102 of FIG. 51).

Figure 51:
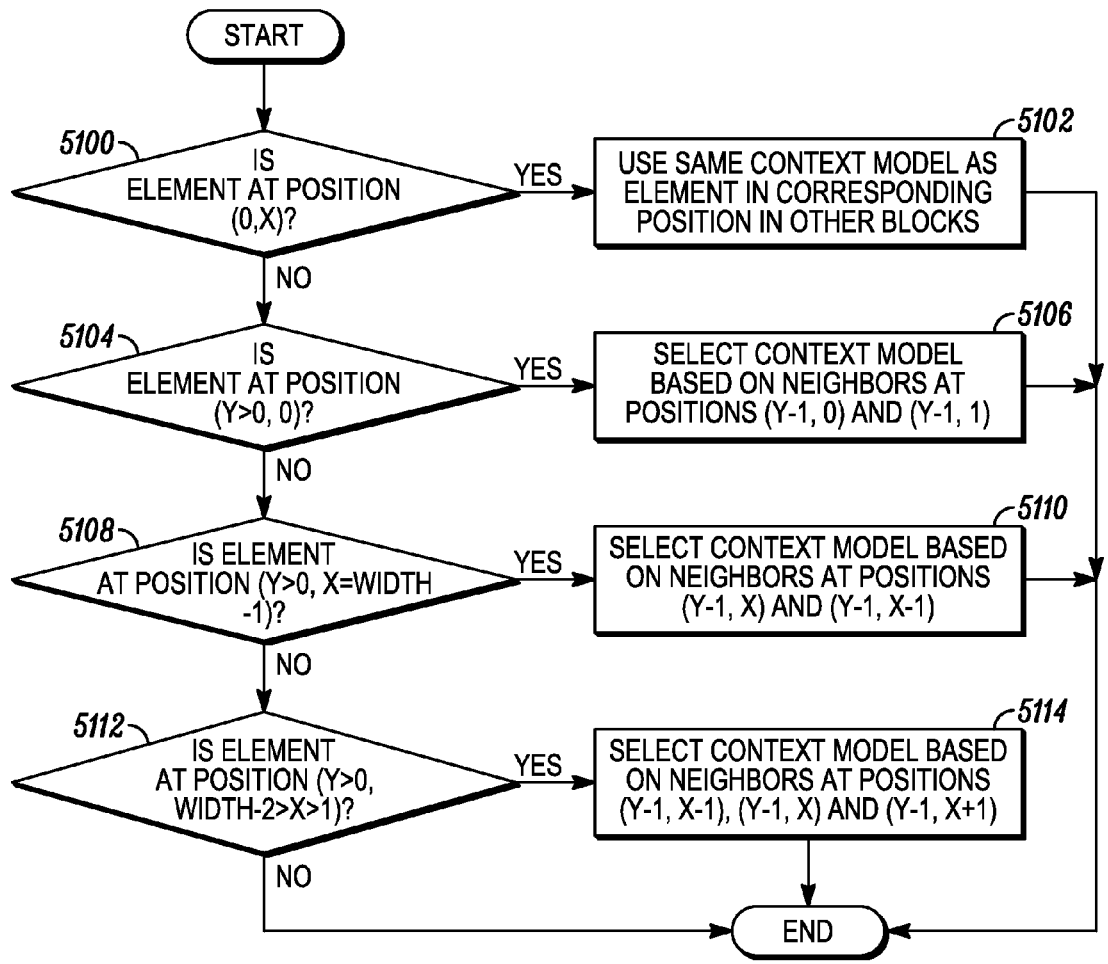

For an element at position (y>0, 0), the context model is selected based on the values (0 or 1) of the element's neighbors at positions (y−1, 0) and (y−1, 1) (Steps 5104 and 5106 of FIG. 51).

For an element at position (y>0, x=width−1), the context model is selected based on the values (0 or 1) of the element's neighbors at positions (y−1, x) and (y−1, x−1) (Steps 5108 and 5110 of FIG. 51).

For an element at position (y>0, width−2>x>1), the context model is selected based on the value (0 or 1) of the element's neighbors at positions (y−1, x−1), (y−1, x) and (y−1, x+1) (Steps 5112 and 5114 of FIG. 51).

Although described specifically throughout the entirety of the instant disclosure, representative examples have utility over a wide range of applications, and the above discussion is not intended and should not be construed to be limiting. The terms, descriptions and figures used herein are set forth by way of illustration only and are not meant as limitations. Those skilled in the art recognize that many variations are possible within the spirit and scope of the examples. While the examples have been described with reference to examples, those skilled in the art are able to make various modifications to the described examples without departing from the scope of the examples as described in the following claims, and their equivalents.

What is claimed is:

1. A method for processing video data, the video data being associated with a matrix of a plurality of elements, the method comprising:

reading the video data using a predetermined scanning pattern through the matrix, each element of the plurality of elements having a location (y,x) wherein 0≤y≤(height−1) and 0≤x≤(width−1) and dimensions of the matrix are height x width;

determining a context model for each element of the plurality of elements in the predetermined scanning pattern from an element at location (0,0) through an element at location (height−1, width−1) by:

when the predetermined scanning pattern is a zigzag pattern:
  for the element at location (0,0), determining the context model as a context model for a corresponding element at the location (0,0) in a different matrix having the dimensions of the matrix;
  for the element at location (1,0), determining the context model as a context model for a corresponding element at the location (1,0) in the different matrix;
  for the element at location (0,1), determining the context model as a context model for a corresponding element at the location (0,1) in the different matrix; and
  for the elements other than those at the locations (0,0), (1,0) and (0,1), determining the context model for each element of a zigzag scanning line of a plurality of zigzag scanning lines based on the values of other elements of the plurality of elements, wherein said other elements are not along a same zigzag scanning line as the element, and wherein said other elements are included in no more than two other zigzag scanning lines of the plurality of zigzag scanning lines;

when the predetermined scanning pattern is a vertical pattern:
  for the element at each location (k,0) for 0≤k≤(height−1), determining the context model as a context model for a corresponding element at the location (k,0) in the different matrix having the dimensions of the matrix; and
  for the elements other than those at the locations (k, 0), determining the context model for each element of a vertical scanning line of a plurality of vertical scanning lines based on the values of other elements of the plurality of elements, wherein said other elements are not along a same vertical scanning line as the element, and wherein said other elements are included in no more than two other vertical scanning lines of the plurality of vertical scanning lines;

when the scanning pattern is a horizontal pattern:
  for the element at each location (0, p) for 0≤p≤(width−1), determining the context model as a context model for a corresponding element at the location (0, p) in the different matrix having the dimensions of the matrix; and
  for the elements other than those at the locations (0, p), determining the context model for each element of a horizontal scanning line of a plurality of horizontal scanning lines based on the values of other elements of the plurality of elements, wherein said other elements are not along a same horizontal scanning line as the element, and wherein said other elements are included in no more than two other horizontal scanning lines of the plurality of horizontal scanning lines; and processing each element based on the respective determined context model.

2. The method of claim 1, wherein:
when the predetermined scanning pattern is the zigzag pattern, said other elements are included only in one other zigzag scanning line of the plurality of zigzag scanning lines;
when the predetermined scanning pattern is the vertical pattern, said other elements are included only in one other vertical scanning line of the plurality of vertical scanning lines; and
when the predetermined scanning pattern is the horizontal pattern, said other elements are included only in one other horizontal scanning line of the plurality of horizontal scanning lines.

3. The method of claim 1, wherein the matrix comprises a significance map, each element of the plurality of elements representing the presence or nonpresence of a video compression coefficient.

4. The method of claim 1, wherein each of the plurality of elements is a binary number, each binary number indicating whether a quantized transform coefficient for a video block is zero or non-zero.

5. The method of claim 1, wherein the other zigzag scanning lines are previously processed zigzag scanning lines of the zigzag scanning pattern, the other vertical scanning lines are previously processed vertical scanning lines of the vertical scanning pattern, and the other horizontal scanning lines are previously processed horizontal scanning lines of the horizontal scanning pattern.

6. The method of claim 1, wherein the processing step comprises mapping the context model to a probability value.

7. The method of claim 1, wherein the video data represents a block of a video picture, the method further comprising
applying a transform to the video data to derive transform coefficients;
quantizing the transform coefficients,
wherein the element represents whether or not the value of one of the quantized transform coefficients is zero.

8. The method of claim 1, wherein the determining and processing steps for a first element are carried out in parallel with the determining and processing steps for a second element, wherein the first element and the second element are located in a single scanning line of one of the plurality of zigzag scanning lines, one of the plurality of vertical scanning lines and one of the plurality of horizontal scanning lines.

9. A method for processing a significance map, the significance map being represented by a matrix of elements, the matrix being coded along a plurality of scanning lines, each scanning line including one or more of the elements of the matrix, the method comprising:
determining a context model to be used for each element of the matrix of elements, the matrix of elements having dimensions of height x width and each element having a location (y,x) wherein 0≤y≤(height−1) and 0≤x≤(width−1), by:
when the plurality of scanning lines forms a zigzag pattern:
determining the context model to be used for the element at location (0,0) as a context model for a corresponding element at the location (0,0) in a different matrix having the dimensions of the matrix;
determining the context model to be used for the element at location (1,0) as a context model for a corresponding element at the location (1,0) in the different matrix; and
determining the context model to be used for the element at location (0,1) as a context model for a corresponding element at the location (0,1) in the different matrix;
when the plurality of scanning lines forms a vertical pattern:
determining the context model to be used for the element at each location (k,0) for 0<k<(height−1) as a context model for a corresponding element at the location (k,0) in the different matrix having the dimensions of the matrix;
when the plurality of scanning lines forms a horizontal pattern:
determining the context model to be used for the element at each location (0, p) for 0≤p≤(width−1) as a context model for a corresponding element at the location (0, p) in the different matrix having the dimensions of the matrix; and
for other elements of the matrix of elements, determining the context model to be used for an element of a first scanning line of the plurality of scanning lines based on a subset of elements of the matrix, the subset consisting of elements of a second scanning line of the plurality of scanning lines, the second scanning line being adjacent to the first scanning line; and
processing each element based on the respective determined context model.

10. The method of claim 9, wherein the subset of elements consists of two elements.

11. The method of claim 9, wherein the subset of elements consists of three elements.

12. The method of claim 9, wherein the subset of elements consists of four elements.

13. The method of claim 9, wherein the subset of elements consists of five elements.

14. A system for processing video data, the system comprising:
a processor that executes instructions for performing steps comprising
reading the elements of a significance map along a predetermined scanning pattern, the scanning pattern comprising a plurality of scanning lines and the significance map comprising a matrix of the elements, the matrix having dimensions of height x width and each element having a location (y,x) wherein 0≤y≤(height−1) and 0≤x≤(width−1);
when the plurality of scanning lines forms a zigzag pattern:
determining a context model to be used for an element at location (0,0) as a context model for a corresponding element at the location (0,0) in a different matrix having the dimensions of the matrix;
determining a context model to be used for an element at location (1,0) as a context model for a corresponding element at the location (1,0) in the different matrix; and
determining a context model to be used for an element at location (0,1) as a context model for a corresponding element at the location (0,1) in the different matrix;
when the plurality of scanning lines forms a vertical pattern:
determining a context model to be used for an element at each location (k,0) for 0≤k≤(height−1) as a context model for a corresponding element at the location (k,0) in the different matrix having the dimensions of the matrix;
when the plurality of scanning lines forms a horizontal pattern:
determining a context model to be used for an element at each location (0, p) for 0≤p≤(width−1) as a context model for a corresponding element at the location (0, p) in the different matrix having the dimensions of the matrix;

determining a context model for other elements of a scanning line of the plurality of scanning lines based a set of other elements, wherein the set includes elements of two or fewer other scanning lines of the plurality of scanning lines; and processing each element based on the respective determined context model.

15. The system of claim 14, wherein the significance map comprises a plurality of binary numbers, each binary number representing whether a video compression coefficient of the video data is zero or non-zero.

16. The system of claim 14, wherein the set consists of elements from one other scanning line that is parallel to the scanning line having the element being processed.

17. The system of claim 14, wherein the video data represents a block of a video picture, and wherein processor executes further instructions for performing steps comprising applying a transform to the video data to derive transform coefficients;

quantizing the transform coefficients, wherein the significance map represents whether or not the values of each of the quantized transform coefficients is zero.

18. The system of claim 14, wherein the instructions for performing the processing step further include instructions for one of encoding or decoding each element.

19. The method of claim 1 wherein the scanning pattern is the vertical pattern and determining the context model comprises:

for the element at the location (0,1), determining the context model as the context model for the corresponding element at the location (0,1) in the different matrix.

20. The method of claim 1 wherein the scanning pattern is the horizontal pattern and determining the context model comprises:

for the element at the location (1,0), determining the context model as the context model for the corresponding element at the location (1,0) in the different matrix.

21. The method of claim 1 wherein the different matrix is a previously-coded matrix.

22. The method of claim 9, wherein determining the context pattern comprises:

when the plurality of scanning lines forms the vertical pattern, determining the context model to be used for the element at the location (0,1) as the context model for the corresponding element at the location (0,1) in the different matrix; and when the plurality of scanning lines forms the horizontal pattern, determining the context model to be used for the element at the location (1,0) as the context model for the corresponding element at the location (1,0) in the different matrix, wherein the different matrix is a previously-coded matrix.

23. The system of claim 14, further comprising:

when the plurality of scanning lines forms the vertical pattern, determining the context model to be used for the element at the location (0,1) as the context model for the corresponding element at the location (0,1) in the different matrix; and when the plurality of scanning lines forms the horizontal pattern, determining the context model to be used for the element at the location (1,0) as the context model for the corresponding element at the location (1,0) in the different matrix, wherein the different matrix is a previously-coded matrix.

* * * * *